United States Patent
Yamanaka

(10) Patent No.: US 9,088,263 B2
(45) Date of Patent: *Jul. 21, 2015

(54) SURFACE ACOUSTIC WAVE RESONATOR, SURFACE ACOUSTIC WAVE OSCILLATOR, AND ELECTRONIC APPARATUS

(75) Inventor: Kunihito Yamanaka, Kamiina (JP)

(73) Assignee: Seiko Epson Corporation (JP)

( * ) Notice: Subject to any disclaimer, the term of this patent is extended or adjusted under 35 U.S.C. 154(b) by 876 days.

This patent is subject to a terminal disclaimer.

(21) Appl. No.: 13/162,162

(22) Filed: Jun. 16, 2011

(65) Prior Publication Data

US 2011/0309897 A1    Dec. 22, 2011

(30) Foreign Application Priority Data

Jun. 17, 2010   (JP) .................................. 2010-138495

(51) Int. Cl.
*H03H 9/25* (2006.01)
*H03H 9/125* (2006.01)
*H03B 5/32* (2006.01)
*H03H 9/02* (2006.01)
*H03H 9/00* (2006.01)

(52) U.S. Cl.
CPC ........... *H03H 9/02551* (2013.01); *H03B 5/326* (2013.01); *H03H 9/02653* (2013.01);
(Continued)

(58) Field of Classification Search
CPC .......... H03H 9/02551; H03H 9/02653; H03H 9/02661; H03H 9/02669; H03H 9/02677; H03H 9/02834; H03H 9/145; H03H 9/14502; H03H 9/25; H03H 2009/0019; H03B 5/326

USPC ...... 333/193–196; 310/313 A, 313 B, 313 D; 331/116 R, 107 A, 155, 158, 163
See application file for complete search history.

(56) References Cited

U.S. PATENT DOCUMENTS

| 382,217 A | 5/1888 | Davies |
| 4,130,813 A * | 12/1978 | Sandy et al. ................... 333/194 |

(Continued)

FOREIGN PATENT DOCUMENTS

| JP | 54-156455 | 12/1979 |
| JP | 57-005418 | 1/1982 |

(Continued)

OTHER PUBLICATIONS

K. Yamanaka et al.; "High-Stability SAW Oscillators with Cubic Frequency Temperature Curve and Excellent Aging Characteristics"; 2010 IEEE International Ultrasonics Symposium Proceedings, pp. 868-871 and 1 page IEEE Xplore abstract, conference date Oct. 11-14, 2010.*

(Continued)

*Primary Examiner* — Barbara Summons
(74) *Attorney, Agent, or Firm* — Harness, Dickey & Pierce, P.L.C.

(57) ABSTRACT

A surface acoustic wave (SAW) resonator and a SAW oscillator and an electronic apparatus including the resonator are to be provided. A SAW resonator includes: an IDT exciting a SAW using a quartz crystal substrate of Euler angles $(-1.5°≤\phi≤1.5°, 117°≤\theta≤142°, 42.79°≤|\psi|≤49.57°)$; one pair of reflection units arranged so as allow the IDT to be disposed therebetween; and grooves acquired by depressing the quartz crystal substrate located between electrode fingers. When a wavelength of the SAW is λ, and a depth of the grooves is G, "$0.01\lambda≤G$" is satisfied.

20 Claims, 57 Drawing Sheets

(52) U.S. Cl.
CPC ....... *H03H9/02661* (2013.01); *H03H 9/02669* (2013.01); *H03H 9/02677* (2013.01); *H03H 2009/0019* (2013.01)

(56) References Cited

U.S. PATENT DOCUMENTS

| | | | |
|---|---|---|---|
| 4,387,355 A | 6/1983 | Uno et al. | 333/195 |
| 4,837,355 A | 6/1989 | Watson | |
| 5,179,310 A | 1/1993 | Satoh et al. | 310/313 B |
| 5,895,996 A | 4/1999 | Takagi et al. | |
| 6,154,105 A | 11/2000 | Fujimoto et al. | 333/194 |
| 6,329,888 B1 | 12/2001 | Hirota | 333/193 |
| 6,414,414 B1 | 7/2002 | Wright | 310/313 D |
| 6,774,747 B2 | 8/2004 | Yamazaki et al. | 333/195 |
| 6,784,595 B2 | 8/2004 | Iizawa et al. | 310/311 |
| 6,856,218 B2 | 2/2005 | Yamazaki et al. | 333/193 |
| 6,946,930 B2 | 9/2005 | Kadota et al. | 333/195 |
| 7,135,805 B2 | 11/2006 | Yamanouchi | 310/313 D |
| 7,315,805 B2 | 1/2008 | Slater | |
| 7,352,104 B2 | 4/2008 | Yamazaki et al. | 310/313 A |
| 7,382,217 B2 | 6/2008 | Morita et al. | 333/195 |
| 7,589,451 B2 | 9/2009 | Morita et al. | 310/313 R |
| 7,696,675 B2 | 4/2010 | Kanna | 310/361 |
| 8,063,534 B2 | 11/2011 | Iizawa | 310/313 B |
| 8,084,918 B2 | 12/2011 | Iizawa | 310/313 B |
| 8,305,162 B2 | 11/2012 | Yamanaka | |
| 8,502,625 B2* | 8/2013 | Yamanaka | 333/193 |
| 8,598,766 B2* | 12/2013 | Owaki et al. | 310/313 A |
| 2002/0171512 A1 | 11/2002 | Kadota et al. | 333/195 |
| 2003/0030513 A1 | 2/2003 | Yamazaki et al. | 333/195 |
| 2003/0052572 A1 | 3/2003 | Iizawa et al. | 310/313 A |
| 2003/0111931 A1 | 6/2003 | Suzuki et al. | |
| 2003/0146810 A1 | 8/2003 | Yamazaki et al. | 333/193 |
| 2004/0135469 A1 | 7/2004 | Kanna | 310/313 A |
| 2004/0174233 A1 | 9/2004 | Takayama et al. | |
| 2004/0201306 A1 | 10/2004 | Yamanouchi | 310/313 B |
| 2005/0127781 A1 | 6/2005 | Yamazaki et al. | 310/313 A |
| 2006/0108894 A1 | 5/2006 | Kanna | 310/313 A |
| 2006/0145568 A1 | 7/2006 | Morita et al. | 310/313 A |
| 2007/0103038 A1 | 5/2007 | Kamijo | |
| 2007/0182278 A1 | 8/2007 | Kanna | 310/313 A |
| 2007/0296522 A1 | 12/2007 | Takamine | |
| 2008/0067891 A1 | 3/2008 | Matsuda et al. | |
| 2008/0079512 A1 | 4/2008 | Nakazawa et al. | |
| 2008/0084134 A1 | 4/2008 | Morita et al. | 310/313 A |
| 2009/0026955 A1 | 1/2009 | Otterstatter et al. | |
| 2009/0206955 A1 | 8/2009 | Iizawa | 333/195 |
| 2010/0001617 A9 | 1/2010 | Kanna | 310/313 A |
| 2010/0219913 A1 | 9/2010 | Yamanaka | 333/195 |
| 2010/0244626 A1 | 9/2010 | Yamanaka | 310/313 B |
| 2011/0199163 A1 | 8/2011 | Yamanaka | |
| 2011/0309897 A1 | 12/2011 | Yamanaka | 333/195 |
| 2012/0049969 A1 | 3/2012 | Owaki et al. | 331/158 |
| 2012/0049979 A1 | 3/2012 | Owaki et al. | 333/195 |
| 2012/0062069 A1 | 3/2012 | Yamanaka | |
| 2012/0062070 A1 | 3/2012 | Yamanaka et al. | |
| 2012/0062329 A1 | 3/2012 | Yamanaka | |
| 2012/0068573 A1 | 3/2012 | Obata | |
| 2012/0086308 A1 | 4/2012 | Obata et al. | |
| 2013/0027147 A1 | 1/2013 | Yamanaka | |
| 2014/0055207 A1* | 2/2014 | Owaki et al. | 331/163 |

FOREIGN PATENT DOCUMENTS

| | | |
|---|---|---|
| JP | 57-099813 | 6/1982 |
| JP | 58-033309 | 2/1983 |
| JP | 61-092011 | 5/1986 |
| JP | 64-068114 A | 3/1989 |
| JP | 01-034411 | 7/1989 |
| JP | 01-231412 | 9/1989 |
| JP | 02-189011 | 7/1990 |
| JP | 03-284009 | 12/1991 |
| JP | 05-007124 | 1/1993 |
| JP | 05-090865 | 4/1993 |
| JP | 10-270974 | 10/1998 |
| JP | 11-214958 | 8/1999 |
| JP | 11-298290 | 10/1999 |
| JP | 2000-188521 | 7/2000 |
| JP | 2000-216632 A | 8/2000 |
| JP | 3216137 B2 | 10/2001 |
| JP | 2002-100959 | 4/2002 |
| JP | 2002-517933 | 6/2002 |
| JP | 2002-330051 | 11/2002 |
| JP | 2003-124780 | 4/2003 |
| JP | 2003-152487 | 5/2003 |
| JP | 2003-188675 A | 7/2003 |
| JP | 2003-258601 | 9/2003 |
| JP | 2005-012736 | 1/2005 |
| JP | 2005-204275 | 7/2005 |
| JP | 2006-074136 | 3/2006 |
| JP | 2006-148622 | 6/2006 |
| JP | 2006-186623 | 7/2006 |
| JP | 2006-203408 | 8/2006 |
| JP | 3851336 | 9/2006 |
| JP | 2006-295311 | 10/2006 |
| JP | 2006-339742 | 12/2006 |
| JP | 2007-028664 | 2/2007 |
| JP | 2007-074754 A | 3/2007 |
| JP | 3897229 B2 | 3/2007 |
| JP | 2007-093213 | 4/2007 |
| JP | 2007-134932 A | 5/2007 |
| JP | 2007-142794 | 6/2007 |
| JP | 2007-208871 | 8/2007 |
| JP | 2007-259414 | 10/2007 |
| JP | 2007-267033 | 10/2007 |
| JP | 2007-281701 | 10/2007 |
| JP | 2007-300174 | 11/2007 |
| JP | 2007-300287 | 11/2007 |
| JP | 2007-333500 | 12/2007 |
| JP | 2008-005151 A | 1/2008 |
| JP | 2008-078739 A | 4/2008 |
| JP | 2008-078984 | 4/2008 |
| JP | 2008-092017 A | 4/2008 |
| JP | 2008-177886 A | 7/2008 |
| JP | 2008-236295 | 10/2008 |
| JP | 2008-278349 | * 11/2008 |
| JP | 2008-286520 | 11/2008 |
| JP | 2008-286521 | 11/2008 |
| JP | 2009-225420 | 10/2009 |
| JP | 2010-016523 A | 1/2010 |
| JP | 2010-233203 | 10/2010 |
| WO | 2005-099089 | 10/2005 |
| WO | WO-2010047114 A1 | 4/2010 |
| WO | WO 2010/098139 | 9/2010 |

OTHER PUBLICATIONS

S. Kanna et al.; "Temperature Stability of Surface Acoustic Wave Resonators on the In-plane Rotated 33 degree Y-cut Quartz"; 2002 IEEE Ultrasonics Symposium Proceedings, vol. 1, pp. 101-104 and 1 page IEEE Xplore abstract, conference date Oct. 8-11, 2002.*
Shimizu, Yasutaka (Tokyo Institute of Technology), Yamamoto, Yasushi (Nippon Electric Co., Ltd.)., "A New Cut of Quartz for Saw With More Stable Temperature Characteristics", pp. 562-563, Mar. 26, 1982, and 12 pages of English language translation.
U.S. Appl. No. 13/644,477, filed Oct. 4, 2012, Kunihito Yamanaka.
U.S. Appl. No. 13/212,801, filed Aug. 18, 2011, Takuya Owaki.
U.S. Appl. No. 13/212,725, filed Aug. 18, 2011, Takuya Owaki.
Shigeo Kanna, Yook-Kong Yong (The Institute of Electronics, Information and Communication Engineers), "Frequency-Temperature Analysis of Surface Acoustic Waves Using Finite Element Method", (Jun. 1999) (pp. 37-42) with English Translation.
U.S. Appl. No. 13/212,714, filed Aug. 18, 2011, Takuya Owaki.
U.S. Appl. No. 13/460,149, filed Apr. 30, 2012, Kunihito Yamanaka.
U.S. Appl. No. 12/713,461, filed Feb. 26, 2010, Kunihito Yamanaka.
U.S. Appl. No. 12/712,275, filed Feb. 25, 2010, Kunihito Yamanaka.
Extended European Search Report for Application No. EP 10 74 6022 mailed Mar. 15, 2013 (6 pages).
Extended European Search Report for Application No. EP 10 15 4829 mailed Mar. 15, 2013 (6 pages).

* cited by examiner

FIG. 8A  Al 0% λ  DEPTH OF GROOVE 1% λ
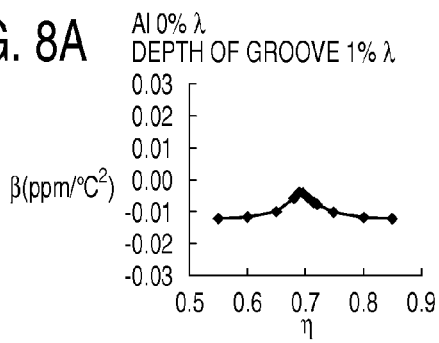
FIG. 8B  Al 0% λ  DEPTH OF GROOVE 1.25% λ
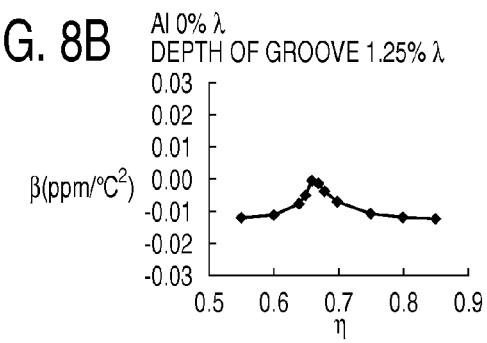
FIG. 8C  Al 0% λ  DEPTH OF GROOVE 1.5% λ
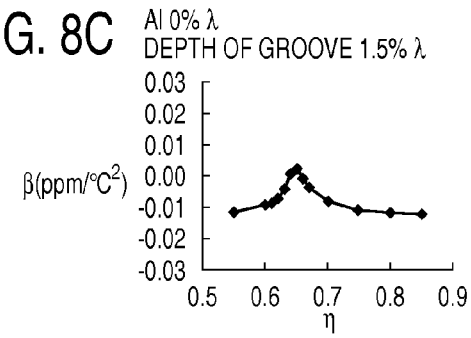
FIG. 8D  Al 0% λ  DEPTH OF GROOVE 2% λ
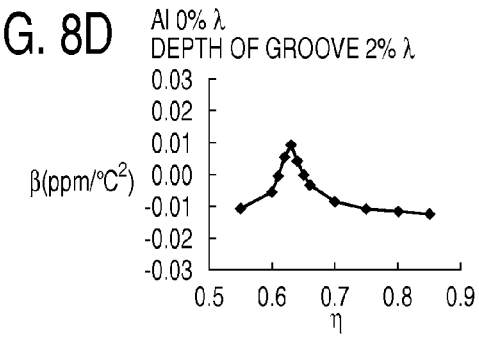
FIG. 8E  Al 0% λ  DEPTH OF GROOVE 3% λ
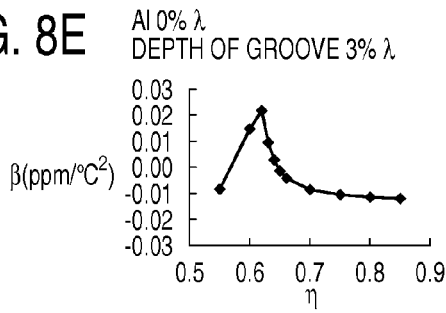
FIG. 8F  Al 0% λ  DEPTH OF GROOVE 4% λ
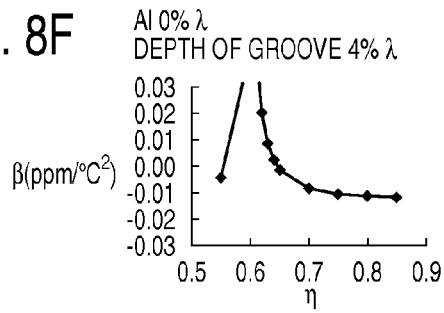
FIG. 8G  Al 0% λ  DEPTH OF GROOVE 5% λ
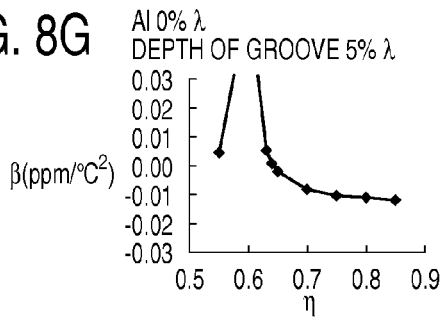
FIG. 8H  Al 0% λ  DEPTH OF GROOVE 6% λ
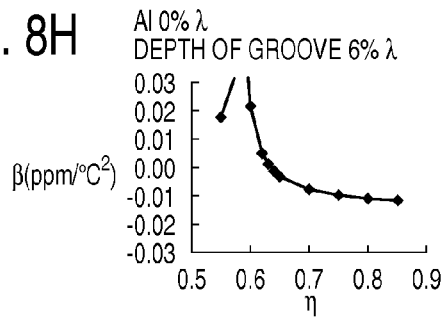
FIG. 8I  Al 0% λ  DEPTH OF GROOVE 8% λ
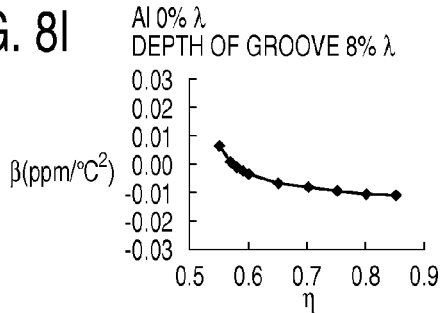

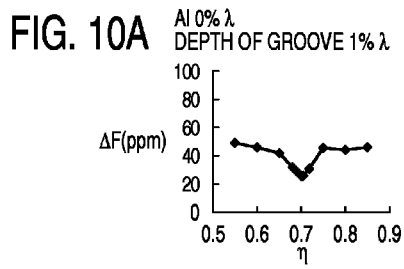
FIG. 10A  Al 0% λ  DEPTH OF GROOVE 1% λ
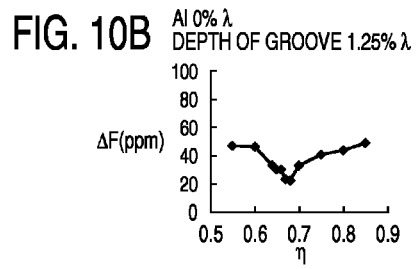
FIG. 10B  Al 0% λ  DEPTH OF GROOVE 1.25% λ
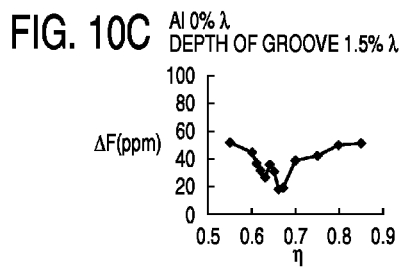
FIG. 10C  Al 0% λ  DEPTH OF GROOVE 1.5% λ
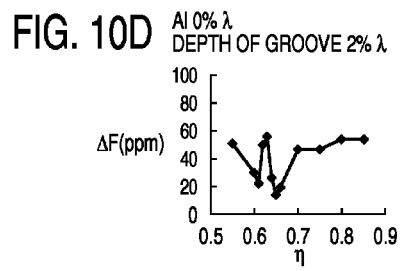
FIG. 10D  Al 0% λ  DEPTH OF GROOVE 2% λ
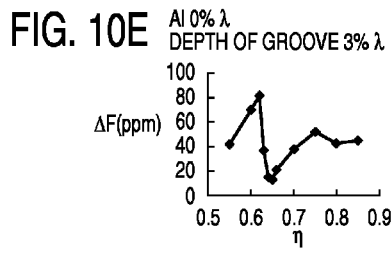
FIG. 10E  Al 0% λ  DEPTH OF GROOVE 3% λ
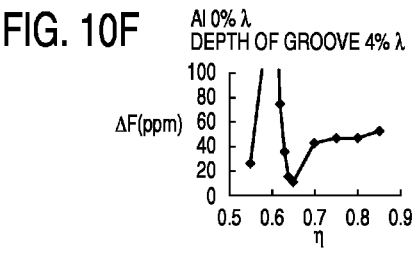
FIG. 10F  Al 0% λ  DEPTH OF GROOVE 4% λ
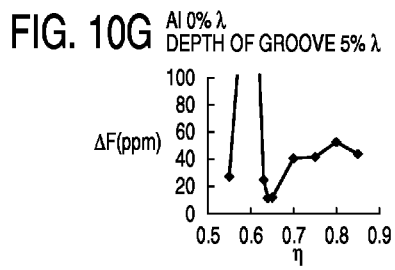
FIG. 10G  Al 0% λ  DEPTH OF GROOVE 5% λ
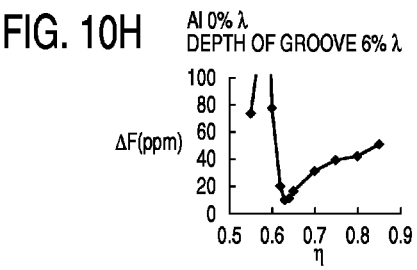
FIG. 10H  Al 0% λ  DEPTH OF GROOVE 6% λ
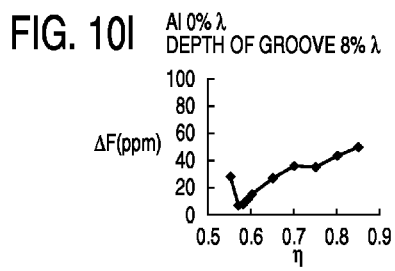
FIG. 10I  Al 0% λ  DEPTH OF GROOVE 8% λ

| | F | Q | γ | CI | M |
|---|---|---|---|---|---|
| | MHz | | | Ω | |
| AVG | 318.25 | 13285 | 2476 | 21.8 | 5.4 |

SURFACE ACOUSTIC WAVE RESONATOR, SURFACE ACOUSTIC WAVE OSCILLATOR, AND ELECTRONIC APPARATUS

BACKGROUND

1. Technical Field

The present invention relates to a surface acoustic wave resonator and a surface acoustic wave oscillator in which the surface acoustic wave resonator is mounted, and more particularly, to a type of surface acoustic wave resonator in which grooves are arranged in a substrate surface and a surface acoustic wave oscillator and an electronic apparatus in which such a type of surface acoustic wave resonator is mounted.

2. Related Art

In a surface acoustic wave (SAW) device (for example, a SAW resonator), the influence of the stop band of a SAW, a cut angle of a piezoelectric substrate (for example, a quartz crystal substrate), the formed shape of an IDT (inter-digital transducer), and the like on the change in the frequency-temperature characteristics is great.

For example, in Japanese Patent No. 3266846 (JP-A-11-214958), a configuration used for exciting an upper end mode and a lower end mode of a stop band of the SAW, distributions of standing waves in the upper end mode and the lower end mode of the stop band, and the like are disclosed.

In addition, in JP-A-2002-100959, JP-A-2006-148622, JP-A-2007-208871, JP-A-2007-267033, and JP-A-2007-300287, the frequency-temperature characteristics of the stop band upper end mode of the SAW that are better than those of the stop band lower end mode are described.

Among them, in JP-A-2002-100959, the frequency-temperature characteristics are described to be improved by using the resonance of the upper end of the stop band using a rotated Y-cut X-propagation crystal quartz substrate more than a case where the resonance of the lower end of the stop band is used.

In addition, in JP-A-2006-148622 and JP-A-2007-208871, in order to acquire good frequency-temperature characteristics from a SAW device using a Rayleigh wave, adjusting the cut angle of the quartz crystal substrate and thickening the normalized electrode film thickness (H/λ) up to 0.1 are described to be performed. Here, λ is the wavelength of the SAW.

Furthermore, in JP-A-2007-267033, adjusting the cut angle of the quartz crystal substrate and thickening the normalized electrode film thickness (H/λ) so as to be equal to or greater than 0.045 are described to be performed for a SAW device using a Rayleigh wave.

In JP-B-2-7207 (JP-A-57-5418) and "Manufacturing Conditions and Characteristics of Groove-Type SAW Resonator" (The Institute of Electronics, Information and Communication Engineers Technical Research Report MW82-59 (1982)), in a SAW device using an ST-cut quartz crystal substrate, grooves are described to be arranged between electrode fingers configuring the IDT and between conductive strips configuring a reflector. In addition, in "Manufacturing Conditions and Characteristics of Groove-Type SAW Resonator" described above, the frequency-temperature characteristics are described to change in accordance with the depth of the grooves.

In addition, also in JP-A-2-189011, JP-A-5-90865, JP-A-1-231412, and JP-A-61-92011, the frequency characteristics are described to be adjusted by forming grooves in a piezoelectric substrate formed from quartz crystal or the like.

Furthermore, it is disclosed in JP-A-10-270974 that, in a transversal-type SAW filer, grooves are formed by etching and processing the surface of a piezoelectric substrate between electrodes of an IDT, and by forming electrode fingers of pure metal or an alloy that has specific gravity higher than that of aluminum, the appearing propagation speed is reduced so as to decrease the pitch of the electrode fingers, whereby realizing the miniaturization of a corresponding chip.

In JP-B-1-34411, implementation of third-order frequency-temperature characteristics by exciting a SSBW (Surface Skimming Bulk Wave) in a SAW resonator that is formed by forming an IDT electrode, of which a normalized electrode film thickness (H/λ) is in the range of 2.0≤H/λ≤4.0%, from aluminum in a quartz crystal substrate having a rotated Y-cut, a cut angle of −43° or −52°, and the slip wave propagation direction set in the Z'-axis direction (Euler angles (ϕ, θ, ψ)=(0°, 38°≤θ≤47°, 90°)) is disclosed. However, this SAW resonator has features in that an SH wave propagating right below the surface of a piezoelectric substrate is excited by an IDT, and the vibrational energy is confined right below the electrode, and accordingly, the SH wave is basically a wave that progresses inside the substrate. Therefore, the reflection efficiency of the SAW using a grating reflector is lower than that of an ST-cut quartz crystal SAW propagating along the surface of the piezoelectric substrate, and there is a problem in that a miniaturized SAW device having a high Q value cannot be easily implemented.

In addition, in PCT Republication No. WO2005/099089 A1, in order to solve the above-described problems, a SAW device acquired by forming an IDT electrode and a grating reflector on the surface of a quartz crystal substrate having Euler angles (ϕ, θ, ψ)=(0°, −64°<θ<−49.3°, 85°≤ψ≤95°) is proposed.

Furthermore, in JP-A-2006-203408, in consideration of a problem in that a Q value or the frequency stability deteriorates due to stress migration that occurs due to a large electrode film thickness, it is disclosed that grooves are formed on a crystal quartz substrate located in an area corresponding to a space between electrode fingers through an etching process, and when the depth of the grooves is $H_p$, and the film thickness of the metal film is $H_m$, a normalized electrode film thickness (H/λ) is set in the range of 0.04<H/λ<0.12 (here, $H=H_p+H_m$). Accordingly, a SAW device, in which the variation in the frequency is suppressed, having a high Q value can be realized.

In JP-A-2009-225420, in a SAW device using a so-called in-plane rotation ST quartz crystal substrate, disclosed in JP-A-2006-148622, JP-A-2007-208871, JP-A-2007-267033, and JP-A-2007-300287, considering that side etching progresses in a process of forming electrode fingers through etching due to a large electrode film thickness, an individual line occupancy ratio varies, and the amount of change in the frequency is large when the temperature changes, so as to cause serious problems in the reliability and the quality of the product, it is proposed to use an in-plane rotation ST-cut quartz crystal having Euler angles (ϕ, θ, ψ)=(0°, 95°≤θ≤155°, 33°≤|ψ|≤46°). By using this quartz crystal substrate, by exciting the upper limit mode of the stop band of the surface acoustic wave, a SAW device suppressing the unbalance in the frequency variation can be implemented.

However, although the unbalance of the variation in the frequency can be suppressed while securing an effective film thickness by forming the grooves by etching the surface of the quartz crystal substrate between the electrode fingers as above, the frequency-temperature characteristics in the operating temperature range of the SAW device still have second-order characteristics, and the width of the variation in the frequency is not decreased much.

In addition, in Japanese Patent No. 3851336, while a configuration for forming a curve representing the frequency-temperature characteristics as a third-order curve in a SAW device using an LST-cut quartz crystal substrate is described, a substrate having a cut angle representing the temperature characteristics as represented by a third-order curve is described to have not been found in a SAW device using a Rayleigh wave.

As described above, factors for improving the frequency-temperature characteristics include many things, and, particularly in a SAW device using a Rayleigh wave, forming the film thickness of the electrode configuring the IDT to be large is considered as one factor contributing to the frequency-temperature characteristics. However, the applicants of this application has found through experiments that, when the film thickness of the electrode is formed to be large, environment-resistant characteristics such as characteristics that change by time or temperature-resistant shock characteristics deteriorate. In addition, in a case where the main purpose is to improve the frequency-temperature characteristics, the film thickness of the electrode needs to be large as described above, and it is difficult to avoid the deterioration of the characteristics changing by time and the temperature-resistant shock characteristics that is accompanied with the large film thickness. This can be also applied to the Q value, and it is difficult to realize a high Q value without forming the film thickness of the electrode to be large. In addition, by forming the film thickness of the electrode to be large, a CI (crystal impedance) value also increases, whereby the stability of oscillation is degraded.

Therefore, aspects of the invention for providing a surface acoustic wave resonator, a surface acoustic wave oscillator, and an electronic apparatus are, first, to realize good frequency-temperature characteristics, second, to improve the environment-resistant characteristics, third, to acquire a high Q value, and, fourth, to acquire a low CI value.

SUMMARY

An advantage of some aspects of the invention is that it provides a surface acoustic wave resonator having superior stability of oscillation regardless of use environments, and a surface acoustic wave oscillator and an electronic apparatus including the resonator.

APPLICATION EXAMPLE 1

According to this application example of the invention, there is provided a surface acoustic wave resonator including: an IDT that is disposed on a quartz crystal substrate of Euler angles ($-1.5° \leq \phi \leq 1.5°$, $117° \leq \theta \leq 142°$, and $42.79° \leq |\psi| \leq 49.57°$) and excites a surface acoustic wave of a stop-band upper end mode; inter-electrode finger grooves that are acquired by depressing the substrate located between electrode fingers configuring the IDT; and one pair of reflection units that are arranged so as allow the IDT to be disposed therebetween in a propagation direction of the surface acoustic wave and reflect the surface acoustic wave. In a case where a wavelength of the surface acoustic wave is $\lambda$, and a depth of the inter-electrode finger grooves is G, "$0.01\lambda \leq G$" is satisfied. In addition, in a case where a line occupancy ratio of the IDT is $\eta$, the depth G of the inter-electrode finger grooves and the line occupancy ratio $\eta$ satisfy following relationships.

$-2.0000 \times G/\lambda + 0.7200 \leq \eta \leq -2.5000 \times G/\lambda + 0.7775$,
wherein $0.0100\lambda \leq G \leq 0.0500\lambda$, $-3.5898 \times G/\lambda + 0.7995 \leq \eta \leq -2.5000 \times G/\lambda + 0.7775$,
wherein $0.0500\lambda < G \leq 0.0695\lambda$ Accordingly, a surface acoustic wave resonator can be acquired in which, first, good frequency-temperature characteristics are realized, second, the environment-resistant characteristics are improved, third, a high Q value is acquired, and, fourth, a low CI value is acquired. In other words, a surface acoustic wave resonator having superior oscillation stability regardless of use environments can be acquired.

APPLICATION EXAMPLE 2

In the above-described surface acoustic wave resonator, it is preferable that the depth G of the inter-electrode finger grooves satisfies a relationship of "$0.01\lambda \leq G \leq 0.0695\lambda$".

In such a case, even in a case where the depth G of the inter-electrode finger groove is mismatched due to an error during a manufacturing process, a surface acoustic wave resonator that suppresses the individual shift of the resonance frequency to be within a correctable range can be acquired.

APPLICATION EXAMPLE 3

In the above-described surface acoustic wave resonator, it is preferable that, when a film thickness of electrode fingers of the IDT is H, a relationship of "$0 < H \leq 0.035\lambda$" is satisfied.

In such a case, a surface acoustic wave resonator having good frequency-temperature characteristics within the operating temperature range can be acquired. In addition, according to such a feature, the deterioration of the environment-resistant characteristics accompanying the increase in the film thickness of the electrode can be suppressed.

APPLICATION EXAMPLE 4

In the above-described surface acoustic wave resonator, it is preferable that the line occupancy ratio 1 satisfies a relationship of "$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda)$".

In such a case, the second-order temperature coefficient can be controlled to be approximately within $\pm 0.01$ ppm/°C$^2$.

APPLICATION EXAMPLE 5

In the above-described surface acoustic wave resonator, it is preferable that a sum of the depth G of the inter-electrode finger grooves and the film thickness H of the electrode fingers satisfies a relationship of "$0.0407\lambda \leq G+H$".

In such a case, a Q value that is higher than that of a general surface acoustic wave resonator can be acquired.

APPLICATION EXAMPLE 6

In the above-described surface acoustic wave resonator, it is preferable that the Euler angles $\psi$ and $\theta$ satisfy a relationship of "$\psi = 1.191 \times 10^{-3} \times \theta^3 - 4.490 \times 10^{-1} \times \theta^2 + 5.646 \times 10^1 \times \theta - 2.324 \times 10^3 \pm 1.0$".

In such a case, a surface acoustic wave resonator having excellent frequency-temperature characteristics in a broad range can be acquired.

APPLICATION EXAMPLE 7

In the above-described surface acoustic wave resonator, it is preferable that, when a frequency of the stop-band upper end mode in the IDT is ft2, a frequency of a stop-band lower end mode in the reflection units is fr1, and a frequency of the stop-band upper end mode of the reflector is fr2, a relationship of "fr1<ft2<fr2" is satisfied.

In such a case, the reflection coefficient |Γ| of the reflection unit increases for the frequency ft2 of the stop band upper end mode of the IDT, and an excited surface acoustic wave of the stop band upper end mode from the IDT is reflected to the IDT side by the reflection unit with a high reflection coefficient. Accordingly, energy confinement of the surface acoustic wave of the stop band upper end mode becomes strong, and a surface acoustic wave resonator with low loss can be realized.

APPLICATION EXAMPLE 8

In the above-described surface acoustic wave resonator, it is preferable that the reflection units are arranged so as to be parallel to the electrode fingers configuring the IDT and are configured in grooves acquired by depressing the quartz crystal substrate.

In such a case, the degree of easiness in manufacturing of the reflection unit can be raised. In addition, since the forming of the conductive strips is unnecessary, the characteristic variation of the reflection unit can be suppressed.

APPLICATION EXAMPLE 9

In the above-described surface acoustic wave resonator, it is preferable that the grooves included in the reflection units are grooves of a plurality of lines parallel to one another.

In such a case, the degree of easiness in manufacturing of the reflection unit can be raised. In addition, since the forming of the conductive strips is unnecessary, the characteristic variation of the reflection unit can be suppressed.

APPLICATION EXAMPLE 10

In the above-described surface acoustic wave resonator, it is preferable that, when a film thickness of the electrode fingers configuring the IDT is $H_{mT}$, a depth of the inter-electrode finger grooves is $H_{gT}$, an effective film thickness of the electrode fingers is $H_T/\lambda$ (here, $H_T=H_{mT}+H_{gT}$), and, when the depth of the grooves included in the reflection units is $H_{gR}$, the IDT and the reflection units satisfy a relationship of "$H_T/\lambda<H_{gR}/\lambda$".

In such a case, even in a case where the conductive strip is omitted, the reflection characteristics of the reflection unit are improved, and the energy confinement effect of the SAW of the stop band upper end mode becomes more remarkable, whereby the Q value is further improved. In addition, since the effective film thickness of the electrode finger of the IDT relatively decreases, the electromechanical coupling coefficient of the IDT can be increased, whereby the CI value can be further decreased.

APPLICATION EXAMPLE 11

In the above-described surface acoustic wave resonator, it is preferable that the depth $H_{gR}$ of the grooves is equal to or more than 3λ.

In such a case, by only forming a groove having a large depth in the manufacturing of the reflection unit, the degree of easiness in manufacturing thereof can be remarkably raised.

APPLICATION EXAMPLE 12

In the above-described surface acoustic wave resonator, it is preferable that the reflection unit is configured by conductive strips of a plurality of lines that are disposed on the quartz crystal substrate and parallel to each other.

In such a case, the degree of easiness in manufacturing of the reflection unit can be raised. In addition, since the forming of the groove is unnecessary, the characteristic variation of the reflection unit can be suppressed.

APPLICATION EXAMPLE 13

In the above-described surface acoustic wave resonator, it is preferable that, when a film thickness of the electrode fingers configuring the IDT is $H_{mT}$, a depth of the inter-electrode finger grooves is $H_{gT}$, an effective film thickness of the electrode fingers is $H_T/\lambda$ (here, $H_T=H_{mT}+H_{gT}$), and a film thickness of the conductive strips is $H_{mR}$, the IDT and the reflection units satisfy a relationship of "$H_T/\lambda<H_{mR}/\lambda$".

In such a case, even in a case where the groove is omitted, the reflection characteristics of the reflection unit are improved, and the energy confinement effect of the SAW of the stop band upper end mode becomes more remarkable, whereby the Q value is further improved. In addition, since the effective film thickness of the electrode finger of the IDT relatively decreases, the electromechanical coupling coefficient of the IDT can be increased, whereby the CI value can be further decreased.

APPLICATION EXAMPLE 14

In the above-described surface acoustic wave resonator, it is preferable that the reflection unit is configured by a plurality of lines of the grooves that are parallel to each other and a plurality of lines of conductive strips that are disposed on the quartz crystal substrate so as to be adjacent to the grooves and are parallel to each other.

In such a case, a surface acoustic wave resonator having superior frequency-temperature characteristics can be acquired.

APPLICATION EXAMPLE 15

In the above-described surface acoustic wave resonator, it is preferable that, when a film thickness of the electrode fingers configuring the IDT is $H_{mT}$, a depth of the inter-electrode finger grooves is $H_{gT}$, an effective film thickness of the electrode fingers is $H_T/\lambda$ (here, $H_T=H_{mT}+H_{gT}$), a film thickness of the conductive strips is $H_{mR}$, a depth of the grooves included in the reflection unit is $H_{gR}$, and an effective film thickness of the conductive strips is $H_R/\lambda$ (here, $H_R=H_{mR}+H_{gR}$), the IDT and the reflection units satisfy a relationship of "$H_T/\lambda<H_R/\lambda$".

In such a case, the reflection characteristics of the reflection unit are improved together with the increase in the effective film thickness of the conductive strip, and the energy confinement effect of the SAW of the stop band upper end mode becomes more remarkable, whereby the Q value is further improved. In addition, since the effective film thickness of the electrode finger of the IDT relatively decreases, the electromechanical coupling coefficient of the IDT can be increased, whereby the CI value can be further decreased.

APPLICATION EXAMPLE 16

In the above-described surface acoustic wave resonator, it is preferable that the film thickness $H_{mT}$ of the electrode fingers configuring the IDT and the film thickness $H_{mR}$ of the conductive strips satisfy a relationship of "$H_{mT}/\lambda=H_{mR}/\lambda$", and the depth $H_{gT}$ of the inter-electrode finger grooves and the depth $H_{gR}$ of the grooves included in the reflection unit satisfy a relationship of "$H_{gT}/\lambda<H_{gR}/\lambda$".

In such a case, the implementation of a high Q value and the implementation of low CI can be achieved together. In addition, a conductive film having a single film thickness may be formed, and accordingly, the degree of easiness in the manufacturing is raised.

APPLICATION EXAMPLE 17

In the above-described surface acoustic wave resonator, it is preferable that the depth $H_{gT}$ of the inter-electrode finger grooves and the depth $H_{gR}$ of the grooves included in the reflection unit satisfy a relationship of "$H_{gT}/\lambda = H_{gR}/\lambda$", and the film thickness $H_{mT}$ of the electrode fingers configuring the IDT and the film thickness $H_{mR}$ of the conductive strips satisfy a relationship of "$H_{mT}/\lambda < H_{mR}/\lambda$".

In such a case, the implementation of a high Q value and the implementation of low CI can be achieved together. In addition, the groove may be processed under one type of condition, and accordingly, the degree of easiness in the manufacturing is raised.

APPLICATION EXAMPLE 18

In the above-described surface acoustic wave resonator, it is preferable that the reflection unit is configured by an end face of the quartz crystal substrate.

In such a case, the degree of easiness in the manufacturing of the reflection unit can be raised. In addition, since formation of a groove or a conductive strip is unnecessary, the characteristic variation of the reflection unit can be suppressed, and the miniaturization thereof can be achieved.

APPLICATION EXAMPLE 19

According to this application example of the invention, there is provided a surface acoustic wave oscillator including: the above-described surface acoustic wave resonator; and an IC that is used for driving the IDT.

Accordingly, a surface acoustic wave oscillator having superior oscillation stability regardless of the use environment can be acquired.

APPLICATION EXAMPLE 20

According to this application example of the invention, there is provided an electronic apparatus including the above-described surface acoustic wave resonator.

Accordingly, an electronic apparatus having high reliability can be acquired.

BRIEF DESCRIPTION OF THE DRAWINGS

The invention will be described with reference to the accompanying drawings, wherein like numbers reference like elements.

FIG. 1A is a diagram showing the planar configuration. FIG. 1B is a diagram showing a partially enlarged section of a side face. FIG. 1C is a partially enlarged view of FIG. 1B for illustrating details thereof. FIG. 1D is a partially enlarged view of FIG. 1C and is a diagram showing a sectional shape of a groove portion that can be assumed in a case where a SAW resonator is manufactured using a photolithography technique and an etching technique.

FIG. 3A is an example of a form in which electrode fingers are tilted so as to be perpendicular to the X' axis. FIG. 3B is an example of a SAW device having an IDT of which bus bars connecting electrode fingers are tilted.

FIG. 7A is a graph showing a displacement of the second-order temperature coefficient β of the stop band upper end mode in a case where the depth of a groove is 2% λ. FIG. 7B is a graph showing a displacement of the second-order temperature coefficient β of the stop band lower end mode in a case where the depth of a groove is 2% λ. FIG. 7C is a graph showing a displacement of the second-order temperature coefficient β of the stop band upper end mode in a case where the depth of a groove is 4% λ. FIG. 7D is a graph showing a displacement of the second-order temperature coefficient β of the stop band lower end mode in a case where the depth of a groove is 4% λ.

FIGS. 8A to 8I are graphs showing the relationship between the line occupancy ratio and the second-order temperature coefficient in a case where the depth of an inter-electrode finger groove is changed with the film thickness of the electrode set as zero. FIG. 8A is a graph in a case where the depth of the groove is 1% λ. FIG. 8B is a graph in a case where the depth of the groove is 1.25% λ. FIG. 8C is a graph in a case where the depth of the groove is 1.5% λ. FIG. 8D is a graph in a case where the depth of the groove is 2% λ. FIG. 8E is a graph in a case where the depth of the groove is 3% λ. FIG. 8F is a graph in a case where the depth of the groove is 4% λ. FIG. 8G is a graph in a case where the depth of the groove is 5% λ. FIG. 8H is a graph in a case where the depth of the groove is 6% λ. FIG. 8I is a graph in a case where the depth of the groove is 8% λ.

FIGS. 10A to 10I are graphs showing the relationship between the line occupancy ratio and the amount of variation in the frequency in a case where the depth of the inter-electrode finger groove is changed with the film thickness of the electrode set as zero. FIG. 10A is a graph in a case where the depth of the groove is 1% λ. FIG. 10B is a graph in a case where the depth of the groove is 1.25% λ. FIG. 10C is a graph in a case where the depth of the groove is 1.5% λ. FIG. 10D is a graph in a case where the depth of the groove is 2% λ. FIG. 10E is a graph in a case where the depth of the groove is 3% λ. FIG. 10F is a graph in a case where the depth of the groove is 4% λ. FIG. 10G is a graph in a case where the depth of the groove is 5% λ. FIG. 10H is a graph in a case where the depth of the groove is 6% λ. FIG. 10I is a graph in a case where the depth of the groove is 8% λ.

FIG. 12A is a graph in a case where the film thickness of the electrode is 1% λ. FIG. 12B is a graph in a case where the film thickness of the electrode is 1.5% λ. FIG. 12C is a graph in a case where the film thickness of the electrode is 2% λ. FIG. 12D is a graph in a case where the film thickness of the electrode is 2.5% λ. FIG. 12E is a graph in a case where the film thickness of the electrode is 3% λ. FIG. 12F is a graph in a case where the film thickness of the electrode is 3.5% λ.

FIG. 13A shows the relationship between the depth of the groove and η1 when the film thickness of the electrode is changed from 1% λ to 3.5% λ. FIG. 13B is a diagram illustrating that an area for which |β|≤0.01 (ppm/° C.$^2$) is inside a polygon formed by joining points a to h.

FIG. 15A is a graph in a case where the depth of the groove is 0. FIG. 15B is a graph in a case where the depth of the groove is 1% λ. FIG. 15C is a graph in a case where the depth of the groove is 2% λ. FIG. 15D is a graph in a case where the depth of the groove is 3% λ. FIG. 15E is a graph in a case where the depth of the groove is 4% λ. FIG. 15F is a graph in a case where the depth of the groove is 5% λ.

FIG. 16A is a graph in a case where the depth of the groove is 0. FIG. 16B is a graph in a case where the depth of the groove is 1% λ. FIG. 16C is a graph in a case where the depth of the groove is 1.5% λ. FIG. 16D is a graph in a case where the depth of the groove is 2.5% λ. FIG. 16E is a graph in a case where the depth of the groove is 3.5% λ. FIG. 16F is a graph in a case where the depth of the groove is 4.5% λ.

FIG. 17A is a graph in a case where the depth of the groove is 0. FIG. 17B is a graph in a case where the depth of the groove is 1% λ. FIG. 17C is a graph in a case where the depth of the groove is 2% λ. FIG. 17D is a graph in a case where the depth of the groove is 3% λ. FIG. 17E is a graph in a case where the depth of the groove is 4% λ. FIG. 17F is a graph in a case where the depth of the groove is 5% λ.

FIG. 18A is a graph in a case where the depth of the groove is 0. FIG. 18B is a graph in a case where the depth of the groove is 1% λ. FIG. 18C is a graph in a case where the depth of the groove is 1.5% λ. FIG. 18D is a graph in a case where the depth of the groove is 2.5% λ. FIG. 18E is a graph in a case where the depth of the groove is 3.5% λ. FIG. 18F is a graph in a case where the depth of the groove is 4.5% λ.

FIG. 19A is a graph in a case where the depth of the groove is 0. FIG. 19B is a graph in a case where the depth of the groove is 1% λ. FIG. 19C is a graph in a case where the depth of the groove is 2% λ. FIG. 19D is a graph in a case where the depth of the groove is 3% λ. FIG. 19E is a graph in a case where the depth of the groove is 4% λ. FIG. 19F is a graph in a case where the depth of the groove is 5% λ.

FIG. 20A is a graph in a case where the depth of the groove is 0. FIG. 20B is a graph in a case where the depth of the groove is 1% λ. FIG. 20C is a graph in a case where the depth of the groove is 2% λ. FIG. 20D is a graph in a case where the depth of the groove is 3% λ. FIG. 20E is a graph in a case where the depth of the groove is 4% λ. FIG. 20F is a graph in a case where the depth of the groove is 5% λ.

FIG. 21A is a graph in a case where the depth of the groove is 0. FIG. 21B is a graph in a case where the depth of the groove is 1% λ. FIG. 21C is a graph in a case where the depth of the groove is 2% λ. FIG. 21D is a graph in a case where the depth of the groove is 3% λ. FIG. 21E is a graph in a case where the depth of the groove is 4% λ. FIG. 21F is a graph in a case where the depth of the groove is 5% λ.

FIG. 22A is a graph in a case where the depth of the groove is 0. FIG. 22B is a graph in a case where the depth of the groove is 1% λ. FIG. 22C is a graph in a case where the depth of the groove is 1.5% λ. FIG. 22D is a graph in a case where the depth of the groove is 2.5% λ. FIG. 22E is a graph in a case where the depth of the groove is 3.5% λ. FIG. 22F is a graph in a case where the depth of the groove is 4.5% λ.

FIG. 23A is a graph in a case where the depth of the groove is 0. FIG. 23B is a graph in a case where the depth of the groove is 1% λ. FIG. 23C is a graph in a case where the depth of the groove is 2% λ. FIG. 23D is a graph in a case where the depth of the groove is 3% λ. FIG. 23E is a graph in a case where the depth of the groove is 4% λ. FIG. 23F is a graph in a case where the depth of the groove is 5% λ.

FIG. 24A is a graph in a case where the depth of the groove is 0. FIG. 24B is a graph in a case where the depth of the groove is 1% λ. FIG. 24C is a graph in a case where the depth of the groove is 1.5% λ. FIG. 24D is a graph in a case where the depth of the groove is 2.5% λ. FIG. 24E is a graph in a case where the depth of the groove is 3.5% λ. FIG. 24F is a graph in a case where the depth of the groove is 4.5% λ.

FIG. 25A is a graph in a case where the depth of the groove is 0. FIG. 25B is a graph in a case where the depth of the groove is 1% λ. FIG. 25C is a graph in a case where the depth of the groove is 2% λ. FIG. 25D is a graph in a case where the depth of the groove is 3% λ. FIG. 25E is a graph in a case where the depth of the groove is 4% λ. FIG. 25F is a graph in a case where the depth of the groove is 5% λ.

FIG. 26A is a graph in a case where the depth of the groove is 0. FIG. 26B is a graph in a case where the depth of the groove is 1% λ. FIG. 26C is a graph in a case where the depth of the groove is 2% λ. FIG. 26D is a graph in a case where the depth of the groove is 3% λ. FIG. 26E is a graph in a case where the depth of the groove is 4% λ. FIG. 26F is a graph in a case where the depth of the groove is 5% λ.

FIG. 27A is a diagram in the case of $\eta 1$, and FIG. 27B is a diagram in the case of $\eta 2$.

FIG. 28A is a diagram in the case of $\eta 1$, and FIG. 28B is a diagram in the case of $\eta 2$.

FIG. 29A is a diagram in the case of $\eta 1$, and FIG. 29B is a diagram in the case of $\eta 2$.

FIG. 30A is a diagram in the case of $\eta 1$, and FIG. 30B is a diagram in the case of $\eta 2$.

FIG. 31A is a diagram in the case of $\eta 1$, and FIG. 31B is a diagram in the case of $\eta 2$.

FIG. 32A is a diagram in the case of $\eta 1$, and FIG. 32B is a diagram in the case of $\eta 2$.

FIG. 33A is a diagram in the case of $\eta 1$, and FIG. 33B is a diagram in the case of $\eta 2$.

FIG. 34A is a graph in a case where the depth of the groove is 1% λ. FIG. 34B is a graph in a case where the depth of the groove is 1.5% λ. FIG. 34C is a graph in a case where the depth of the groove is 2% λ. FIG. 34D is a graph in a case where the depth of the groove is 2.5% λ. FIG. 34E is a graph in a case where the depth of the groove is 3% λ. FIG. 34F is a graph in a case where the depth of the groove is 3.5% λ.

FIG. 38A is a diagram representing a maximum value and a minimum value of ψ, and FIG. 38B is a diagram representing the area of ψ satisfying the condition of β.

FIG. 39A is a diagram representing a maximum value and a minimum value of ψ, and FIG. 39B is a diagram representing the area of ψ satisfying the condition of β.

FIG. 40A is a diagram representing a maximum value and a minimum value of ψ, and FIG. 40B is a diagram representing the area of ψ satisfying the condition of β.

FIG. 41A is a diagram representing a maximum value and a minimum value of ψ, and FIG. 41B is a diagram representing the area of ψ satisfying the condition of β.

FIG. 42A is a diagram representing a maximum value and a minimum value of ψ, and FIG. 42B is a diagram representing the area of ψ satisfying the condition of β.

FIG. 43A is a diagram representing a maximum value and a minimum value of ψ, and FIG. 43B is a diagram representing the area of ψ satisfying the condition of β.

FIG. 44A is a diagram representing a maximum value and a minimum value of ψ, and FIG. 44B is a diagram representing the area of ψ satisfying the condition of β.

FIG. 56A is a graph showing the frequency-temperature characteristics of a SAW resonator disclosed in JP-A-2006-203408, and FIG. 56B is a graph showing the range of the frequency-temperature characteristics within a practical operating temperature range.

DESCRIPTION OF EXEMPLARY EMBODIMENTS

Hereafter, a surface acoustic wave resonator, a surface acoustic wave oscillator, and an electronic apparatus according to embodiments of the invention will be described in detail with reference to the accompanying drawings.

Surface Acoustic Wave Resonator

First Embodiment

Figure 1A:
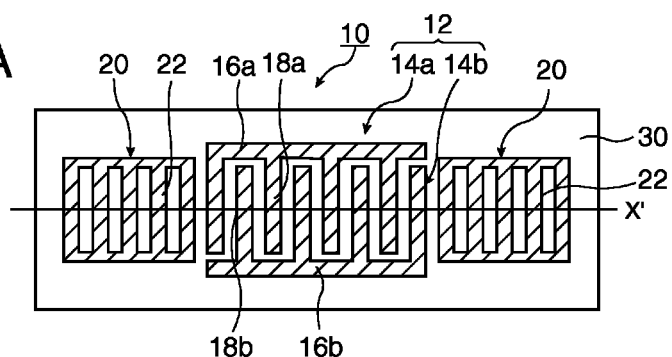
FIGS. 1A to 1D are diagrams showing the configuration of a SAW device according to an embodiment.
Figure 1B:
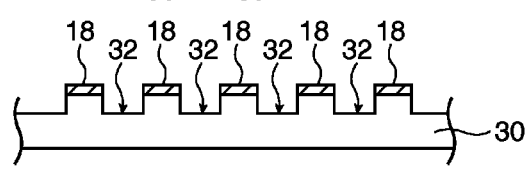
Figure 1C:
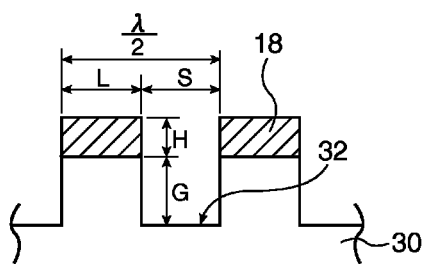
Figure 1D:
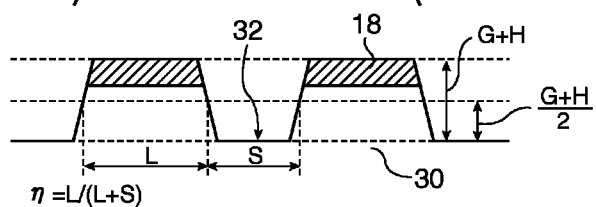

First a surface acoustic wave (SAW) resonator according to a first embodiment of the invention will be described with reference to FIGS. 1A to 1D. Of FIGS. 1A to 1D, FIG. 1A is a plan view of the SAW resonator, FIG. 1B is a partially enlarged sectional view, FIG. 1C is a partially enlarged view of FIG. 1B for illustrating details thereof, and FIG. 1D is a partially enlarged view of FIG. 1C, is a sectional shape that can be assumed in a case where a SAW resonator according to an embodiment of the invention is manufactured using a photolithography technique and an etching technique, and is a diagram illustrating a method of specifying a line occupancy ratio η of IDT electrode fingers in a case where the cross-sectional shape is not a rectangle but a trapezoid. It is appropriate that the line occupancy ratio η is the ratio of the width L of a convex portion to a value (L+S) acquired by adding the width L of the convex portion and a width S of a groove 32 at a height of ½ of a value (G+H) acquired by adding the depth (the height of a pedestal) G of the groove 32 and an electrode film thickness H from the bottom portion of the groove 32.

The SAW resonator 10 according to this embodiment is basically configured by a quartz crystal substrate 30, an IDT 12, and reflectors 20.

Figure 2:
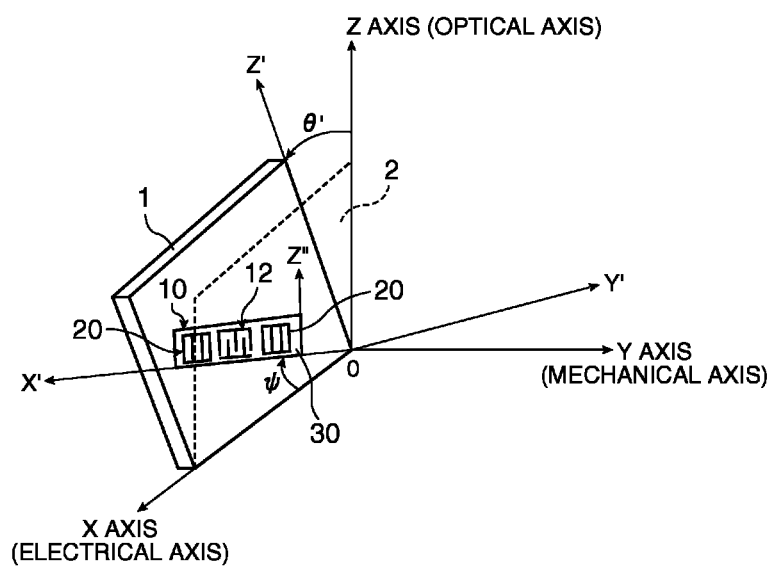
FIG. 2 is a diagram showing the orientation of a wafer that is a base material of a quartz crystal substrate used in an embodiment of the invention.

FIG. 2 is a diagram showing the orientation of a wafer 1 that is a base material of the quartz crystal substrate 30 used in an embodiment of the invention. In FIG. 2, the X axis is the electrical axis of the quartz crystal, the Y axis is the mechanical axis of the quartz crystal, and the Z axis is the optical axis of the quartz crystal. The wafer 1 has a face that is acquired by rotating a face 2 perpendicular to the Y axis about the X axis as the rotation axis from the +Z axis side toward the −Y axis side by an angle of θ' degrees. An axis perpendicular to the rotated face is the Y' axis, and an axis that is parallel to the rotated face and is perpendicular to the X axis is the Z' axis. Furthermore, the IDT 12 and the reflectors 20 configuring the SAW resonator 10 are disposed along the X' axis that is an axis acquired by rotating the X axis of the quartz crystal about the Y' axis as the rotation axis by +ψ degrees (or −ψ degrees) with the rotation direction from the +X axis side toward the +Z' axis defined as positive. The quartz crystal substrate 30 configuring the SAW resonator 10 is diced by being cut out of the wafer 1. Although the shape of the quartz crystal substrate 30 in a plan view is not particularly limited, it may, for example, be a rectangle having short sides parallel to a Z" axis that is an axis acquired by rotating the Z' axis by +ψ degrees about the Y' axis as the rotation axis and long sides parallel to the X' axis. Here, the relationship between θ' and an Euler angle θ is θ'=θ−90°.

In this embodiment, an in-plane rotation ST cut quartz crystal substrate that is represented by Euler angles (−1.5°≤φ≤1.5°, 117°≤θ≤142°, and 42.79°≤|ψ|≤49.57°) is employed as the quartz crystal substrate 30. Here, the Euler angles will be described. A substrate represented by Euler angles (0°, 0°, 0°) is a Z cut substrate that has a main face perpendicular to the Z axis. Here, φ of Euler angles (φ, θ, ψ) relates to first rotation of the Z cut substrate and is a first rotation angle in which the Z axis is set as the rotation axis, and a direction for rotating from the +X axis side to the +Y axis side is defined as a positive rotation angle. In addition, the Euler angle θ relates to second rotation, which is performed after the first rotation of the Z cut substrate and is a second rotation angle in which the X axis after the first rotation is set as the rotation axis, and a direction for rotating from the +Y axis after the first rotation to the +Z axis is defined as a positive rotation angle. The cut surface of a piezoelectric substrate is determined by the first rotation angle φ and the second rotation angle θ. The Euler angle ψ relates to third rotation that is performed after the second rotation of the Z cut substrate and is a third rotation angle in which the Z axis after the second rotation is set as the rotation axis, and a direction for rotating from the +X axis side after the second rotation to the +Y axis side after the second rotation is defined as a positive rotation angle. A propagation direction of the SAW is represented by the third rotation angle ψ with respect to the X axis after the second rotation.

The IDT 12 includes a pair of inter digital transducers 14a and 14b of which the base end portions of a plurality of electrode fingers 18a and 18b are connected to bus bars 16a and 16b, and the electrode finger 18a configuring one inter digital transducer 14a and the electrode finger 18b configuring the other inter digital transducer 14b are alternately disposed with a predetermined gap maintained therebetween in the IDT 12. In addition, the electrode fingers 18a and 18b shown in FIG. 1A are disposed in such a way that the extension direction of the electrode fingers 18a and 18b is perpendicular to the X' axis that is the propagation direction of the surface acoustic wave. A SAW excited by the SAW resonator 10 configured in such a way is a Rayleigh type SAW and has oscillation displacement components for both the Y' axis and X' axis. By displacing the propagation direction of the SAW from the X axis, which is the crystal axis of the quartz crystal as above, it is possible to excite a SAW of the stop band upper end mode.

Figure 3A:
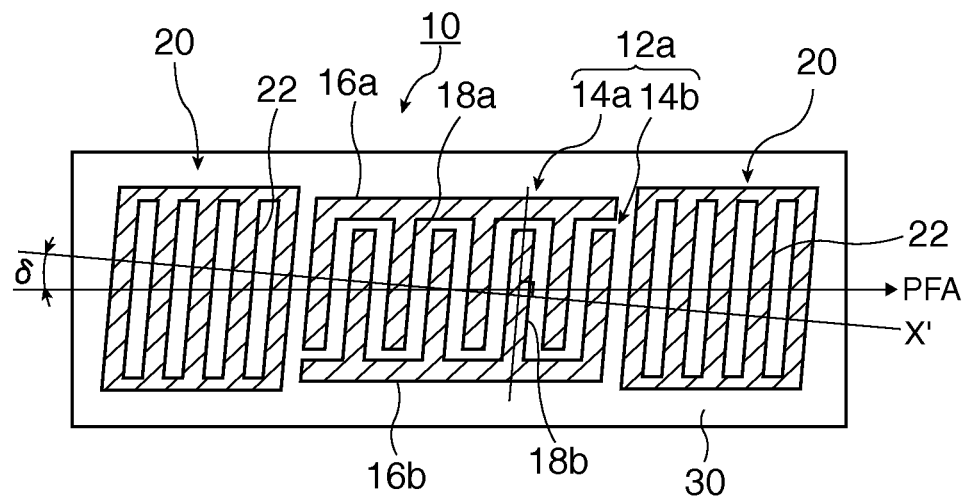
FIGS. 3A and 3B are diagrams showing configuration examples of a SAW device in a case where a tilted type IDT is employed.
Figure 3B:
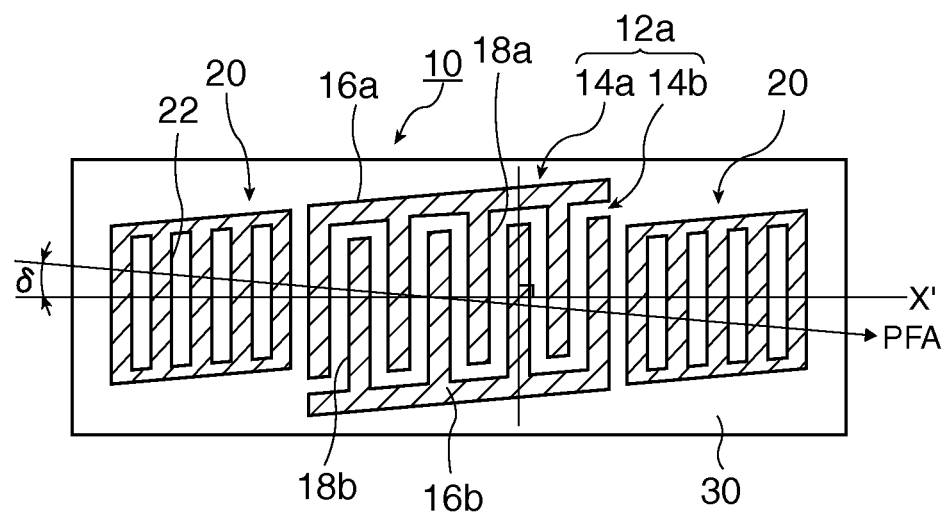

Furthermore, the SAW resonator 10 according to an embodiment of the invention can be configured in a form as shown in FIGS. 3A and 3B. In other words, even in the case where an IDT tilted by a power flow angle (hereafter, referred to as a PFA) δ from the X' axis as shown in FIGS. 3A and 3B is applied, a high Q can be implemented by satisfying the following requirements. FIG. 3A is a plan view showing a tilted-type IDT 12a according to an embodiment. In the tilted-type IDT 12a, the disposition form of the electrode fingers 18a and 18b is tilted such that the X' axis, which is the propagation direction of the SAW determined by the Euler angles, and the direction of the electrode fingers 18a and 18b of the tilted type IDT 12a are perpendicular to each other.

FIG. 3B is a plan view showing a tilted type IDT 12a according to another embodiment. In this example, although the direction of the arrangement of the electrode fingers is disposed so as to be tilted with respect to the X' axis by tilting the bus bars 16a and 16b that connect the electrode fingers 18a and 18b, the tilted IDT 12a is configured such that the X' axis and the extension direction of the electrode fingers 18a and 18b are perpendicular to each other, similarly to the configuration shown in FIG. 3A.

No matter which tilted type IDT is used, by disposing the electrode fingers such that a direction perpendicular to the X' axis is the extension direction of the electrode fingers as in these embodiments, it is possible to realize a low-loss SAW resonator with good temperature characteristics according to an embodiment of the invention being maintained.

Figure 4:
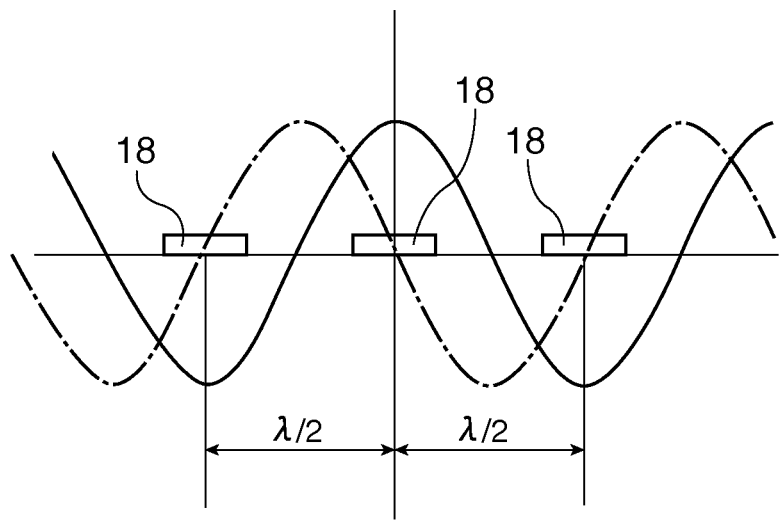
FIG. 4 is a diagram showing a relationship between a stop band upper end mode and a stop band lower end mode.

Here, the relationship between a SAW of the stop band upper end mode and a SAW of the stop band lower end mode will be described. The positions of the anti-nodes (or nodes) of the standing waves of a SAW of the stop band lower end mode and a SAW of the stop band upper end mode that are formed by the normal IDT 12 as shown in FIG. 4 (the electrode fingers 18 configuring the IDT 12 are shown in FIG. 4) are misaligned from each other by π/2. FIG. 4 is a diagram showing the distribution of standing waves of the stop band upper end mode and the stop band lower end mode in the normal IDT 12.

As shown in FIG. 4, as described above, the anti-nodes of the standing wave of the stop band lower end mode that is denoted by a solid line are located at the center positions of the electrode fingers 18, that is, the center positions of reflection, and the nodes of the standing wave of the stop band upper end mode that is denoted by a dashed-dotted line are located at the center positions of reflection. In such a mode in which the nodes are located at the center positions between the electrode fingers, there are many cases where the oscillation of the SAW cannot be efficiently converted into electric charge by the electrode fingers 18 (18a and 18b) and the standing wave of the mode cannot be excited or received as an electrical signal. However, according to the technique described here, by setting the Euler angle ψ to a non-zero value and displacing the propagation direction of the SAW from the X axis, which is the crystal axis of the quartz crystal, the standing wave of the stop band upper end mode can be shifted to the position of the solid line shown in FIG. 4, in other words, the anti-nodes of the standing wave of the mode can be shifted to the center positions of the electrode fingers 18, whereby the SAW of the stop band upper end mode can be excited.

In addition, one pair of the reflectors (reflection units) 20 are disposed such that the IDT 12 is interposed therebetween in the propagation direction of the SAW. As a specific configuration example, both ends of each of a plurality of conductive strips 22 that are disposed to be parallel to the electrode fingers 18 configuring the IDT 12 are connected together.

As the material of the electrode film that configures the IDT 12 and the reflectors 20 configured as above, aluminum (Al), or an alloy with Al used as its main constituent can be used.

By decreasing the electrode thickness of the electrode film configuring the IDT 12 and reflectors 20 as much as possible, the influence of the temperature characteristics of the electrodes is minimized. Furthermore, by increasing the depth of the grooves of the quartz crystal substrate portion, good frequency-temperature characteristics are derived from the performance of the grooves of the quartz crystal substrate portion, in other words, by utilizing the good temperature characteristics of the quartz crystal. Accordingly, the influence of the temperature characteristics of the electrode on the temperature characteristics of the SAW resonator can be reduced, and, in a case where the variation of the mass of the electrode is within 10%, good temperature characteristics can be maintained.

In a case where an alloy is used as the material of the electrode film for the above-described reasons, the ratio by weight of metals other than Al, which is the main component, is equal to or less than 10% and is preferably equal to or less than 3%. In a case where electrodes using a metal other than Al as their main constituent are used, it is preferable that the film thickness of the electrode is adjusted such that the mass of the electrode is within ±10% of that in a case where Al is used. In such a case, good temperature characteristics equivalent to those of a case where Al is used can be obtained.

In the quartz crystal substrate 30 of the SAW resonator 10 having the above-described basic configuration, a plurality of the grooves (inter-electrode finger grooves) 32 that are arranged so as to be parallel to the electrode fingers 18 is disposed between the electrode fingers of the IDT 12 or the conductive strips 22 of the reflectors 20.

When the wavelength of the SAW in the stop band upper end mode is denoted by $\lambda$, and the depth of the groove is denoted by G, the groove 32 arranged in the quartz crystal substrate 30 may satisfy the following relationship.

$$0.01\lambda \leq G \quad (1)$$

In addition, in a case where the upper limit of the depth G of the groove is to be determined, as can be acquired by referring to FIG. 5, the depth G of the groove may be in the following range.

$$0.01\lambda \leq G \leq 0.094\lambda \quad (2)$$

The reason for this is that, by fixing the depth G of the groove within such a range, the amount of frequency variation in the operating temperature range (−40° C. to +85° C.) can be controlled so as to be equal to or less than 25 ppm as a target value to be described later in detail. In addition, it is preferable that the depth G of the groove is within the following range.

$$0.01\lambda \leq G \leq 0.0695\lambda \quad (3)$$

By setting the depth G of the groove to be in such a range, even in a case where there is manufacturing variation in the depth G of the groove, the amount of shift in the resonance frequency of an individual SAW resonator 10 can be suppressed within a correctable range.

In addition, the above-described wavelength $\lambda$ of the SAW is the wavelength of the SAW near the IDT 12.

In addition, the line occupancy ratio $\eta$, as illustrated in FIGS. 1C and 1D, is a value that is acquired by dividing the line width L of the electrode finger 18 (the width of a convex portion in a case where the electrode finger is configured only by the crystal quartz convex portion) by the pitch $\lambda/2$ (=L+S) between the electrode fingers 18. Accordingly, the line occupancy ratio $\eta$ can be represented as the following Equation (4).

$$\eta = L/(L+S) \quad (4)$$

In the SAW resonator 10 according to this embodiment, the line occupancy ratio $\eta$ may be set in the range satisfying Equations (5) and (6). As can be understood from Equations (5) and (6), the line occupancy ratio $\eta$ can be derived by determining the depth G of the groove 32.

$$-2.0000 \times G/\lambda + 0.7200 \leq \eta \leq -2.5000 \times G/\lambda + 0.7775,$$
$$\text{wherein } 0.0100\lambda \leq G \leq 0.0500\lambda \quad (5)$$

$$-3.5898 \times G/\lambda + 0.7995 \leq \eta \leq -2.5000 \times G/\lambda + 0.7775,$$
$$\text{wherein } 0.0500\lambda < G \leq 0.0695\lambda \quad (6)$$

In addition, the film thickness of the material of the electrode film (the IDT 12, the reflector 20, and the like) of the SAW resonator 10 according to this embodiment is preferably in the following range.

$$0 < H \leq 0.035\lambda \quad (7)$$

Furthermore, in a case where the thickness of the electrode film represented in Equation (7) is considered for the line occupancy ratio $\eta$, the line occupancy ratio $\eta$ can be acquired by using Equation (8).

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \quad (8)$$

The manufacturing variation in the electric characteristics (particularly, the resonance frequency) increases as the film thickness of the electrode is increased. Accordingly, there is high possibility that the line occupancy ratio $\eta$ has manufacturing variation within ±0.04 in a case where the film thickness H of the electrode is in the range represented in Equations (5) and (6) and manufacturing variation larger than ±0.04 when H>0.035λ. However, in a case where the film thickness H of the electrode is within the range represented in Equations (5) and (6), and the variation of the line occupancy ratio $\eta$ is within ±0.04, a SAW device having a small second-order temperature coefficient β can be realized. In other words, the line occupancy ratio $\eta$ can be allowed to be in a range represented in Equation (9) that is acquired by adding a common difference of ±0.04 to Equation (8).

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda) \pm 0.04 \quad (9)$$

In the SAW resonator 10 having the above-described configuration according to this embodiment, the object is to improve the frequency-temperature characteristics up to the degree at which the amount ΔF of change in the frequency is equal to or less than 25 ppm in an operating temperature in a case where the second-order temperature coefficient β is within ±0.01 (ppm/° $C.^2$) and the desired operating temperature range of the SAW is −40° to +85° C.

However, generally, the temperature characteristics of the surface acoustic wave resonator are represented in the following equation.

$$\Delta f = \alpha \times (T - T_0) + \beta \times (T - T_0)^2$$

Here, Δf represents the amount (ppm) of change in the frequency between the temperature T and the apex temperature $T_0$, α represents the first-order temperature coefficient (ppm/° C.), β represents the second-order temperature coefficient (ppm/° $C.^2$), T represents temperature, and $T_0$ represents the temperature (apex temperature) at which the frequency is the maximum.

Figure 6:
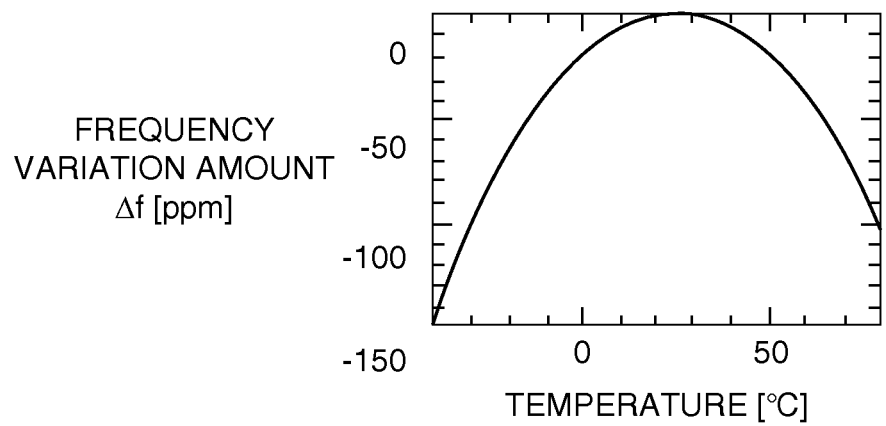
FIG. 6 is a diagram showing temperature characteristics in an ST cut quartz crystal substrate.

For example, in a case where the piezoelectric substrate is configured by a quartz crystal substrate of so-called ST-cut (Euler angles ($\phi$, $\theta$, $\psi$)=(0°, 120° to 130°, 0°)), the first-order temperature coefficient α=0.0, and the second-order temperature coefficient β=−0.034, and a graph as shown in FIG. 6 is formed. In FIG. 6, the temperature characteristics are drawn as an upward-convex parabola (second-order curve).

In the SAW resonator as shown in FIG. 6, since the amount of variance in the frequency with respect to a change in the temperature is extremely large, the amount Δf of change in the frequency with respect to the change in the temperature needs to be suppressed. Accordingly, a surface acoustic wave resonator needs to be implemented based on a new concept such that the amount Δf of change in the frequency with respect to the change in the temperature (operating temperature) at a time when the SAW resonator is actually used is close to zero by allowing the second-order temperature coefficient β shown in FIG. 6 to move closer to zero.

Thus, one of the objects of an embodiment of the invention is to solve the above-described problems so as to realize a surface acoustic wave device operating at a stable frequency even in a case where the temperature changes by improving the frequency-temperature characteristics of the surface acoustic wave device to be extremely excellent.

Hereinafter, the implementation of a SAW device having the configuration in which the above-described technical idea (technical elements) is contained for solving the above-described problems, that is, how the concept according to an embodiment of the invention has been reached by repeating simulation and experiments performed by inventors of this application will be described and proved in detail.

In a SAW resonator in which the direction of propagation is set to the crystal X-axis direction by using a quartz crystal substrate called the above-described ST cut, in a case where an operating temperature range is the same, the amount ΔF of change in the frequency within the operating temperature range is about 133 (ppm), and the second-order temperature coefficient β is about −0.034 (ppm/° C.$^2$). In addition, in a SAW resonator using an in-plane rotated ST cut quartz crystal substrate in which the cut angle of the quartz crystal substrate and the propagation direction of the SAW are represented by Euler angles (0°, 123°, 45°), and the operating temperature range is the same, the amount ΔF of change in the frequency is about 63 ppm, and the second-order temperature coefficient β is about −0.016 (ppm/° C.$^2$) in a case where excitation of the stop band lower end mode is used.

Since a SAW resonator that uses the ST-cut quartz crystal substrate or the in-plane rotated ST-cut quartz crystal substrate uses a surface acoustic wave called Rayleigh wave, and the surface acoustic wave called Rayleigh wave has the variation in the frequency or the frequency-temperature characteristics with respect to the processing precision of the quartz crystal substrate or the quartz crystal substrate that is much smaller than a surface acoustic wave called a leaky wave of the LST-cut quartz crystal substrate, and accordingly, the mass producibility thereof is superior, and the SAW resonator is used in various SAW devices. However, a general SAW resonator using the ST-cut quartz crystal substrate, the in-plane rotated ST-cut quartz crystal substrate, or the like, as described above, has the second-order temperature characteristics in which a curve representing the frequency-temperature characteristics is a second-order curve, and furthermore, the absolute value of the second-order temperature coefficient of the second-order characteristics is large. Accordingly, such a SAW resonator cannot be used in a SAW device such as a resonator, an oscillator, or the like that is used in a wired communication device or a radio communication device in which the amount of frequency variation in the operating temperature range is large and the stability of the frequency is required. For example, in a case where the frequency-temperature characteristics having the second-order temperature characteristics in which the second-order temperature coefficient β is equal to or less than ±0.01 (ppm/° C.$^2$) corresponding to the improvement equal to or less than ⅓ of the second-order temperature coefficient β of the ST-cut quartz crystal substrate or the improvement equal to or more than 37% of the second-order temperature coefficient β of the in-plane rotated ST-cut quartz crystal substrate is acquired, a device requiring such frequency stability can be realized. Furthermore, in a case where third-order temperature characteristics are acquired in which the second-order temperature coefficient β is almost zero, and a curve representing the frequency-temperature characteristics is a third-order curve, the frequency stability is further improved for the operating temperature range, which is more preferable. According to the third-order temperature characteristics, a SAW device having the amount of change in the frequency that is equal to or less than ±25 ppm, which cannot be realized by a general SAW device, is realized also for a broad operating temperature range of −40° C. to +85° C., whereby extremely high frequency stability is acquired.

It becomes apparent that the line occupancy ratio η of the electrode fingers 18 of the IDT 12, the film thickness H of the electrode, the depth G of the groove, and the like relate to the change in the frequency-temperature characteristics of the SAW resonator 10, as described above, based on the findings that are based on the simulations and experiments performed by the inventors of this application. The SAW resonator 10 according to this embodiment uses the excitation of the stop band upper end mode.

Figure 7A:
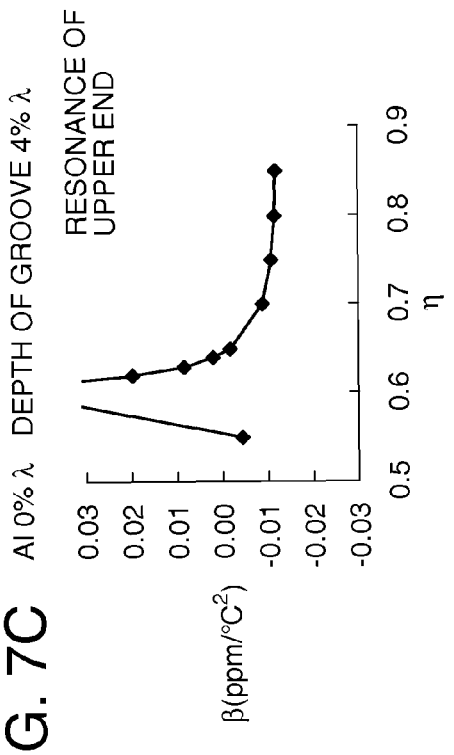
FIGS. 7A to 7D are graphs showing differences in changes of a second-order temperature coefficient accompanying with a change in a line occupancy ratio η at a resonance point of the stop band upper end mode and a resonance point of the stop band lower end mode.
Figure 7C:
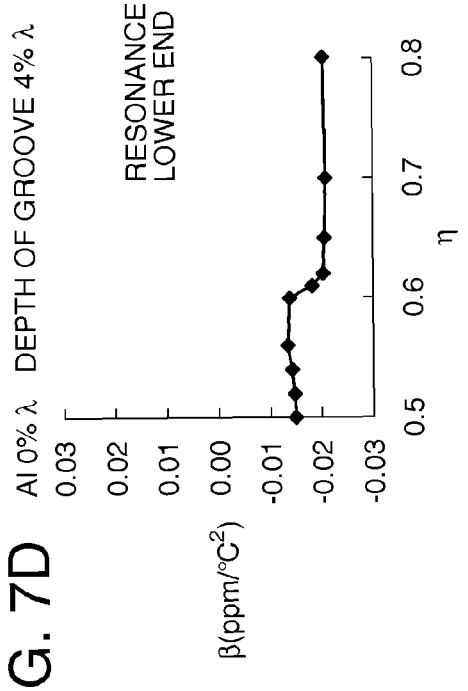
Figure 7B:
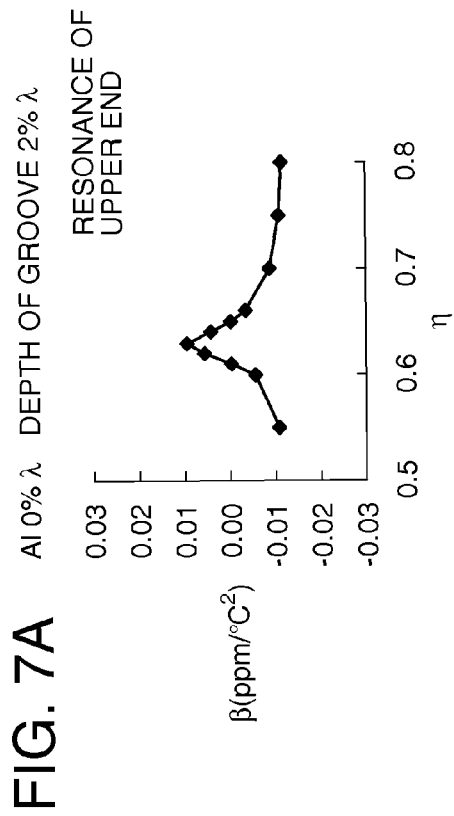
Figure 7D:
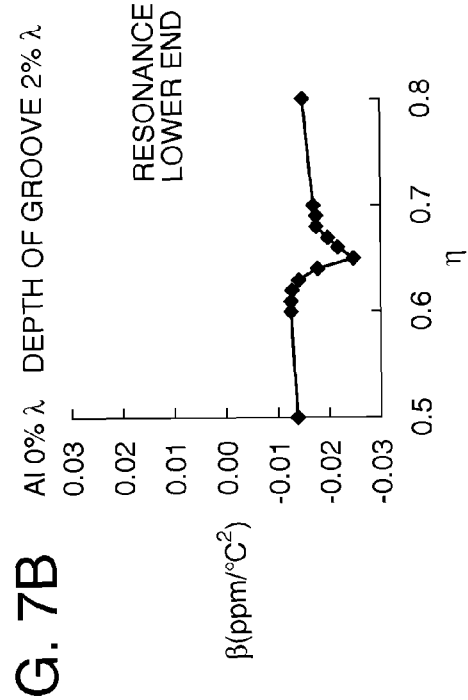

FIGS. 7A to 7D are graphs showing the changes in the second-order temperature coefficient β with respect to the change in the line occupancy ratio η in a case where a SAW is excited so as to propagate on the surface of the quartz crystal substrate 30 in a state in which the film thickness H of the electrode is zero (H=0% λ) in FIG. 1C, that is, a state in which grooves 32 formed from concave-convex quartz crystal are formed on the surface of the quartz crystal substrate 30. Among FIGS. 7A to 7D, FIG. 7A shows the second-order temperature coefficient β in the resonance of the stop band upper end mode in a case where the depth G of the grooves is 0.02λ, and FIG. 7B shows the second-order temperature coefficient β in the resonance of the stop band lower end mode in a case where the depth G of the grooves is 0.02λ. In addition, among FIGS. 7A to 7D, FIG. 7C shows the second-order temperature coefficient β in the resonance of the stop band upper end mode in a case where the depth G of the grooves is 0.04λ, and FIG. 7D shows the second-order temperature coefficient β in the resonance of the stop band lower end mode in a case where the depth G of the grooves is 0.04λ. The simulations illustrated in FIGS. 7A to 7D show examples in each case where a SAW propagates in a form on the quartz crystal substrate 30 in which the electrode film is not arranged so as to decrease the factors changing the frequency-temperature characteristics. Here, as the cut angle of the quartz crystal substrate 30, an angle corresponding to Euler angles (0°, 123°, ψ) is used. In addition, the value of ψ is appropriately set for which the absolute value of the second-order temperature coefficient β is the minimum.

It can be read from FIGS. 7A to 7D that the second-order temperature coefficient β abruptly changes near the line occupancy ratio η of 0.6 to 0.7 in the case of the stop band upper end mode or the stop band lower end mode. Then, by comparing the change in the second-order temperature coefficient β in the stop band upper end mode and the change in the second-order temperature coefficient β in the stop band lower end mode, the following can be read out. The change in the second-order temperature coefficient β in the stop band lower end mode changes from the negative side to a further negative side, whereby the characteristics deteriorate (the absolute value of the second-order temperature coefficient β increases). In contrast to this, the change in the second-order temperature coefficient β in the stop band upper end mode changes from the negative side to the positive side, whereby the characteristics are improved (there is a point at which the absolute value of the second-order temperature coefficient β decreases).

Accordingly, it is apparent that, in order to acquire good frequency-temperature characteristics of a SAW device, the oscillation of the stop band upper end mode is preferably used.

Next, the inventors checked the relationship between the line occupancy ratio η and the second-order temperature coefficient β in a case where a SAW of the stop band upper end mode is allowed to propagate on a quartz crystal substrate of which the depth G of the grooves is variously changed.

FIGS. 8A to 8I are graphs each showing the evaluation result of simulating the relationship between the line occupancy ratio η and the second-order temperature coefficient β in a case where, similarly to FIGS. 7A to 7D, the film thickness H of the electrode is set to zero (H=0% λ), and the depth G of the grooves is changed from 0.01λ (1% λ) to 0.08λ (8% λ). It can be read from the evaluation results that a point at which β=0, that is, a point at which an approximate curve representing the frequency-temperature characteristics represents a third-order curve starts to appear from around a point at which the depth G of the grooves is 0.0125λ (1.25%) as represented in FIG. 8B. In addition, from FIGS. 8A to 8I, it is determined that there are two positions of η (a point (η1) at which β=0 for a larger η and a point (η2) at which β=0 for a smaller η) at which β=0. In addition, it can be read from the evaluation results shown in FIGS. 8A to 8I that the amount of change in the line occupancy ratio η with respect to the change in the depth G of the grooves is larger for η2 than η1.

Figure 9:
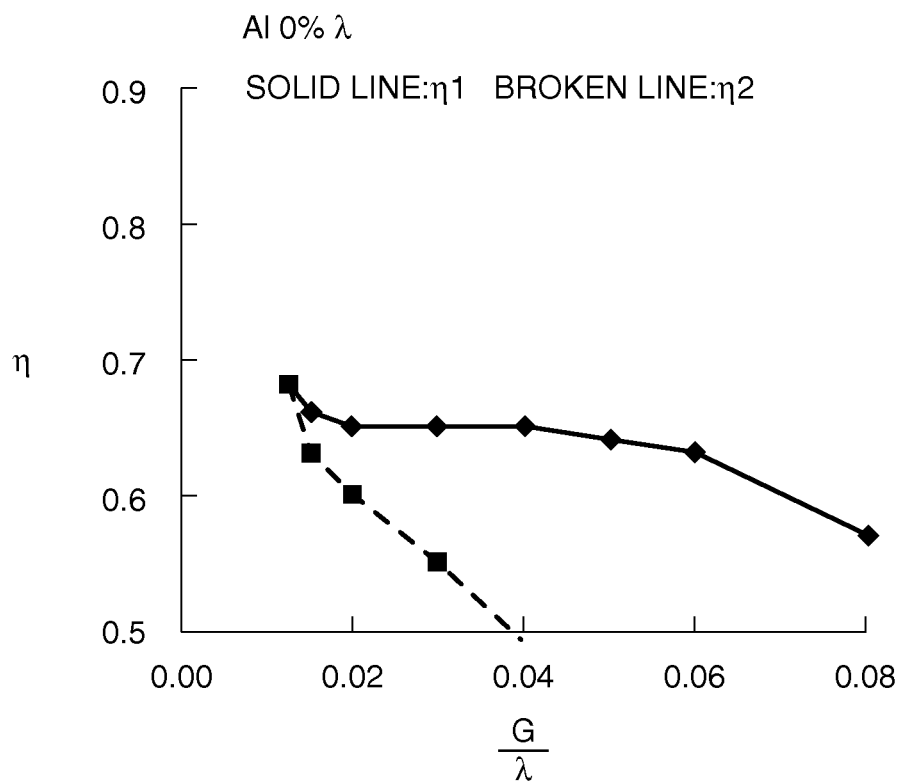
FIG. 9 is a graph showing the relationship between the depth of the inter-electrode finger groove at which the second-order temperature coefficient becomes zero and the line occupancy ratio η in a case where the film thickness of the electrode is set as zero.

The understanding of this point can be deepened by referring to FIG. 9. FIG. 9 is a graph in which η1 and η2, at which the second-order temperature coefficient β is zero, in a case where the depth G of the grooves is changed, are plotted. It can be read from FIG. 9 that as the depth G of the grooves is increased, η1 and η2 decrease, and the amount of change in η2 is large enough to scale out at around a point at which the depth G of the grooves is 0.04λ in the graph in which the scale of the vertical axis η is represented in the range of 0.5λ to 0.9λ. In other words, it can be stated that the amount of change in η2 with respect to the change in the depth G of the grooves is large.

FIGS. 10A to 10I are graphs that represent the amount ΔF of change in the frequency by setting the film thickness H of the electrode to zero (H=0% λ), similarly to FIGS. 7A to 7D and FIGS. 8A to 8I, and converting the vertical axis of FIGS. 8A to 8I into the second-order temperature coefficient β. As is apparent from FIGS. 10A to 10I, it can be read that the amount ΔF of change in the frequency decreases at two points (η1 and η2) at which β=0. Furthermore, from FIG. 10A to 10I, it can be read that the amount ΔF of change in the frequency at a point corresponding to η1 out of the two points at which β=0 is suppressed less also in any graph in which the depth G of the grooves is changed.

According to the above-described tendency, for products manufactured through mass production for which an error can easily occur at the time of manufacturing, it is preferable to employ a point, at which β=0, of which the amount of change in the frequency with respect to the variance in the depth G of the grooves is smaller, that is, η1. FIG. 5 shows a graph representing the relationship between the amount ΔF of change in the frequency and the depth G of the grooves at a point (η1) at which the second-order temperature coefficient β is the minimum for each depth G of the grooves. From FIG. 5, the lower limit value of the depth G of the grooves at which the amount ΔF of change in the frequency is equal to or less than 25 ppm as a target value is 0.01λ, and the range of the depth G of the grooves is equal to or more than the lower limit value, in other words, 0.01λ≤G.

Figure 5:
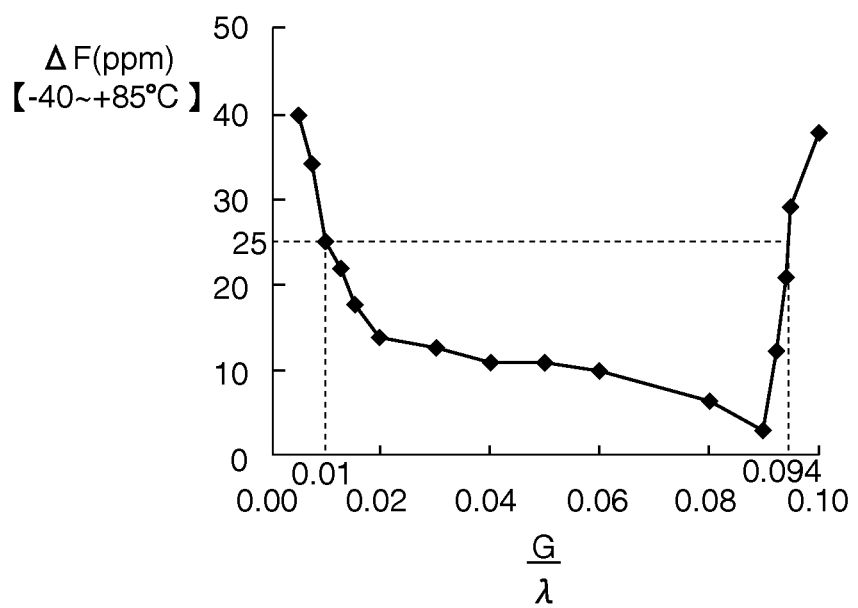
FIG. 5 is a graph showing a relationship between the depth of an inter-electrode finger groove and a frequency variation amount in an operating temperature range.

In addition, examples are also added to FIG. 5 in which the depth G of the grooves is equal to or larger than 0.08λ through simulation. According to this simulation, the amount ΔF of change in the frequency is equal to or less than 25 ppm in a case where the depth G of the grooves is equal to or larger than 0.01λ, and thereafter, as the depth G of the grooves increases, the amount ΔF of change in the frequency decreases. However, in a case where the depth G of the grooves is equal to or larger than 0.09λ, the amount ΔF of change in the frequency increases again, and in a case where the depth G of the grooves exceeds 0.094λ, the amount ΔF of change in the frequency exceeds 25 ppm.

Although the graph shown in FIG. 5 is the simulation in a state in which the electrode film such as the IDT 12 or the reflector 20 is not formed on the quartz crystal substrate 30, as can be understood by referring to FIGS. 21A to 26F that will be represented in detail later, it is thought that the amount ΔF of change in the frequency decreases in a case where the electrode film is arranged in the SAW resonator 10. Accordingly, when the upper limit value of the depth G of the grooves is to be determined, it may be a maximum value in the state in which the electrode film is not formed, that is, G≤0.094λ, and a preferred range of the depth G of the grooves for achieving the target can be represented in the following equation.

$$0.01\lambda \leq G \leq 0.094\lambda \tag{2}$$

Figure 11:
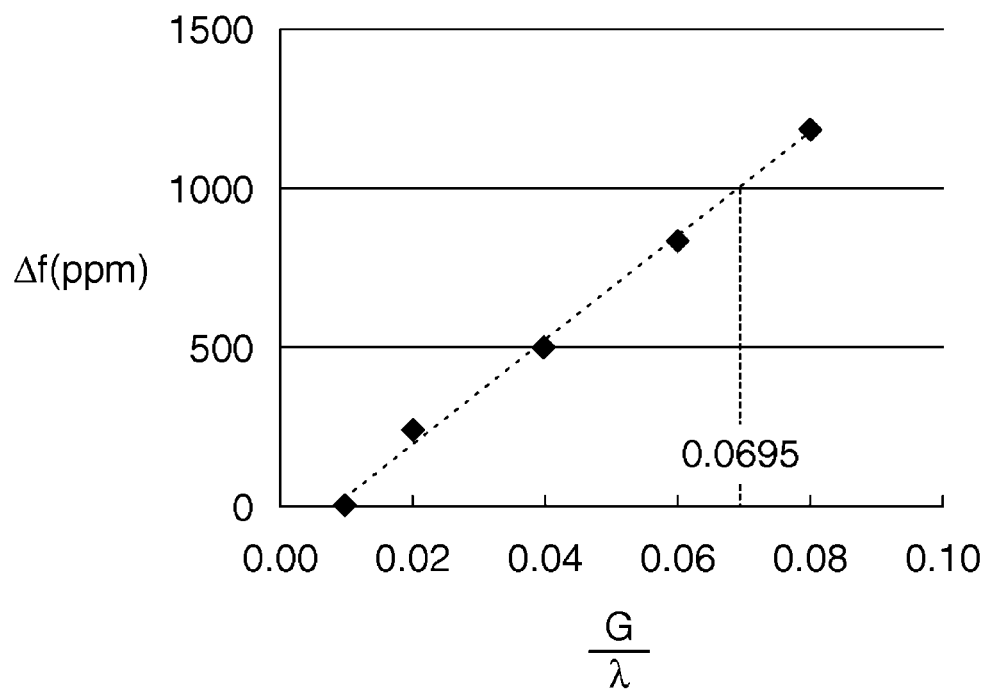
FIG. 11 is a graph showing the relationship between the depth of the inter-electrode finger groove and the amount of variation in the frequency in a case where the depth of the inter-electrode finger groove is mismatched by ±0.001λ.
Figure 12A:
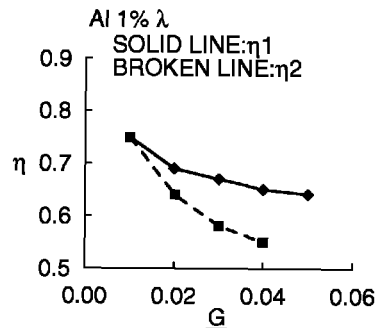
FIGS. 12A to 12F are graphs showing the relationship between the depth of the inter-electrode finger groove at which the second-order temperature coefficient is zero and the line occupancy ratio in a case where the film thickness of the electrode is changed.
Figure 12B:
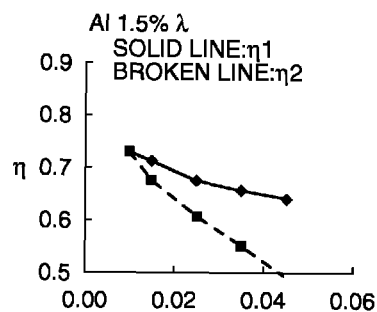
Figure 12C:
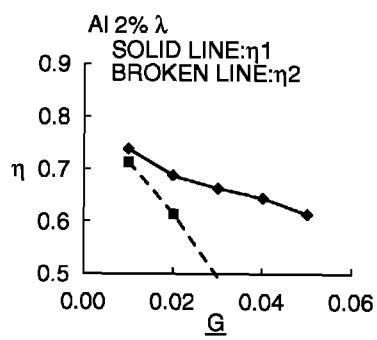
Figure 12D:
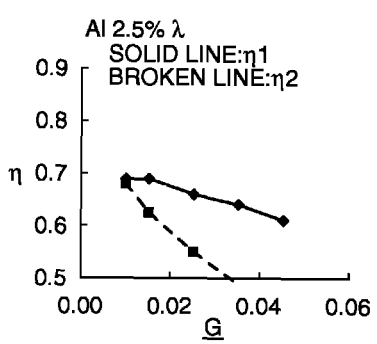
Figure 12E:
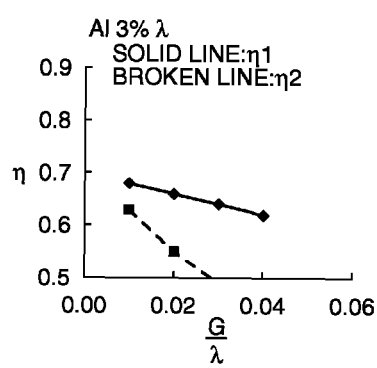
Figure 12F:
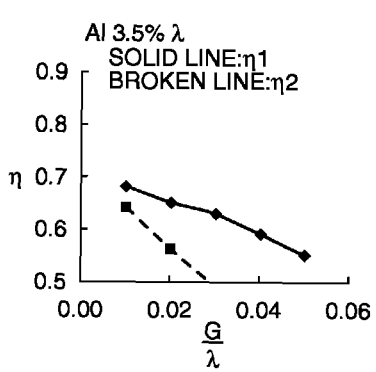

In addition, the depth G of the grooves has variations about a maximum ±0.001λ in the mass production process. Accordingly, in a case where the line occupancy ratio η is set to be constant, the amount Δf of change in the frequency of the SAW resonator 10 in a case where the depth G of the grooves is deviated by ±0.001λ is shown in FIG. 11. As shown in FIG. 11, for the case of G=0.04λ, in a case where the depth G of the grooves is deviated by ±0.001λ, in other words, in a case where the depth of the grooves is in the range of 0.039λ≤G≤0.041λ, it can be read that the amount Δf of change in the frequency is about ±500 ppm.

Here, in a case where the amount Δf of change in the frequency is less than ±1000 ppm, frequency adjustment can be performed by using various fine-frequency adjustment unit. However, in a case where the amount Δf of change in the frequency is equal to or larger than ±1000 ppm, static characteristics such as a Q value and a CI (crystal impedance) value and long-term reliability are affected by the frequency adjustment, which leads to a decrease in the good product rate of the SAW resonator 10.

When an approximate equation that represents the relationship between the amount Δf [ppm] of change in the frequency and the depth G of the grooves is derived from a straight line connecting the plots shown in FIG. 11, Equation (10) can be acquired.

$$\Delta f = 16334(G/\lambda) - 137 \tag{10}$$

Here, when the value of G at which Δf<1000 ppm is acquired, G≤0.0695λ. Accordingly, a preferred range of the depth G of the grooves according to this embodiment is preferably a range as shown in Equation (3).

$$0.01\lambda \leq G \leq 0.0695\lambda \tag{3}$$

Next, FIGS. 12A to 12F show the graphs of evaluation results when the relationship between η at which the second-order temperature coefficient β=0, that is, a line occupancy ratio η representing the third-order temperature characteristics and the depth G of the grooves. The Euler angles of the quartz crystal substrate 30 are set to (0°, 123°, ψ). Here, as ψ, an angle at which the frequency-temperature characteristics represent the tendency of a third-order curve, that is, an angle at which the second-order temperature coefficient β=0 is appropriately selected. In addition, under the conditions as shown in FIGS. 12A to 12F, the relationship between the Euler angle ψ and the depth G of the grooves when η at which β=0 is acquired is shown in FIGS. 34A to 34F. In a graph (FIG. 34C) for the film thickness H of the electrode=0.02λ, although a plot for ψ<42° is not represented, in the plot of this graph for η2, ψ=41.9° at G=0.03λ. The plot for the relationship between the depth G of the grooves and the line occupancy ratio η for each film thickness of the electrode is acquired based on FIGS. 15A to 20F that will be described later in detail.

Figure 13A:
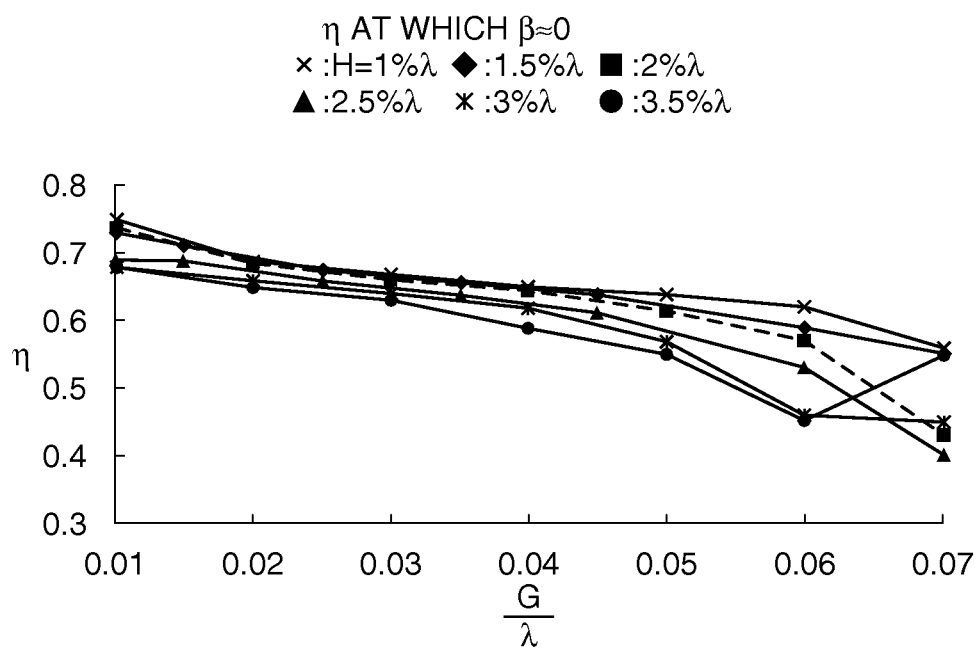
FIGS. 13A and 13B are diagrams in which the relationship between η1 at which the second-order temperature coefficient is approximately zero (ppm/° C.$^2$) for each film thickness of the electrode and the depth of the inter-electrode finger groove is organized in graphs.

From the evaluation results shown in FIGS. 12A to 12F, for any film thickness, it can be read that the variation with respect to the change in the depth G of the grooves at η1 is smaller than that at η2 as described above. Accordingly, η1 is extracted from the graph representing the relationship between the depth G of the grooves and the line occupancy ratio η for each film thickness shown in FIGS. 12A to 12F, and points at which β≈0 are collectively plotted in FIG. 13A. Meanwhile an area at which β≈0 is not satisfied but |β|≤0.01 is satisfied is evaluated, and it is apparent that η1 is concentrated within a polygon denoted by solid lines as shown in FIG. 13B.

Figure 13B:
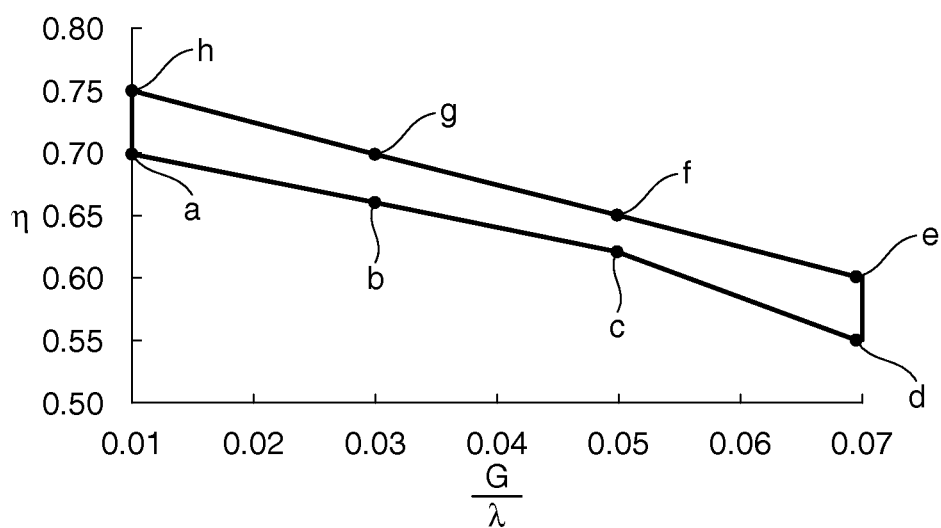

The coordinates of points a to h shown in FIG. 13B are represented in the following Table 1.

TABLE 1

| Point | G/λ | η |
|---|---|---|
| a | 0.01 | 0.70 |
| b | 0.03 | 0.66 |
| c | 0.05 | 0.62 |
| d | 0.07 | 0.55 |
| e | 0.07 | 0.60 |
| f | 0.05 | 0.65 |
| g | 0.03 | 0.70 |
| h | 0.01 | 0.75 |

FIG. 13B represents that |β|≤0.01 is assured within a polygon surrounded by points a to h regardless of the thickness of the film thickness H of the electrode, and good frequency-temperature characteristics can be acquired therein. The range in which the good frequency-temperature characteristics can be acquired is a range that satisfies both Equations (11), (12), and (13) shown below.

$$\eta \leq -2.5000 \times G/\lambda + 0.7775, \text{ wherein}$$
$$0.0100\lambda \leq G \leq 0.0695\lambda \quad (11)$$

$$\eta \geq -2.0000 \times G/\lambda + 0.7200, \text{ wherein}$$
$$0.0100\lambda \leq G \leq 0.0500\lambda \quad (12)$$

$$\eta \geq -3.5898 \times G/\lambda + 0.7995, \text{ wherein}$$
$$0.0500\lambda < G \leq 0.0695\lambda \quad (13)$$

Based on Equations (11), (12), and (13), it can be stated that, for the range surrounded by the solid lines shown in FIG. 13B, the line occupancy ratio η can be specified as a range that satisfies both Equations (5) and (6).

$$-2.0000 \times G/\lambda + 0.7200 \leq \eta \leq -2.5000 \times G/\lambda + 0.7775,$$
$$\text{wherein } 0.0100\lambda \leq G \leq 0.0500\lambda \quad (5)$$

$$-3.5898 \times G/\lambda + 0.7995 \leq \eta \leq -2.5000 \times G/\lambda + 0.7775,$$
$$\text{wherein } 0.0500\lambda < G \leq 0.0695\lambda \quad (6)$$

Here, in a case where the second-order temperature coefficient β is allowed within ±0.01 (ppm/° C.$^2$), it is checked that the second-order temperature coefficient β is within ±0.01 (ppm/° C.$^2$) by configuring such that both Equations (3) and (5) are satisfied for 0.0100λ≤G≤0.0500λ and both Equations (3) and (6) are satisfied for 0.0500λ≤G≤0.0695λ.

In addition, the values of the second-order temperature coefficients β of the film thickness H of each electrode at points a to h are shown in the following Table 2. Based on Table 2, it can be checked that |β|≤0.01 for all the points.

TABLE 2

| | Film Thickness H of Electrode | | | | | |
|---|---|---|---|---|---|---|
| Point | 1% λ | 1.5% λ | 2% λ | 2.5% λ | 3% λ | 3.5% λ |
| a | −0.0099 | −0.0070 | −0.0030 | 0.0030 | −0.0050 | −0.0060 |
| b | 0.0040 | 0.0030 | 0.0000 | 0.0000 | −0.0020 | −0.0040 |
| c | 0.0070 | −0.0040 | 0.0010 | −0.0036 | −0.0040 | −0.0057 |
| d | 0.0067 | −0.0022 | −0.0070 | −0.0080 | −0.0090 | −0.0099 |
| e | −0.0039 | −0.0060 | −0.0090 | −0.0080 | −0.0090 | −0.0094 |
| f | −0.0023 | −0.0070 | −0.0050 | −0.0062 | −0.0060 | −0.0070 |
| g | −0.0070 | −0.0060 | −0.0090 | −0.0070 | −0.0070 | −0.0070 |
| h | −0.0099 | −0.0030 | −0.0091 | −0.0080 | −0.0080 | −0.0080 |

Figure 14:
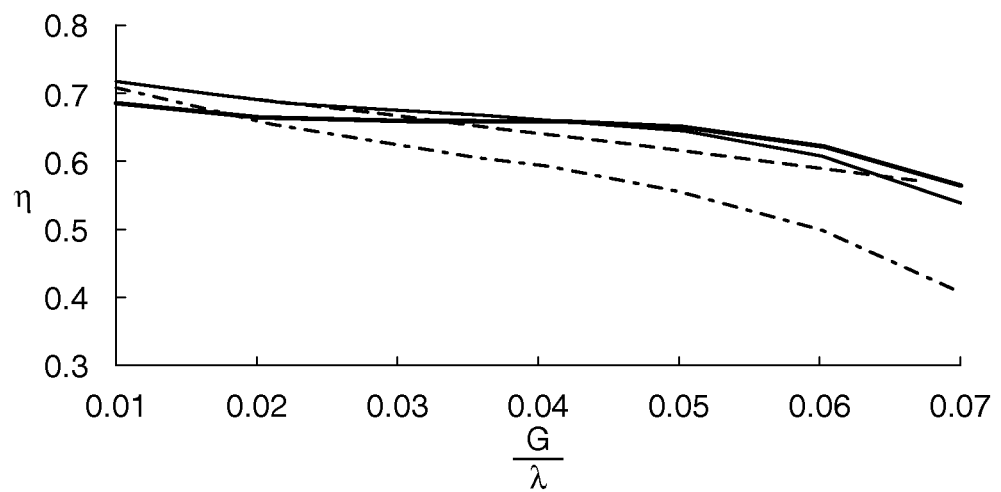
FIG. 14 is a diagram showing the relationship between the depth of the inter-electrode finger groove and the line occupancy ratio for the film thickness of the electrode H≈0 to H=0.030λ as an approximate curve.
Figure 15A:
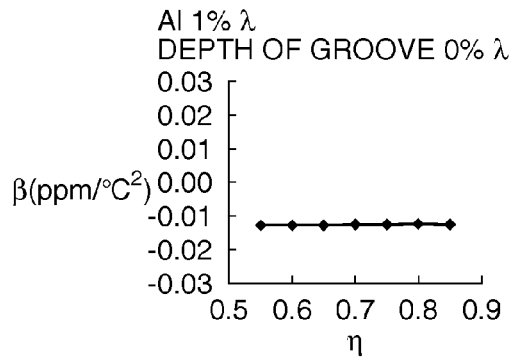
FIGS. 15A to 15F are graphs showing the relationship between the line occupancy ratio and the second-order temperature coefficient in a case where the depth of the inter-electrode finger groove is changed with the film thickness of the electrode set to 0.01λ.
Figure 15B:
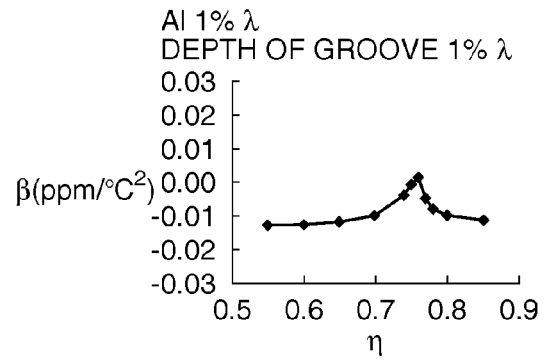
Figure 15C:
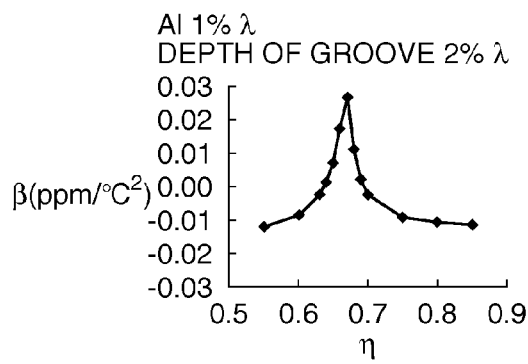
Figure 15D:
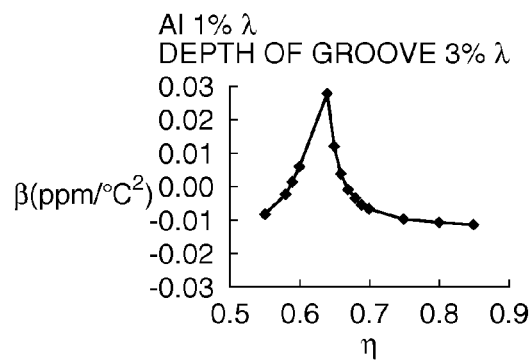
Figure 15E:
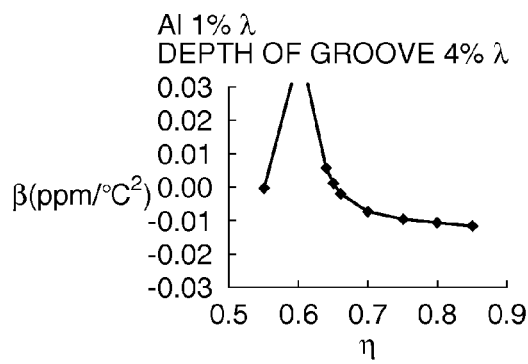
Figure 15F:
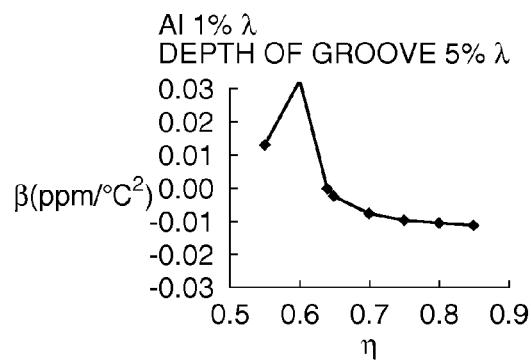
Figure 16A:
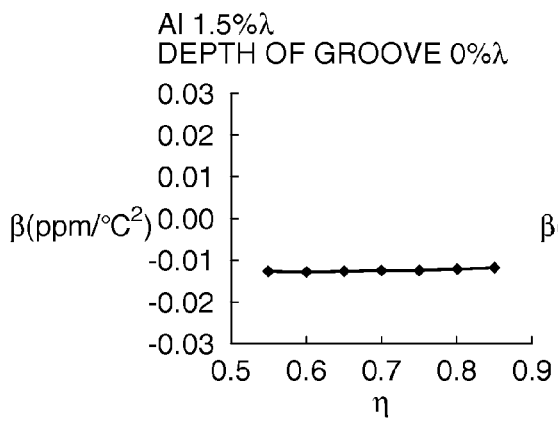
FIGS. 16A to 16F are graphs showing the relationship between the line occupancy ratio and the second-order temperature coefficient in a case where the depth of the inter-electrode finger groove is changed with the film thickness of the electrode set to 0.015λ.
Figure 16B:
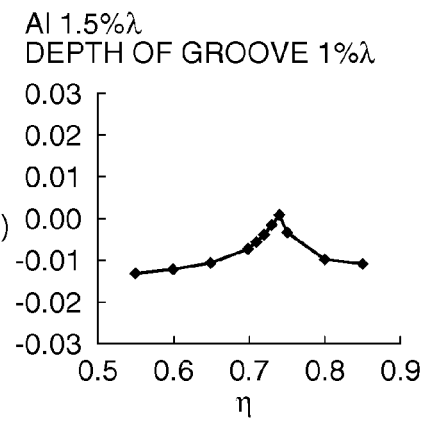
Figure 16C:
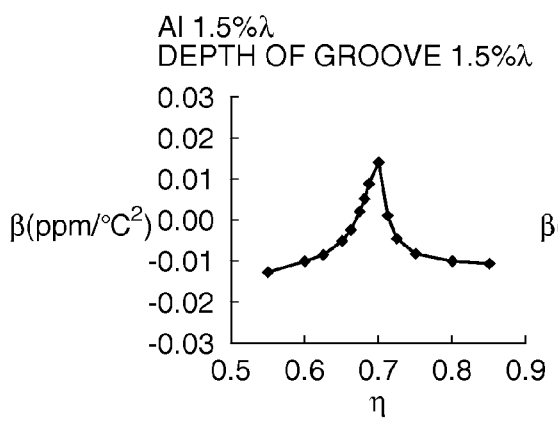
Figure 16D:
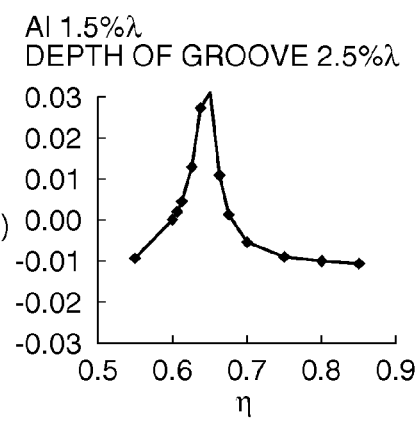
Figure 16E:
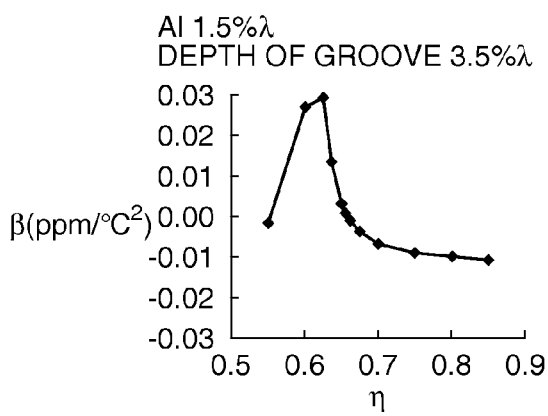
Figure 16F:
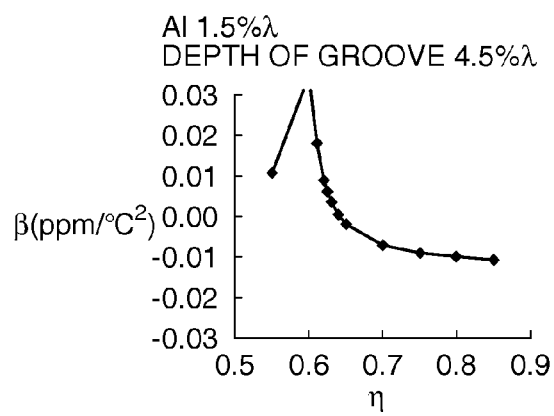
Figure 17A:
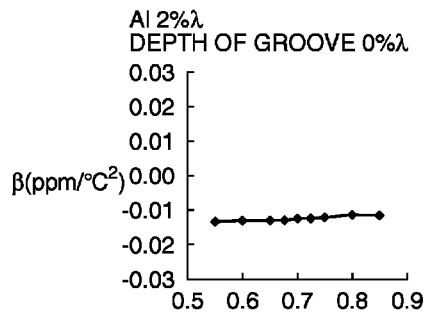
FIGS. 17A to 17F are graphs showing the relationship between the line occupancy ratio and the second-order temperature coefficient in a case where the depth of the inter-electrode finger groove is changed with the film thickness of the electrode set to 0.02λ.
Figure 17B:
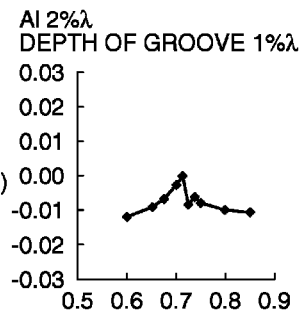
Figure 17C:
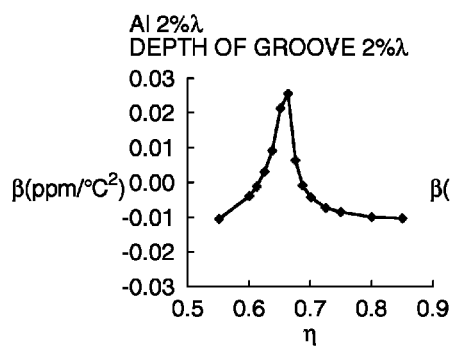
Figure 17D:
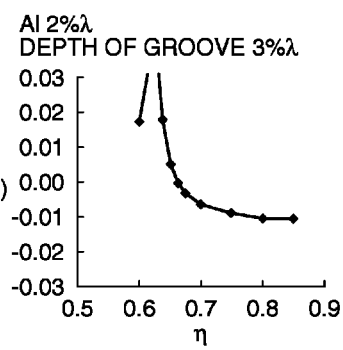
Figure 17E:
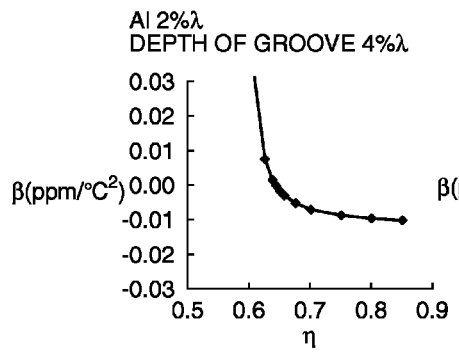
Figure 17F:
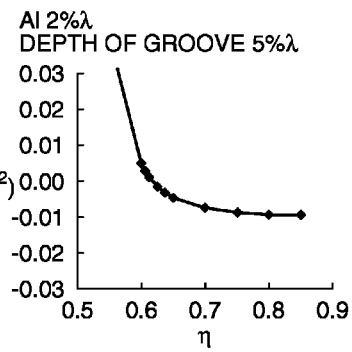
Figure 18A:
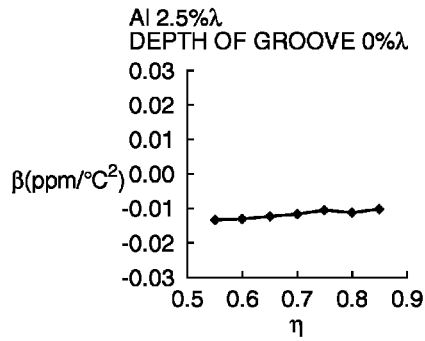
FIGS. 18A to 18F are graphs showing the relationship between the line occupancy ratio and the second-order temperature coefficient in a case where the depth of the inter-electrode finger groove is changed with the film thickness of the electrode set to 0.025λ.
Figure 18B:
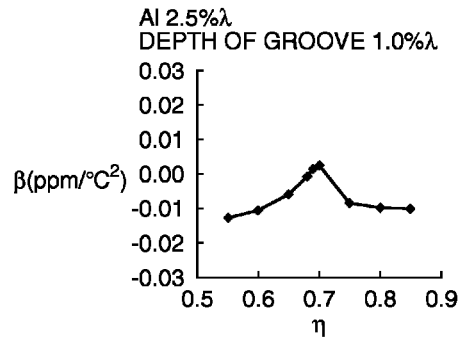
Figure 18C:
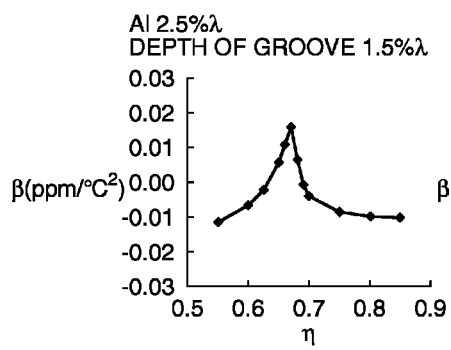
Figure 18D:
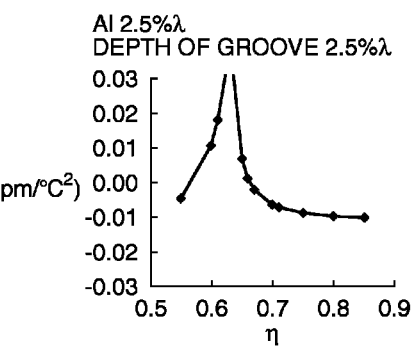
Figure 18E:
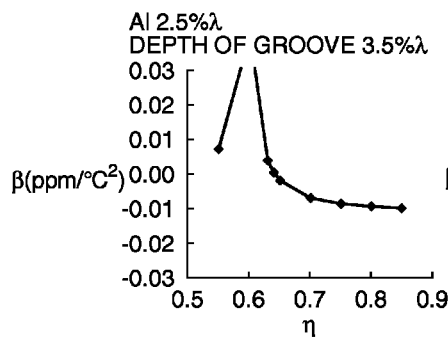
Figure 18F:
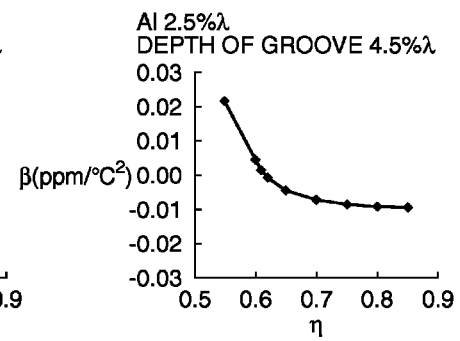
Figure 19A:
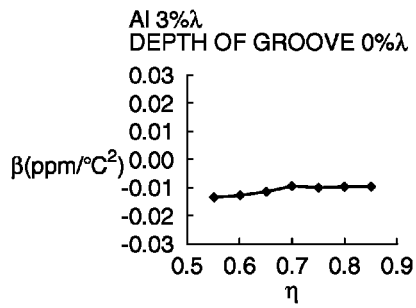
FIGS. 19A to 19F are graphs showing the relationship between the line occupancy ratio and the second-order temperature coefficient in a case where the depth of the inter-electrode finger groove is changed with the film thickness of the electrode set to 0.03λ.
Figure 19B:
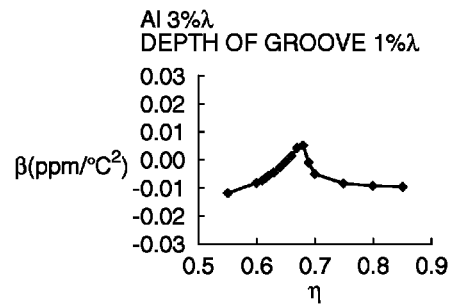
Figure 19C:
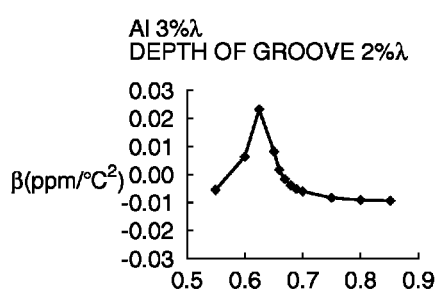
Figure 19D:
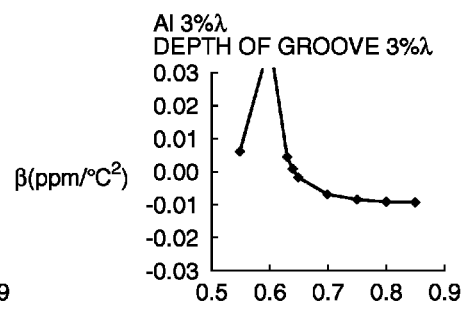
Figure 19E:
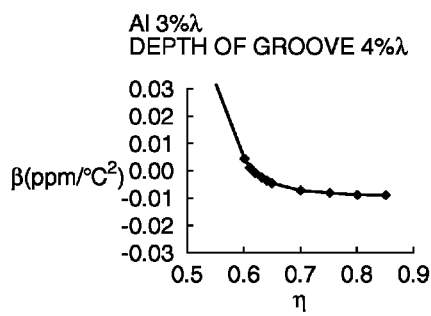
Figure 19F:
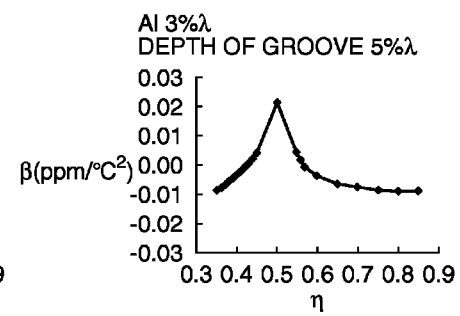
Figure 20A:
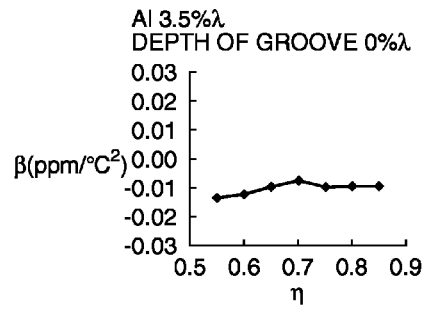
FIGS. 20A to 20F are graphs showing the relationship between the line occupancy ratio and the second-order temperature coefficient in a case where the depth of the inter-electrode finger groove is changed with the film thickness of the electrode set to 0.035λ.
Figure 20B:
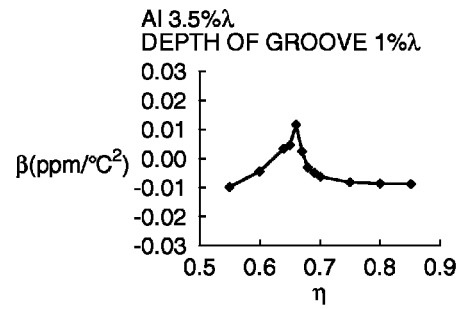
Figure 20C:
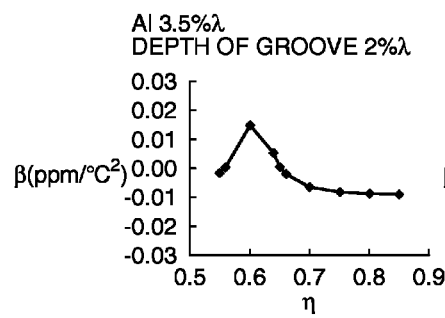
Figure 20D:
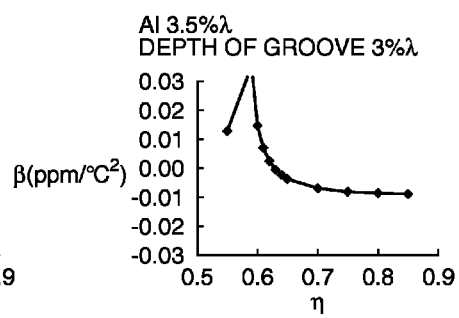
Figure 20E:
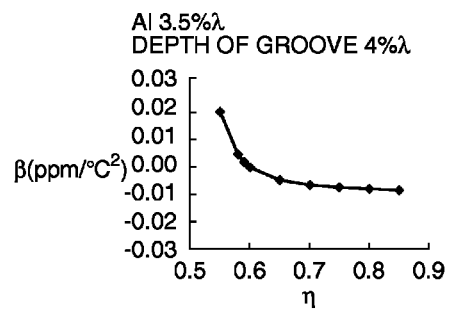
Figure 20F:
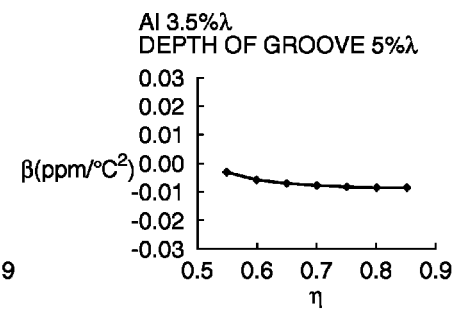
Figure 21A:
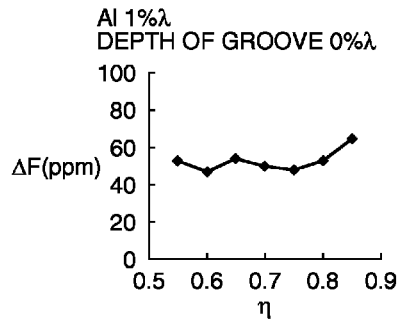
FIGS. 21A to 21F are graphs showing the relationship between the line occupancy ratio and the frequency variation amount in a case where the depth of the inter-electrode finger groove is changed with the film thickness of the electrode set to 0.01λ.
Figure 21B:
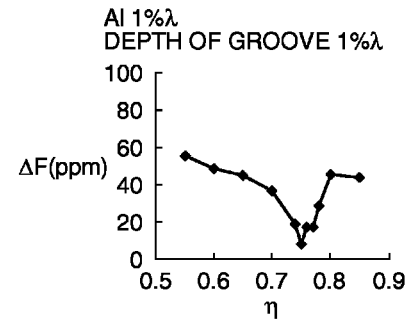
Figure 21C:
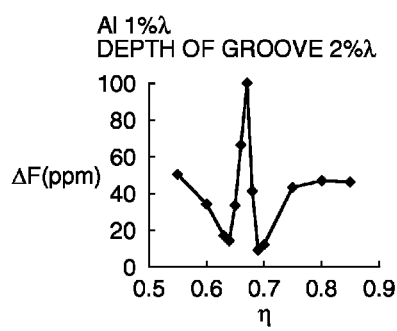
Figure 21D:
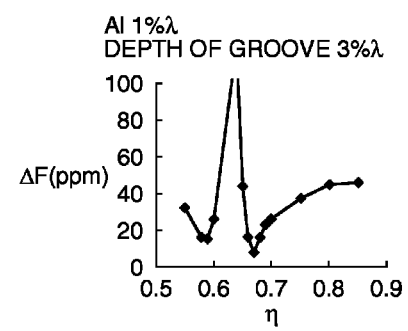
Figure 21E:
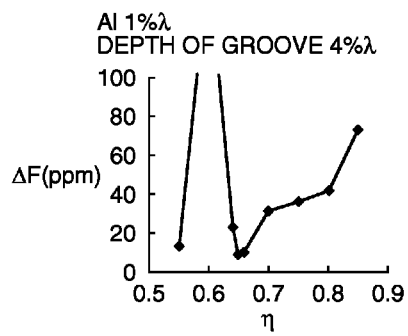
Figure 21F:
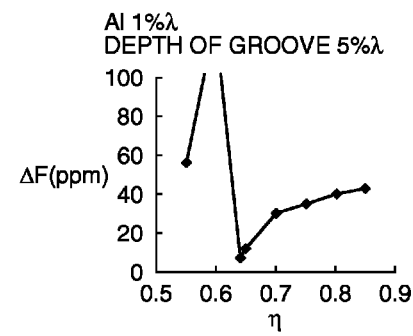
Figure 22A:
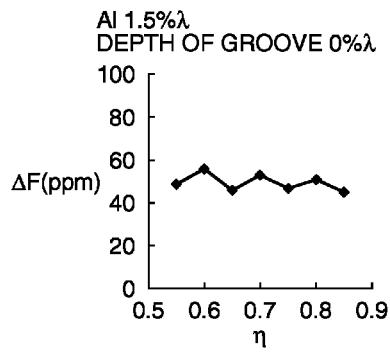
FIGS. 22A to 22F are graphs showing the relationship between the line occupancy ratio and the frequency variation amount in a case where the depth of the inter-electrode finger groove is changed with the film thickness of the electrode set to 0.015λ.
Figure 22B:
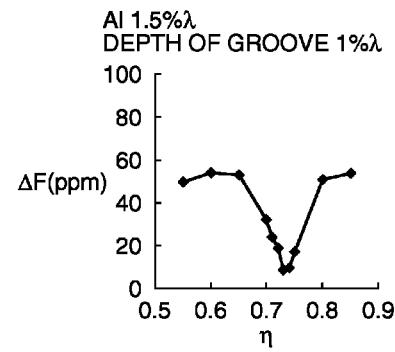
Figure 22C:
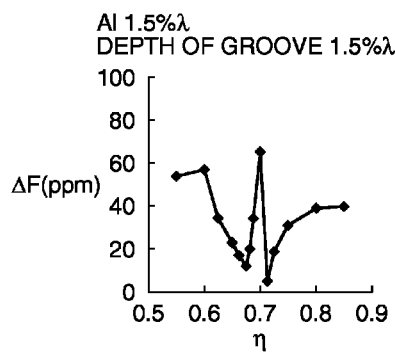
Figure 22D:
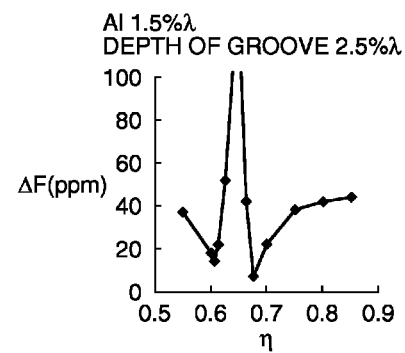
Figure 22E:
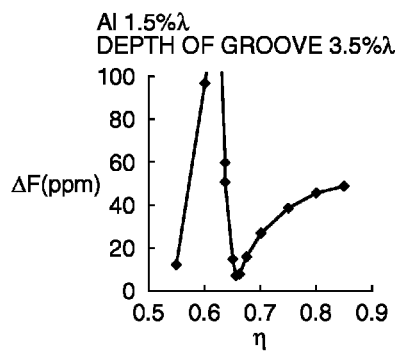
Figure 22F:
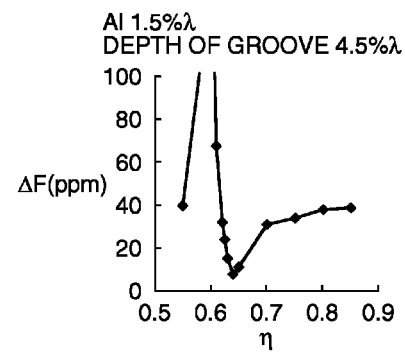
Figure 23A:
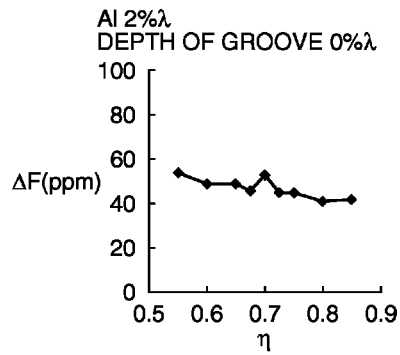
FIGS. 23A to 23F are graphs showing the relationship between the line occupancy ratio and the frequency variation amount in a case where the depth of the inter-electrode finger groove is changed with the film thickness of the electrode set to 0.02λ.
Figure 23B:
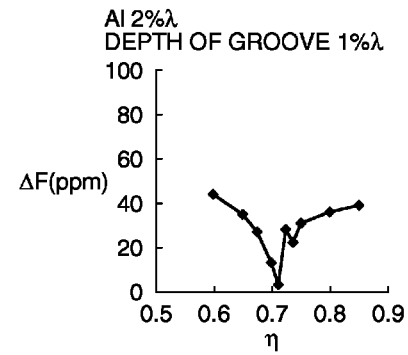
Figure 23C:
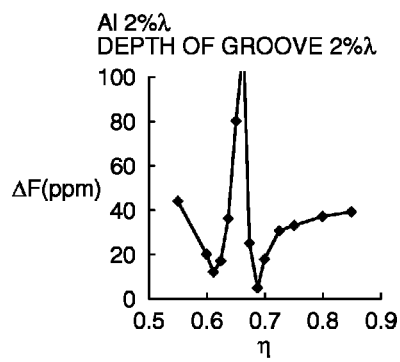
Figure 23D:
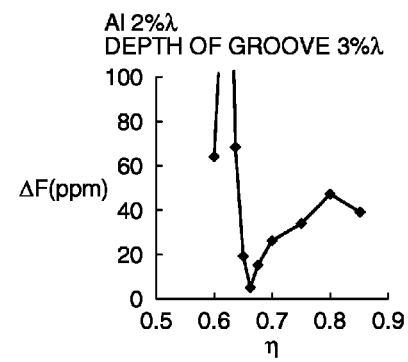
Figure 23E:
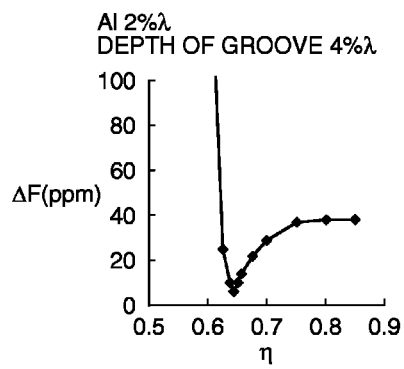
Figure 23F:
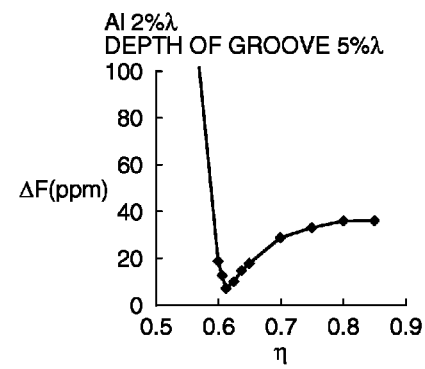
Figure 24A:
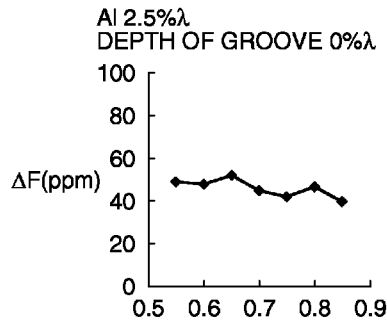
FIGS. 24A to 24F are graphs showing the relationship between the line occupancy ratio and the frequency variation amount in a case where the depth of the inter-electrode finger groove is changed with the film thickness of the electrode set to 0.025λ.
Figure 24B:
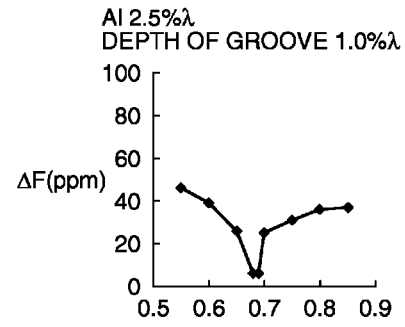
Figure 24C:
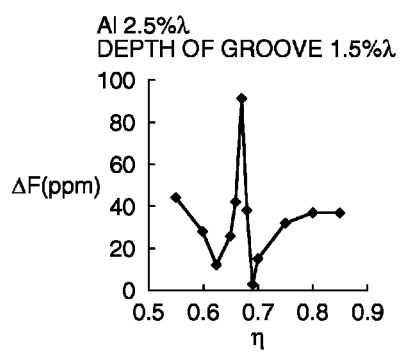
Figure 24D:
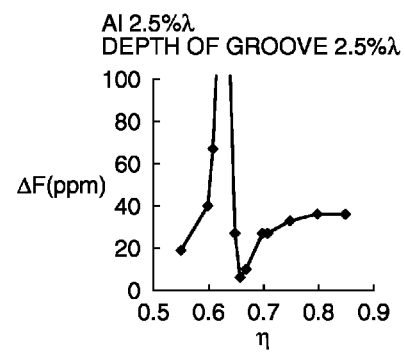
Figure 24E:
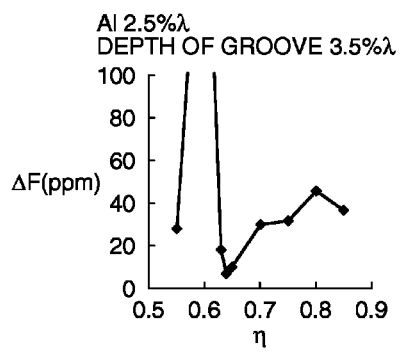
Figure 24F:
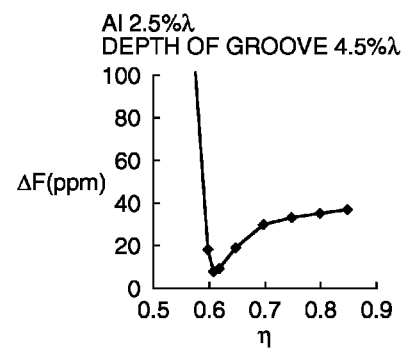
Figure 25A:
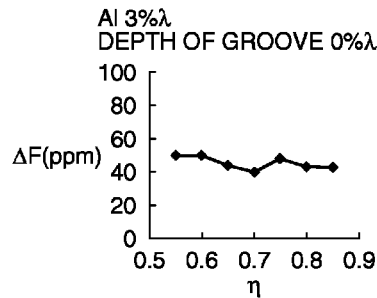
FIGS. 25A to 25F are graphs showing the relationship between the line occupancy ratio and the frequency variation amount in a case where the depth of the inter-electrode finger groove is changed with the film thickness of the electrode set to 0.03λ.
Figure 25B:
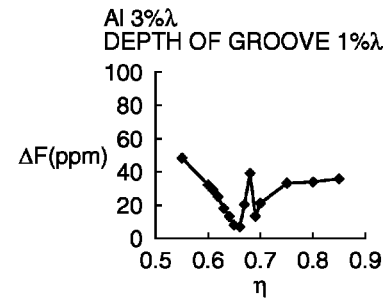
Figure 25C:
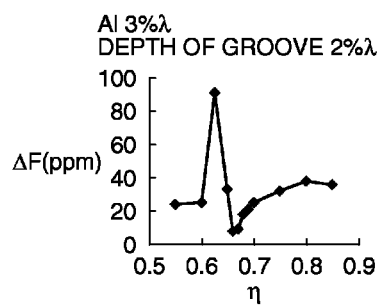
Figure 25D:
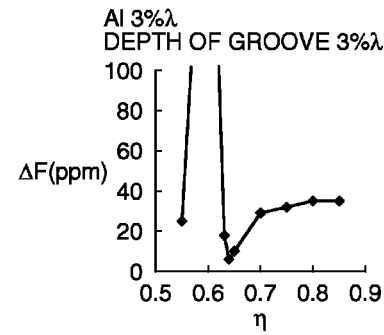
Figure 25E:
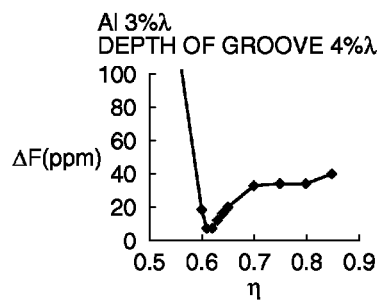
Figure 25F:
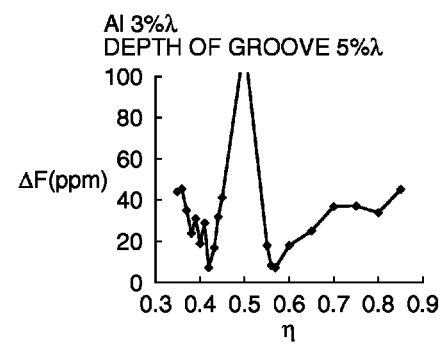
Figure 26A:
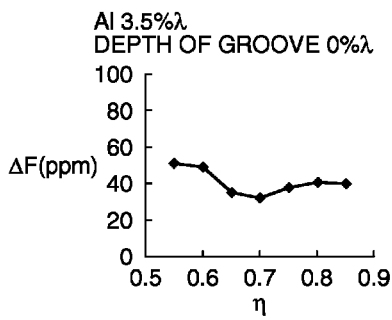
FIGS. 26A to 26F are graphs showing the relationship between the line occupancy ratio and the frequency variation amount in a case where the depth of the inter-electrode finger groove is changed with the film thickness of the electrode set to 0.035λ.
Figure 26B:
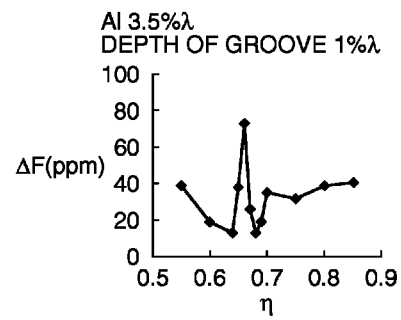
Figure 26C:
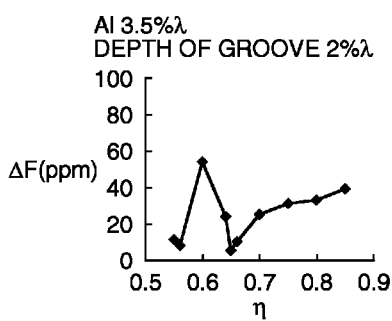
Figure 26D:
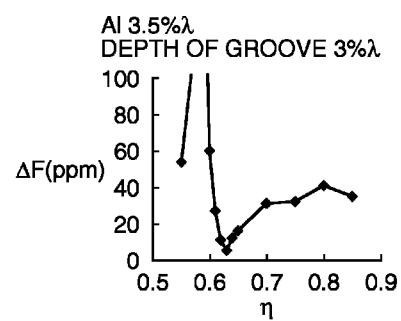
Figure 26E:
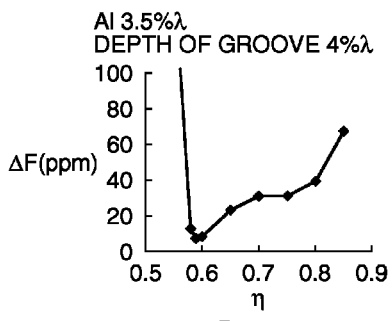
Figure 26F:
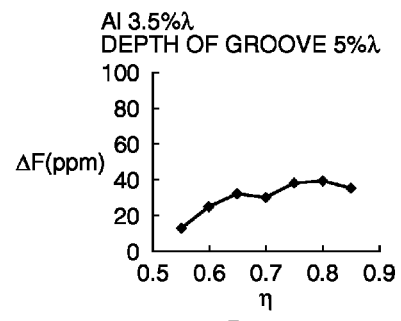

When the relationship between the depth G of the grooves at which β=0 and the line occupancy ratio η of the SAW resonator 10 in which the film thickness of the electrode H≈0, 0.01λ, 0.02λ, 0.03λ, or 0.035λ is represented as an approximate line based on Equations (11) to (13) and Equations (5) and (6) derived therefrom, graphs shown in FIG. 14 are formed. In addition, the relationship between the depth G of the grooves and the line occupancy ratio η of the quartz crystal substrate 30 in which the electrode film is not arranged is as shown in FIG. 9.

When the film thickness H of the electrode is changed to be equal to or less than 3.0% λ (0.030λ), β=0, that is, the frequency-temperature characteristics of a third-order curve can be acquired. At this time, the relationship between G and η at which the frequency-temperature characteristics are good can be represented as in Equation (8).

$$\eta = -1963.05 \times (G/\lambda)^3 + 196.28 \times (G/\lambda)^2 - 6.53 \times (G/\lambda) -$$
$$135.99 \times (H/\lambda)^2 + 5.817 \times (H/\lambda) + 0.732 - 99.99 \times$$
$$(G/\lambda) \times (H/\lambda) \quad (8)$$

Here, the unit of G and H is λ.

However, this Equation (8) satisfies for the film thickness H of the electrode that is in the range of 0<H≤0.030λ.

The manufacturing variation in the electric characteristics (particularly, the resonance frequency) increases as the film thickness of the electrode is increased. Accordingly, there is high possibility that the line occupancy ratio η has manufacturing variation that is larger than ±0.04 for the manufacturing variation within ±0.04 and H>0.035λ in the case where the film thickness H of the electrode is in the range represented in Equations (5) and (6). However, in a case where the film thickness H of the electrode is within the range represented in Equations (5) and (6), and the variation of the line occupancy ratio η is within ±0.04, a SAW device having a small second-order temperature coefficient β can be realized. In other words, in a case where, after the manufacturing variation of the line occupancy ratio is considered, the second-order temperature coefficient β is set within ±0.01 ppm/° C.$^2$, the line occupancy ratio η can be allowed to be in a range represented in Equation (9) that is acquired by adding a common difference of ±0.04 to Equation (8).

$$\eta = -1963.05 \times (G/\lambda)^3 + 196.28 \times (G/\lambda)^2 - 6.53 \times (G/\lambda) -$$
$$135.99 \times (H/\lambda)^2 + 5.817 \times (H/\lambda) + 0.732 - 99.99 \times$$
$$(G/\lambda) \times (H/\lambda) \pm 0.04 \quad (9)$$

FIGS. 15A to 20F show graphs illustrating the relationship between the line occupancy ratio η and the second-order temperature coefficient β in a case where the depth G of the grooves is changed for cases where the film thicknesses of the electrode are 0.01λ (1% λ), 0.015λ (1.5% λ), 0.02λ (2% λ), 0.025λ (2.5% λ), 0.03λ (3% λ), and 0.035λ (3.5% λ).

In addition, FIGS. 21A to 26F show graphs illustrating the relationship between the line occupancy ratio η and the amount ΔF of change in the frequency in SAW resonators 10 corresponding to FIGS. 15A to 20F. Furthermore, the quartz crystal substrate having the Euler angles of (0°, 123°, ψ) is used, and an angle is appropriately selected as ψ such that ΔF is the minimum.

Here, FIGS. 15A to 15F are diagrams illustrating the relationship between the line occupancy ratio η and the second-order temperature coefficient β in a case where the film thickness H of the electrode is set to 0.01λ, and FIGS. 21A to 21F are diagrams illustrating the relationship between the line occupancy ratio η and the amount ΔF of change in the frequency in a case where the film thickness H of the electrode is set to 0.01λ.

Here, FIGS. 16A to 16F are diagrams illustrating the relationship between the line occupancy ratio η and the second-order temperature coefficient β in a case where the film thickness H of the electrode is set to 0.015λ, and FIGS. 22A to 22F are diagrams illustrating the relationship between the line occupancy ratio η and the amount ΔF of change in the frequency in a case where the film thickness H of the electrode is set to 0.015λ.

Here, FIGS. 17A to 17F are diagrams illustrating the relationship between the line occupancy ratio η and the second-order temperature coefficient β in a case where the film thickness H of the electrode is set to 0.02λ, and FIGS. 23A to 23F are diagrams illustrating the relationship between the line occupancy ratio η and the amount ΔF of change in the frequency in a case where the film thickness H of the electrode is set to 0.02λ.

Here, FIGS. 18A to 18F are diagrams illustrating the relationship between the line occupancy ratio η and the second-order temperature coefficient β in a case where the film thickness H of the electrode is set to 0.025λ, and FIGS. 24A to 24F are diagrams illustrating the relationship between the line occupancy ratio η and the amount ΔF of change in the frequency in a case where the film thickness H of the electrode is set to 0.025λ.

Here, FIGS. 19A to 19F are diagrams illustrating the relationship between the line occupancy ratio η and the second-order temperature coefficient β in a case where the film thickness H of the electrode is set to 0.03λ, and FIGS. 25A to 25F are diagrams illustrating the relationship between the line occupancy ratio η and the amount ΔF of change in the frequency in a case where the film thickness H of the electrode is set to 0.03λ.

Here, FIGS. 20A to 20F are diagrams illustrating the relationship between the line occupancy ratio η and the second-order temperature coefficient β in a case where the film thickness H of the electrode is set to 0.035λ, and FIGS. 26A to 26F are diagrams illustrating the relationship between the line occupancy ratio η and the amount ΔF of change in the frequency in a case where the film thickness H of the electrode is set to 0.035λ.

Although there are fine differences between the graphs of the diagrams (FIGS. 15A to 26F), it can be understood that the tendency of the changes is similar to that of FIG. 8A to 8I and 10A to 10I that are graphs illustrating the relationship between the line occupancy ratio η of only the quartz crystal substrate 30 and the second-order temperature coefficient β and the relationship between the line occupancy ratio η and the amount ΔF of change in the frequency.

In other words, it can be stated that the advantage of this embodiment can be accomplished for the propagation of the surface acoustic wave in the single body of the quartz crystal substrate 30 excepting for the electrode film.

Simulation was performed in a case where the range of the film thickness H of the electrode was determined, and the depth G of the grooves was changed for the range of η1 and η2 when the range of β was expanded up to |β|≤0.01 for each of two points η1 and η2 at which the second-order temperature coefficient β was zero. Here, as η1 and η2, a larger one of η for which |β|≤0.01 is set as η1, and a smaller one of η for which |β|≤0.01 is set as η2. In addition, the quartz crystal substrate having the Euler angles of (0°, 123°, ψ) is used, and an angle is appropriately selected as ψ such that ΔF is the minimum.

Figure 27A:
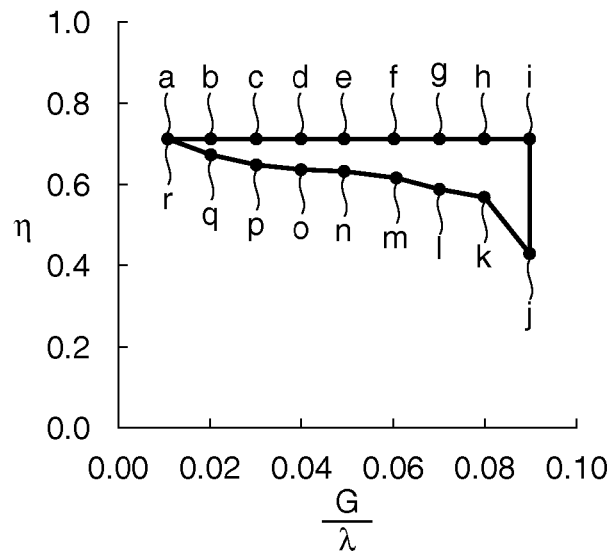
FIGS. 27A and 27B are diagrams showing the ranges in which $|\beta|\leq 0.01$ based on the graph showing the relationship between the line occupancy ratio and the depth of the groove in a case where the film thickness of the electrode is in the range of $0\leq H<0.005\lambda$.

FIG. 27A is a graph illustrating the relationship between η1 satisfying the above-described range of β and the depth G of the grooves in a case where the film thickness H of the electrode is set as 0.000λ<H≤0.005λ. Table 3 is a table that represents the coordinates (G/λ, η) of main measurement points used for determining the range shown in FIG. 27A and the values of β at the corresponding measurement points.

TABLE 3

| Point | G/λ | η | β |
|---|---|---|---|
| a | 0.0100 | 0.7100 | −0.0098 |
| b | 0.0200 | 0.7100 | −0.0099 |
| c | 0.0300 | 0.7100 | −0.0095 |
| d | 0.0400 | 0.7100 | −0.0100 |
| e | 0.0500 | 0.7100 | −0.0100 |
| f | 0.0600 | 0.7100 | −0.0098 |
| g | 0.0700 | 0.7100 | −0.0099 |
| h | 0.0800 | 0.7100 | 0.0097 |
| i | 0.0900 | 0.7100 | −0.0100 |
| j | 0.0900 | 0.4200 | 0.0073 |
| k | 0.0800 | 0.5700 | 0.0086 |
| l | 0.0700 | 0.5900 | 0.0093 |
| m | 0.0600 | 0.6150 | 0.0077 |
| n | 0.0500 | 0.6300 | 0.0054 |
| o | 0.0400 | 0.6350 | 0.0097 |
| p | 0.0300 | 0.6500 | 0.0097 |
| q | 0.0200 | 0.6700 | 0.0074 |
| r | 0.0100 | 0.7100 | 0.0091 |

From FIG. 27A and Table 3, it can be read that β satisfies the above-described conditions within the area surrounded by the measurement points a to r for a case where the depth G of the grooves is in the range of 0.01λ≤G≤0.09λ in a case where the film thickness H of the electrode is in the above-described range at η1.

Figure 27B:
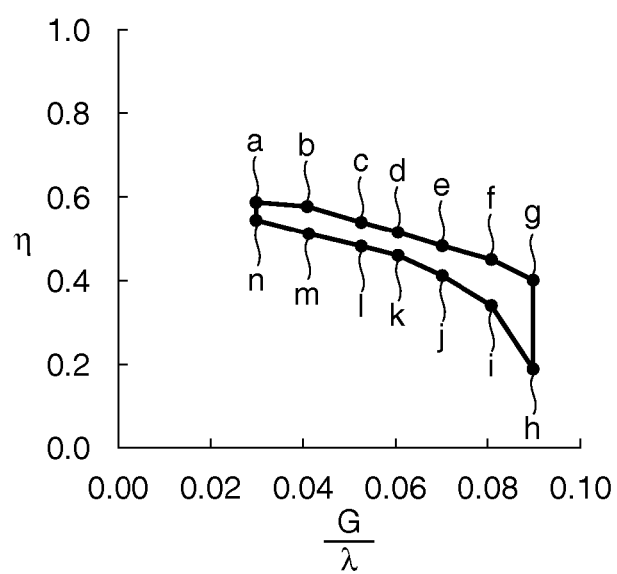

FIG. 27B is a graph illustrating the relationship between η2 satisfying the above-described range of β and the depth G of the grooves in a case where the film thickness H of the electrode is set as 0.000λ<H≤0.005λ. Table 4 is a table that represents the coordinates (G/λ, η) of main measurement points used for determining the range shown in FIG. 27B and the values of β at the corresponding measurement points.

TABLE 4

| Point | G/λ | η | β |
|---|---|---|---|
| a | 0.0300 | 0.5900 | 0.0097 |
| b | 0.0400 | 0.5800 | 0.0097 |
| c | 0.0500 | 0.5500 | 0.0054 |
| d | 0.0600 | 0.5200 | 0.0077 |
| e | 0.0700 | 0.4800 | 0.0093 |

TABLE 4-continued

| Point | G/λ | η | β |
|---|---|---|---|
| f | 0.0800 | 0.4500 | 0.0086 |
| g | 0.0900 | 0.4000 | 0.0073 |
| h | 0.0900 | 0.1800 | 0.0056 |
| i | 0.0800 | 0.3400 | 0.0093 |
| j | 0.0700 | 0.4100 | 0.0078 |
| k | 0.0600 | 0.4600 | 0.0094 |
| l | 0.0500 | 0.4900 | 0.0085 |
| m | 0.0400 | 0.5200 | 0.0099 |
| n | 0.0300 | 0.5500 | 0.0098 |

From FIG. 27B and Table 4, it can be read that β satisfies the above-described conditions within the area surrounded by measurement points a to n for a case where the depth G of the grooves is in the range of 0.03λ≤G≤0.09λ in a case where the film thickness H of the electrode is in the above-described range at η2.

Figure 28A:
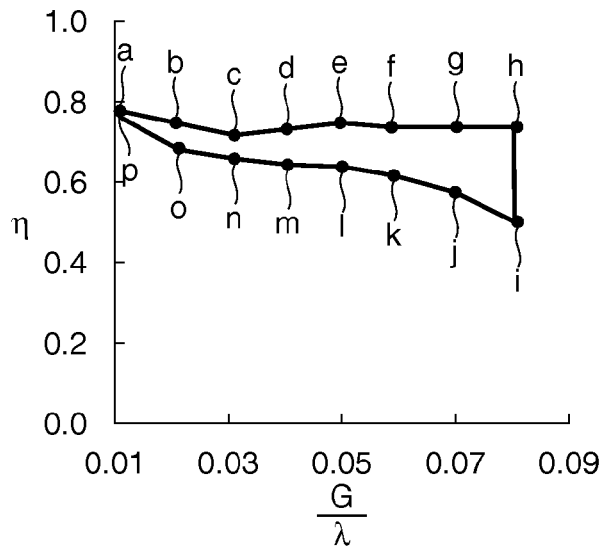
FIGS. 28A and 28B are diagrams showing the ranges in which $|\beta|\leq 0.01$ based on the graph showing the relationship between the line occupancy ratio and the depth of the groove in a case where the film thickness of the electrode is in the range of $0.005\lambda\leq H<0.010\lambda$.

FIG. 28A is a graph illustrating the relationship between η1 satisfying the above-described range of β and the depth G of the grooves in a case where the film thickness H of the electrode is set as 0.005λ<H≤0.010λ. Table 5 is a table that represents the coordinates (G/λ, η) of main measurement points used for determining the range shown in FIG. 28A and the values of β at the corresponding measurement points.

TABLE 5

| Point | G/λ | η | β |
|---|---|---|---|
| a | 0.0100 | 0.7700 | −0.0099 |
| b | 0.0200 | 0.7400 | −0.0100 |
| c | 0.0300 | 0.7150 | −0.0100 |
| d | 0.0400 | 0.7300 | −0.0098 |
| e | 0.0500 | 0.7400 | −0.0100 |
| f | 0.0600 | 0.7300 | −0.0098 |
| g | 0.0700 | 0.7300 | −0.0100 |
| h | 0.0800 | 0.7300 | −0.0100 |
| i | 0.0800 | 0.5000 | 0.0086 |
| j | 0.0700 | 0.5700 | 0.0100 |
| k | 0.0600 | 0.6100 | 0.0095 |
| l | 0.0500 | 0.6300 | 0.0100 |
| m | 0.0400 | 0.6350 | 0.0097 |
| n | 0.0300 | 0.6550 | 0.0070 |
| o | 0.0200 | 0.6800 | 0.0100 |
| p | 0.0100 | 0.7600 | 0.0016 |

From FIG. 28A and Table 5, it can be read that β satisfies the above-described conditions within the area surrounded by the measurement points a to p for a case where the depth G of the grooves is in the range of 0.01λ≤G≤0.08λ in a case where the film thickness H of the electrode is in the above-described range at η1.

Figure 28B:
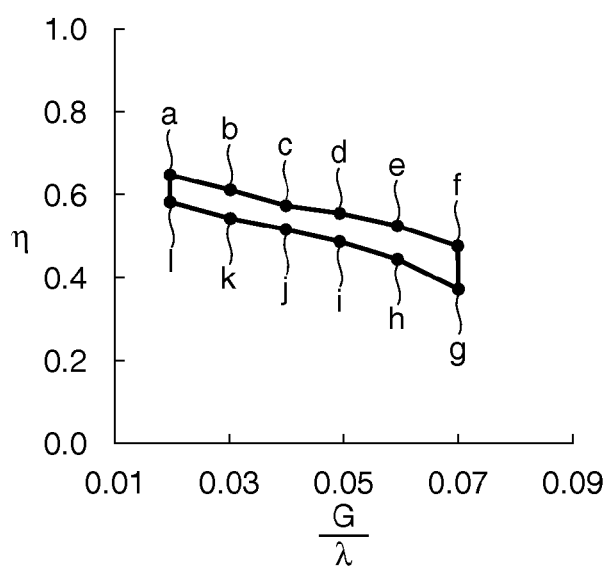

FIG. 28B is a graph illustrating the relationship between η2 satisfying the above-described range of β and the depth G of the grooves in a case where the film thickness H of the electrode is set as 0.005λ<H≤0.010λ. Table 6 is a table that represents the coordinates (G/λ, η) of main measurement points used for determining the range shown in FIG. 28B and the values of β at the corresponding measurement points.

TABLE 6

| Point | G/λ | η | β |
|---|---|---|---|
| a | 0.0200 | 0.6500 | 0.0090 |
| b | 0.0300 | 0.6100 | 0.0098 |
| c | 0.0400 | 0.5700 | 0.0097 |
| d | 0.0500 | 0.5500 | 0.0040 |
| e | 0.0600 | 0.5200 | 0.0066 |
| f | 0.0700 | 0.4700 | 0.0070 |
| g | 0.0700 | 0.3700 | −0.0094 |
| h | 0.0600 | 0.4400 | −0.0096 |
| i | 0.0500 | 0.4800 | −0.0096 |
| j | 0.0400 | 0.5200 | −0.0095 |
| k | 0.0300 | 0.5500 | −0.0099 |
| l | 0.0200 | 0.5900 | −0.0100 |

From FIG. 28B and Table 6, it can be read that β satisfies the above-described conditions within the area surrounded by measurement points a to l for a case where the depth G of the grooves is in the range of 0.02λ≤G≤0.07λ in a case where the film thickness H of the electrode is in the above-described range at η2.

Figure 29A:
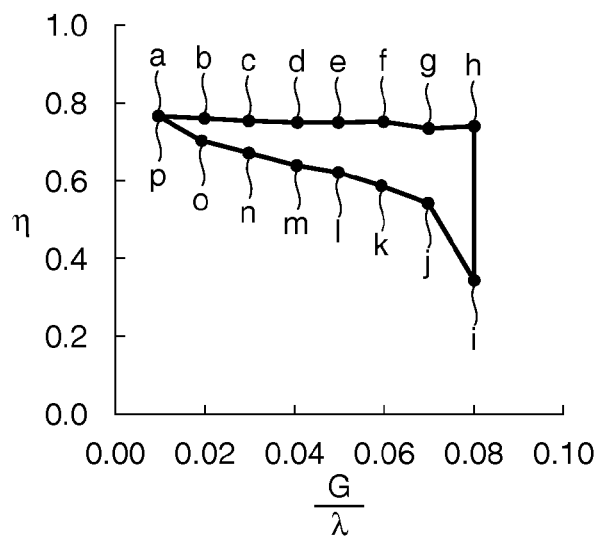
FIGS. 29A and 29B are diagrams showing the ranges in which $|\beta|\leq 0.01$ based on the graph showing the relationship between the line occupancy ratio and the depth of the groove in a case where the film thickness of the electrode is in the range of $0.010\lambda\leq H<0.015\lambda$.

FIG. 29A is a graph illustrating the relationship between η1 satisfying the above-described range of β and the depth G of the grooves in a case where the film thickness H of the electrode is set as 0.010λ<H≤0.015λ. Table 7 is a table that represents the coordinates (G/λ, η) of main measurement points used for determining the range shown in FIG. 29A and the values of β at the corresponding measurement points.

TABLE 7

| Point | G/λ | η | β |
|---|---|---|---|
| A | 0.0100 | 0.770 | −0.0099 |
| B | 0.0200 | 0.760 | −0.0099 |
| C | 0.0300 | 0.760 | −0.0099 |
| D | 0.0400 | 0.750 | −0.0099 |
| E | 0.0500 | 0.750 | −0.0099 |
| F | 0.0600 | 0.750 | −0.0099 |
| G | 0.0700 | 0.740 | −0.0099 |
| H | 0.0800 | 0.740 | −0.0098 |
| I | 0.0800 | 0.340 | 0.0088 |
| J | 0.0700 | 0.545 | 0.0088 |
| K | 0.0600 | 0.590 | 0.0099 |
| L | 0.0500 | 0.620 | 0.0090 |
| M | 0.0400 | 0.645 | 0.0060 |
| N | 0.0300 | 0.670 | 0.0030 |
| O | 0.0200 | 0.705 | 0.0076 |
| P | 0.0100 | 0.760 | 0.0010 |

From FIG. 29A and Table 7, it can be read that β satisfies the above-described conditions within the area surrounded by the measurement points a to p for a case where the depth G of the grooves is in the range of 0.01λ≤G≤0.08λ in a case where the film thickness H of the electrode is in the above-described range at η1.

Figure 29B:
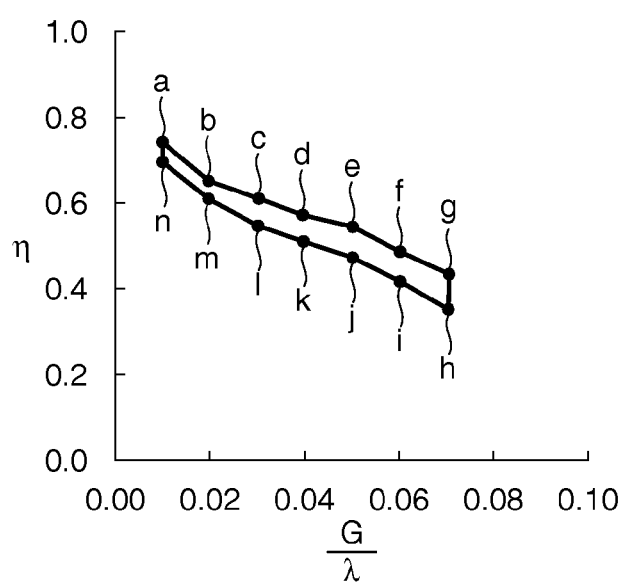

FIG. 29B is a graph illustrating the relationship between η2 satisfying the above-described range of β and the depth G of the grooves in a case where the film thickness H of the electrode is set as 0.010λ<H≤0.015λ. Table 8 is a table that represents the coordinates (G/λ, η) of main measurement points used for determining the range shown in FIG. 29B and the values of β at the corresponding measurement points.

TABLE 8

| Point | G/λ | η | β |
|---|---|---|---|
| a | 0.0100 | 0.740 | 0.0099 |
| b | 0.0200 | 0.650 | 0.0090 |
| c | 0.0300 | 0.610 | 0.0090 |
| d | 0.0400 | 0.570 | 0.0080 |
| e | 0.0500 | 0.540 | 0.0060 |
| f | 0.0600 | 0.480 | 0.0060 |
| g | 0.0700 | 0.430 | 0.0099 |
| h | 0.0700 | 0.3500 | −0.0099 |
| i | 0.0600 | 0.4200 | −0.0090 |

TABLE 8-continued

| Point | G/λ | η | β |
|---|---|---|---|
| j | 0.0500 | 0.4700 | −0.0090 |
| k | 0.0400 | 0.5100 | −0.0090 |
| l | 0.0300 | 0.5500 | −0.0090 |
| m | 0.0200 | 0.6100 | −0.0099 |
| n | 0.0100 | 0.7000 | −0.0099 |

From FIG. 29B and Table 8, it can be read that β satisfies the above-described conditions within the area surrounded by measurement points a to n for a case where the depth G of the grooves is in the range of 0.01λ≤G≤0.07λ in a case where the film thickness H of the electrode is in the above-described range at η2.

Figure 30A:
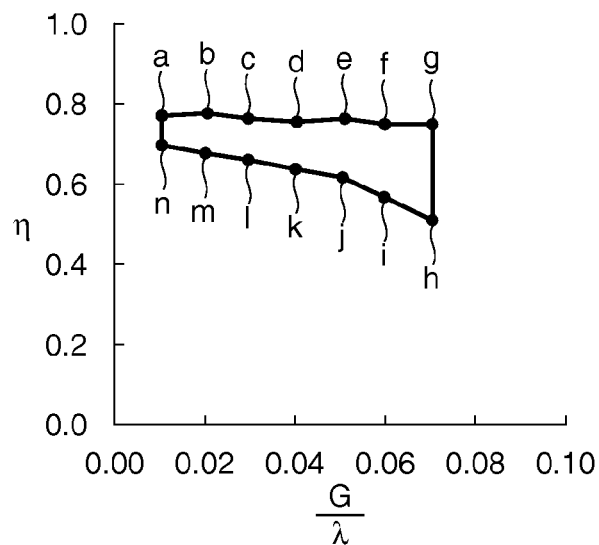
FIGS. 30A and 30B are diagrams showing the ranges in which $|\beta|\leq 0.01$ based on the graph showing the relationship between the line occupancy ratio and the depth of the groove in a case where the film thickness of the electrode is in the range of $0.015\lambda\leq H<0.020\lambda$.

FIG. 30A is a graph illustrating the relationship between η1 satisfying the above-described range of β and the depth G of the grooves in a case where the film thickness H of the electrode is set as 0.015λ<H≤0.020λ. Table 9 is a table that represents the coordinates (G/λ, η) of main measurement points used for determining the range shown in FIG. 30A and the values of β at the corresponding measurement points.

TABLE 9

| Point | G/λ | η | β |
|---|---|---|---|
| a | 0.010 | 0.770 | −0.0100 |
| b | 0.020 | 0.770 | −0.0100 |
| c | 0.030 | 0.760 | −0.0100 |
| d | 0.040 | 0.760 | −0.0100 |
| e | 0.050 | 0.760 | −0.0100 |
| f | 0.060 | 0.750 | −0.0100 |
| g | 0.070 | 0.750 | −0.0100 |
| h | 0.070 | 0.510 | 0.0100 |
| i | 0.060 | 0.570 | 0.0099 |
| j | 0.050 | 0.620 | 0.0097 |
| k | 0.040 | 0.640 | 0.0096 |
| l | 0.030 | 0.660 | 0.0080 |
| m | 0.020 | 0.675 | 0.0076 |
| n | 0.010 | 0.700 | 0.0010 |

From FIG. 30A and Table 9, it can be read that β satisfies the above-described conditions within the area surrounded by the measurement points a to n for a case where the depth G of the grooves is in the range of 0.01λ≤G≤0.07λ in a case where the film thickness H of the electrode is in the above-described range at η1.

Figure 30B:
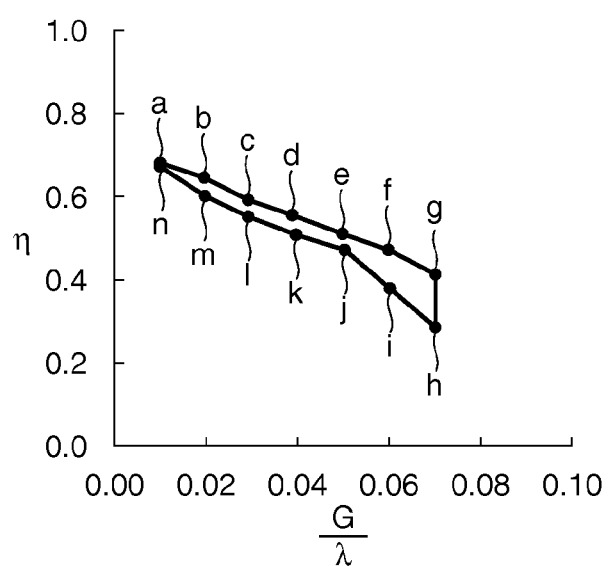

FIG. 30B is a graph illustrating the relationship between η2 satisfying the above-described range of β and the depth G of the grooves in a case where the film thickness H of the electrode is set as 0.015λ<H≤0.020λ. Table 10 is a table that represents the coordinates (G/λ, η) of main measurement points used for determining the range shown in FIG. 30B and the values of β at the corresponding measurement points.

TABLE 10

| Point | G/λ | η | β |
|---|---|---|---|
| a | 0.010 | 0.690 | 0.0010 |
| b | 0.020 | 0.640 | 0.0090 |
| c | 0.030 | 0.590 | 0.0090 |
| d | 0.040 | 0.550 | 0.0080 |
| e | 0.050 | 0.510 | 0.0080 |
| f | 0.060 | 0.470 | 0.0090 |
| g | 0.070 | 0.415 | 0.0100 |
| h | 0.070 | 0.280 | −0.0100 |
| i | 0.060 | 0.380 | −0.0090 |
| j | 0.050 | 0.470 | −0.0090 |
| k | 0.040 | 0.510 | −0.0090 |
| l | 0.030 | 0.550 | −0.0090 |

TABLE 10-continued

| Point | G/λ | η | β |
|---|---|---|---|
| m | 0.020 | 0.610 | −0.0100 |
| n | 0.010 | 0.680 | −0.0100 |

From FIG. 30B and Table 10, it can be read that β satisfies the above-described conditions within the area surrounded by measurement points a to n for a case where the depth G of the grooves is in the range of 0.01λ≤G≤0.07λ in a case where the film thickness H of the electrode is in the above-described range at η2.

Figure 31A:
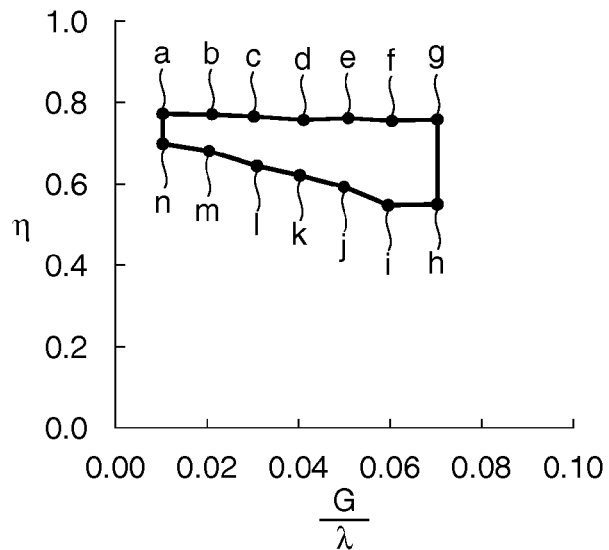
FIGS. 31A and 31B are diagrams showing the ranges in which $|\beta|\leq 0.01$ based on the graph showing the relationship between the line occupancy ratio and the depth of the groove in a case where the film thickness of the electrode is in the range of $0.020\lambda\leq H<0.025\lambda$.

FIG. 31A is a graph illustrating the relationship between η1 satisfying the above-described range of β and the depth G of the grooves in a case where the film thickness H of the electrode is set as 0.020λ<H≤0.025λ. Table 11 is a table that represents the coordinates (G/λ, η) of main measurement points used for determining the range shown in FIG. 31A and the values of β at the corresponding measurement points.

TABLE 11

| Point | G/λ | η | β |
|---|---|---|---|
| a | 0.010 | 0.770 | −0.0100 |
| b | 0.020 | 0.770 | −0.0100 |
| c | 0.030 | 0.760 | −0.0100 |
| d | 0.040 | 0.760 | −0.0100 |
| e | 0.050 | 0.760 | −0.0096 |
| f | 0.060 | 0.760 | −0.0100 |
| g | 0.070 | 0.760 | −0.0100 |
| h | 0.070 | 0.550 | 0.0100 |
| i | 0.060 | 0.545 | 0.0090 |
| j | 0.050 | 0.590 | 0.0097 |
| k | 0.040 | 0.620 | 0.0100 |
| l | 0.030 | 0.645 | 0.0100 |
| m | 0.020 | 0.680 | 0.0070 |
| n | 0.010 | 0.700 | 0.0030 |

From FIG. 31A and Table 11, it can be read that β satisfies the above-described conditions within the area surrounded by the measurement points a to n for a case where the depth G of the grooves is in the range of 0.01λ≤G≤0.07λ in a case where the film thickness H of the electrode is in the above-described range at η1.

Figure 31B:
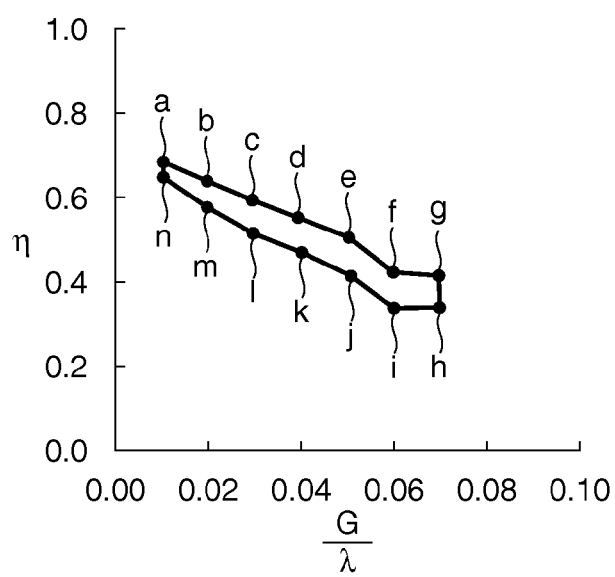

FIG. 31B is a graph illustrating the relationship between η2 satisfying the above-described range of β and the depth G of the grooves in a case where the film thickness H of the electrode is set as 0.020λ<H≤0.025λ. Table 12 is a table that represents the coordinates (G/λ, η) of main measurement points used for determining the range shown in FIG. 31B and the values of β at the corresponding measurement points.

TABLE 12

| Point | G/λ | η | β |
|---|---|---|---|
| a | 0.010 | 0.690 | 0.0030 |
| b | 0.020 | 0.640 | 0.0090 |
| c | 0.030 | 0.590 | 0.0090 |
| d | 0.040 | 0.550 | 0.0090 |
| e | 0.050 | 0.510 | 0.0080 |
| f | 0.060 | 0.420 | 0.0090 |
| g | 0.070 | 0.415 | 0.0080 |
| h | 0.070 | 0.340 | −0.0098 |
| i | 0.060 | 0.340 | −0.0100 |
| j | 0.050 | 0.420 | −0.0100 |
| k | 0.040 | 0.470 | −0.0100 |
| l | 0.030 | 0.520 | −0.0093 |
| m | 0.020 | 0.580 | −0.0100 |
| n | 0.010 | 0.650 | −0.0090 |

From FIG. 31B and Table 12, it can be read that β satisfies the above-described conditions within the area surrounded by measurement points a to n for a case where the depth G of the grooves is in the range of 0.01λ≤G≤0.07λ in a case where the film thickness H of the electrode is in the above-described range at η2.

Figure 32A:
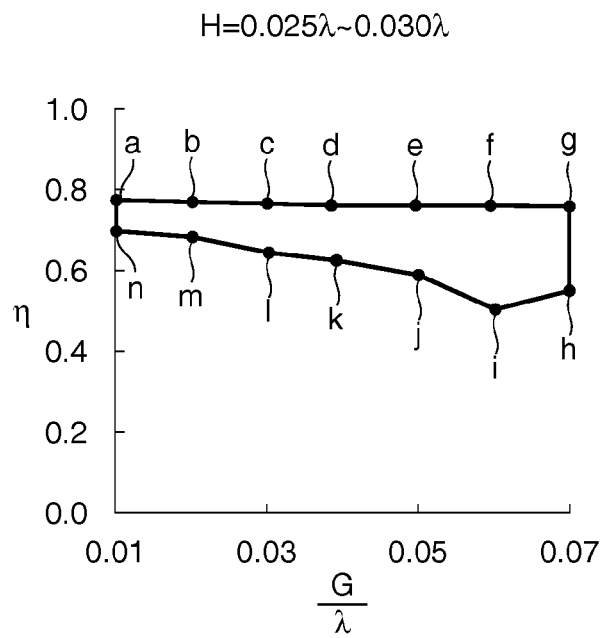
FIGS. 32A and 32B are diagrams showing the ranges in which $|\beta|\leq 0.01$ based on the graph showing the relationship between the line occupancy ratio and the depth of the groove in a case where the film thickness of the electrode is in the range of $0.025\lambda\leq H<0.030\lambda$.

FIG. 32A is a graph illustrating the relationship between η1 satisfying the above-described range of β and the depth G of the grooves in a case where the film thickness H of the electrode is set as 0.025λ<H≤0.030λ. Table 13 is a table that represents the coordinates (G/λ, η) of main measurement points used for determining the range shown in FIG. 32A and the values of β at the corresponding measurement points.

TABLE 13

| Point | G/λ | η | β |
| --- | --- | --- | --- |
| a | 0.010 | 0.770 | −0.0098 |
| b | 0.020 | 0.770 | −0.0100 |
| c | 0.030 | 0.770 | −0.0100 |
| d | 0.040 | 0.760 | −0.0100 |
| e | 0.050 | 0.760 | −0.0099 |
| f | 0.060 | 0.760 | −0.0100 |
| g | 0.070 | 0.760 | −0.0100 |
| h | 0.070 | 0.550 | 0.0080 |
| i | 0.060 | 0.505 | 0.0087 |
| j | 0.050 | 0.590 | 0.0090 |
| k | 0.040 | 0.620 | 0.0100 |
| l | 0.030 | 0.645 | 0.0100 |
| m | 0.020 | 0.680 | 0.0083 |
| n | 0.010 | 0.700 | 0.0052 |

From FIG. 32A and Table 13, it can be read that β satisfies the above-described conditions within the area surrounded by the measurement points a to n for a case where the depth G of the grooves is in the range of 0.01λ≤G≤0.07λ in a case where the film thickness H of the electrode is in the above-described range at η1.

Figure 32B:
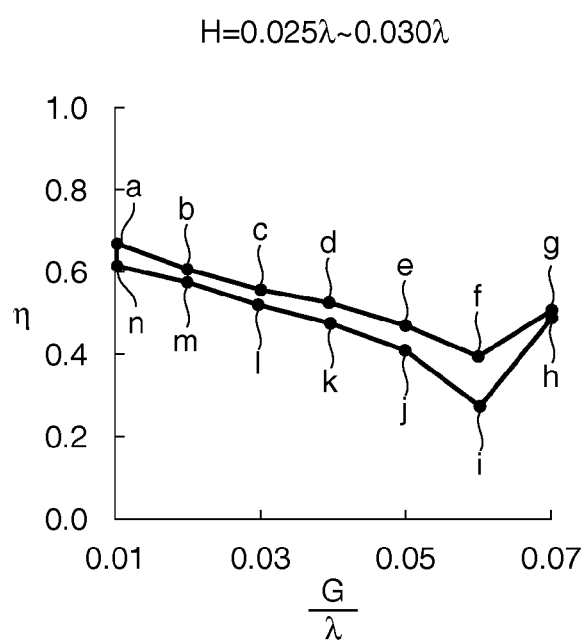

FIG. 32B is a graph illustrating the relationship between η2 satisfying the above-described range of β and the depth G of the grooves in a case where the film thickness H of the electrode is set as 0.025λ<H≤0.030λ. Table 14 is a table that represents the coordinates (G/λ, η) of main measurement points used for determining the range shown in FIG. 32B and the values of β at the corresponding measurement points.

TABLE 14

| Point | G/λ | η | β |
| --- | --- | --- | --- |
| a | 0.010 | 0.670 | 0.0052 |
| b | 0.020 | 0.605 | 0.0081 |
| c | 0.030 | 0.560 | 0.0092 |
| d | 0.040 | 0.520 | 0.0099 |
| e | 0.050 | 0.470 | 0.0086 |
| f | 0.060 | 0.395 | 0.0070 |
| g | 0.070 | 0.500 | 0.0080 |
| h | 0.070 | 0.490 | −0.0100 |
| i | 0.060 | 0.270 | −0.0100 |
| j | 0.050 | 0.410 | −0.0100 |
| k | 0.040 | 0.470 | −0.0100 |
| l | 0.030 | 0.520 | −0.0093 |
| m | 0.020 | 0.580 | −0.0099 |
| n | 0.010 | 0.620 | −0.0090 |

From FIG. 32B and Table 14, it can be read that β satisfies the above-described conditions within the area surrounded by measurement points a to n for a case where the depth G of the grooves is in the range of 0.01λ≤G≤0.07λ in a case where the film thickness H of the electrode is in the above-described range at η2.

Figure 33A:
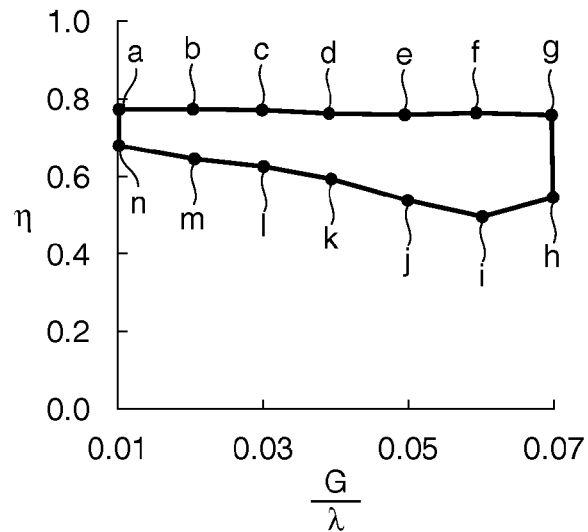
FIGS. 33A and 33B are diagrams showing the ranges in which $|\beta|\leq 0.01$ based on the graph showing the relationship between the line occupancy ratio and the depth of the groove in a case where the film thickness of the electrode is in the range of $0.030\lambda\leq H<0.035\lambda$.

FIG. 33A is a graph illustrating the relationship between η1 satisfying the above-described range of β and the depth G of the grooves in a case where the film thickness H of the electrode is set as 0.030λ<H≤0.035λ. Table 15 is a table that represents the coordinates (G/λ, η) of main measurement points used for determining the range shown in FIG. 33A and the values of β at the corresponding measurement points.

TABLE 15

| Point | G/λ | η | β |
| --- | --- | --- | --- |
| a | 0.010 | 0.770 | −0.0100 |
| b | 0.020 | 0.770 | −0.0098 |
| c | 0.030 | 0.770 | −0.0100 |
| d | 0.040 | 0.760 | −0.0100 |
| e | 0.050 | 0.760 | −0.0100 |
| f | 0.060 | 0.760 | −0.0100 |
| g | 0.070 | 0.760 | −0.0100 |
| h | 0.070 | 0.550 | 0.0090 |
| i | 0.060 | 0.500 | 0.0087 |
| j | 0.050 | 0.545 | 0.0090 |
| k | 0.040 | 0.590 | 0.0091 |
| l | 0.030 | 0.625 | 0.0080 |
| m | 0.020 | 0.650 | 0.0083 |
| n | 0.010 | 0.680 | 0.0093 |

From FIG. 33A and Table 15, it can be read that β satisfies the above-described conditions within the area surrounded by the measurement points a to n for a case where the depth G of the grooves is in the range of 0.01λ≤G≤0.07λ in a case where the film thickness H of the electrode is in the above-described range at η1.

Figure 33B:
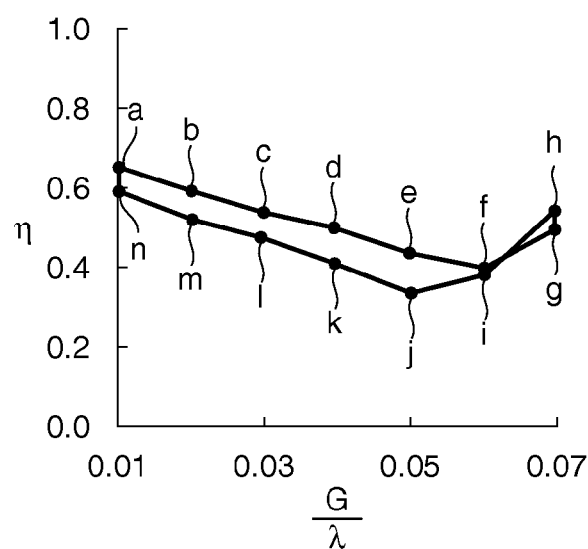
Figure 34A:
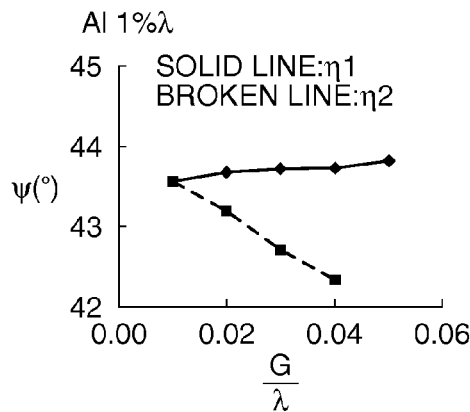
FIGS. 34A to 34F are graphs showing the relationship between the depth of the inter-electrode finger groove and the Euler angle ψ when the film thickness of the electrode and the line occupancy ratio (η1: solid line, η2: broken line) are determined.
Figure 34B:
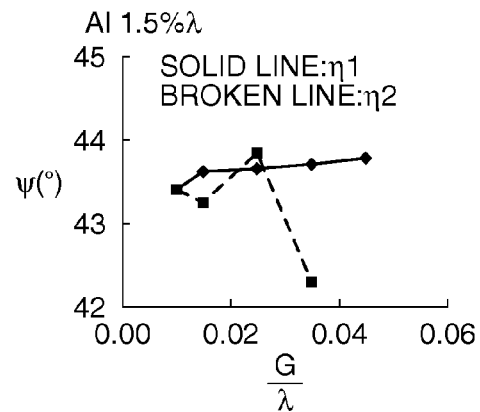
Figure 34C:
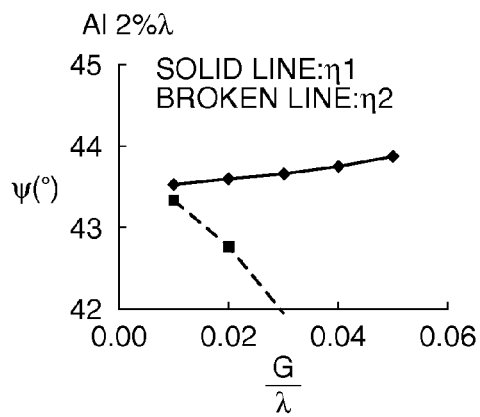
Figure 34D:
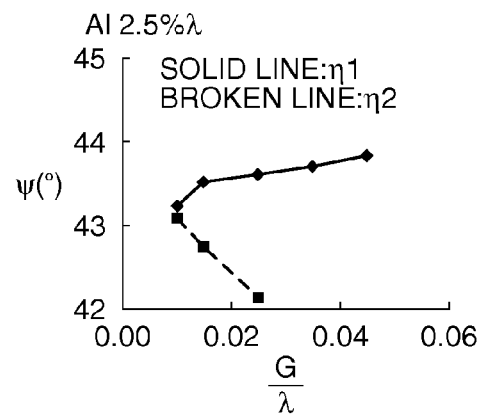
Figure 34E:
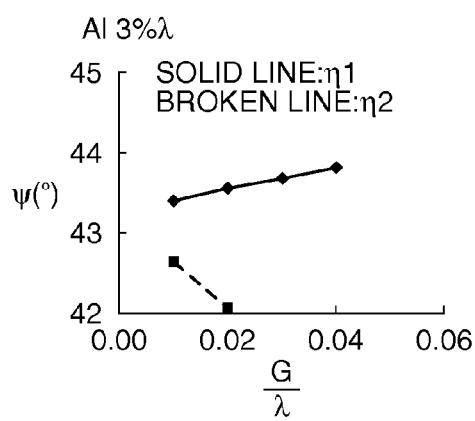
Figure 34F:
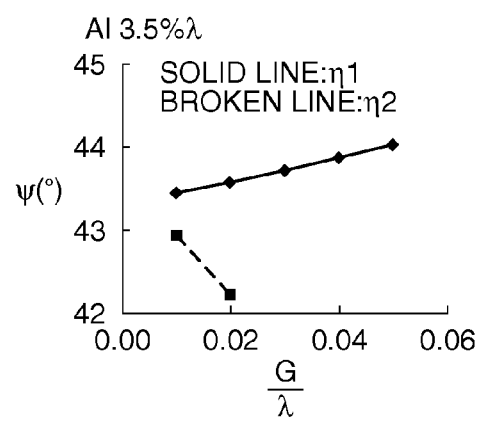

FIG. 33B is a graph illustrating the relationship between η2 satisfying the above-described range of β and the depth G of the grooves in a case where the film thickness H of the electrode is set as 0.030λ<H≤0.035λ. Table 16 is a table that represents the coordinates (G/λ, η) of main measurement points used for determining the range shown in FIG. 33B and the values of β at the corresponding measurement points.

TABLE 16

| Point | G/λ | η | β |
| --- | --- | --- | --- |
| a | 0.010 | 0.655 | 0.0080 |
| b | 0.020 | 0.590 | 0.0081 |
| c | 0.030 | 0.540 | 0.0092 |
| d | 0.040 | 0.495 | 0.0099 |
| e | 0.050 | 0.435 | 0.0090 |
| f | 0.060 | 0.395 | 0.0061 |
| g | 0.070 | 0.500 | 0.0090 |
| h | 0.070 | 0.550 | −0.0100 |
| i | 0.060 | 0.380 | −0.0090 |
| j | 0.050 | 0.330 | −0.0100 |
| k | 0.040 | 0.410 | −0.0095 |
| l | 0.030 | 0.470 | −0.0099 |
| m | 0.020 | 0.520 | −0.0100 |
| n | 0.010 | 0.590 | −0.0100 |

From FIG. 33B and Table 16, it can be read that β satisfies the above-described conditions within the area surrounded by measurement points a to n for a case where the depth G of the grooves is in the range of 0.01λ≤G≤0.07λ in a case where the film thickness H of the electrode is in the above-described range at η2.

Figure 35:
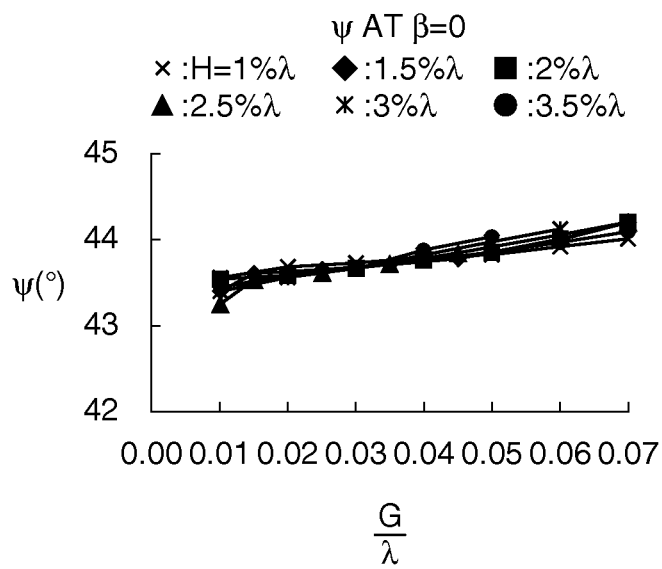
FIG. 35 is a diagram in which the relationship between the depth of the inter-electrode finger groove and the Euler angle ψ for each film thickness of the electrode is organized in a graph.

In FIG. 35, the relationship between ψ acquired from η1 on the graph shown in FIGS. 34A to 34F and the depth G of the grooves is organized. The reason for selecting η1 is as described above. As shown in FIG. 35, even in a case where the film thickness of the electrode is changed, there is almost no difference in the angle of ψ, and it is understood that the optimal angle of ψ is changed in accordance with the change in the depth G of the grooves. This also can be evidence representing that the ratio of change in the second-order temperature coefficient β that is caused by the form of the quartz crystal substrate 30 is high.

Figure 36:
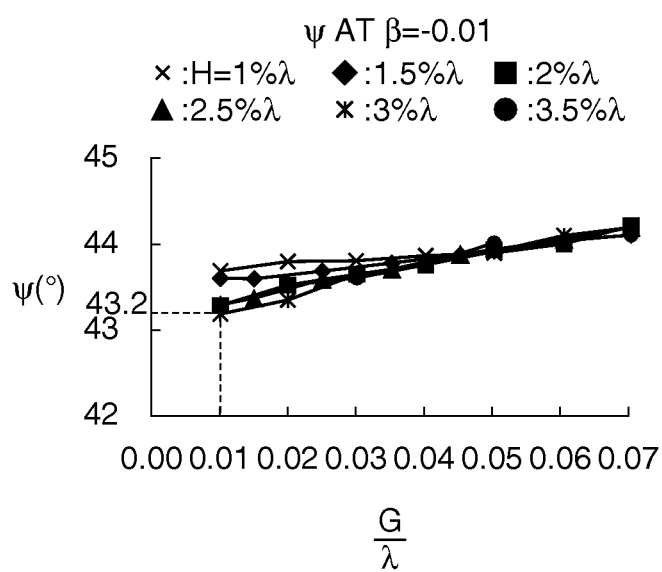
FIG. 36 is a graph showing the relationship between the depth of the inter-electrode finger groove at which the second-order temperature coefficient is −0.01 (ppm/° C.$^2$) and the Euler angle ψ.
Figure 37:
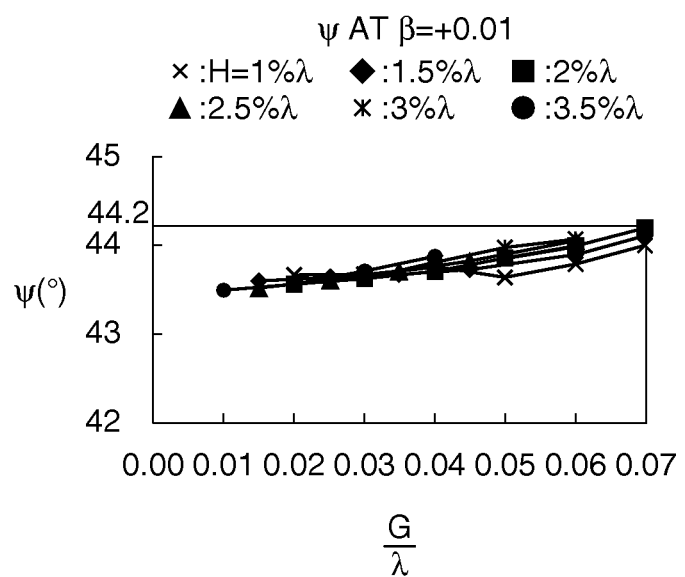
FIG. 37 is a graph showing the relationship between the depth of the inter-electrode finger groove at which the second-order temperature coefficient is +0.01 (ppm/° C.$^2$) and the Euler angle ψ.

As described above, the relationships between ψ at which the second-order temperature coefficient β=−0.01 (ppm/° C.²) and ψ at which β=+0.01 (ppm/° C.²) and the depth G of the grooves are acquired and are organized in FIGS. 36 and 37. When the angle of ψ at which −0.01≤β≤+0.01 is acquired from the graphs (FIGS. 35 to 37), a preferred range of the angle of ψ under the above-described conditions can be determined as 43°<ψ<45°, and a more preferred range of the angle of ψ can be determined as 43.2°≤ψ≤44.2°.

In addition, simulation was performed for the range of ψ satisfying the condition of |β|≤0.01 when the depth G of the grooves is changed in a case where the film thickness H of the electrode is changed. The results of the simulation are shown in FIGS. 38A to 44B. In addition, the quartz crystal substrate having Euler angles of (0°, 123°, ψ) is used, and an angle is appropriately selected as ψ such that ΔF is the minimum.

Figure 38A:
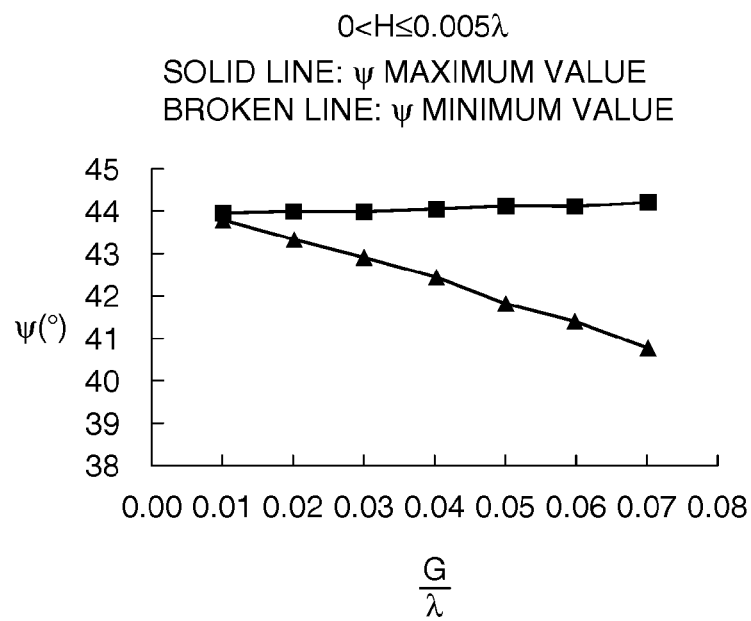
FIGS. 38A and 38B are graphs showing the ranges of ψ satisfying the condition of $|\beta|\leq 0.01$ (ppm/° C.$^2$) in a case where the film thickness of the electrode is in the range of $0<H\leq 0.005\lambda$.

FIG. 38A is a graph illustrating the range of ψ satisfying the condition of |β|≤0.01 in a case where the film thickness H of the electrode is set as 0<H≤0.005λ. Here, a range interposed between a line joining plots representing maximum values of ψ and a broken line joining plots representing minimum values of ψ is the range that satisfies the above-described condition.

Figure 38B:
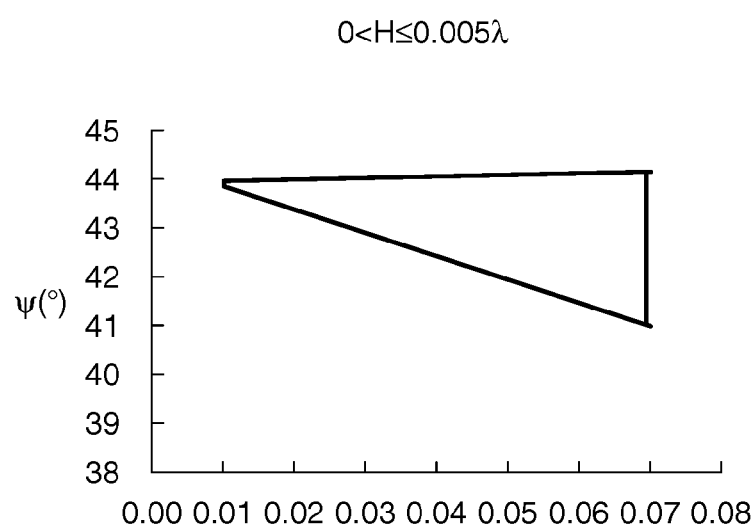

When the range of a solid line and a broken line shown in FIG. 38A is approximated as a polygon for the depth G of the grooves set in the range of 0.01≤G≤0.0695λ, it can be represented as FIG. 38B, and accordingly, it can be stated that β satisfies the above-described condition in a range corresponding to the inner side of the polygon denoted by solid lines in FIG. 38B. When the range of the polygon represented in FIG. 38B is represented by an approximate equation, it can be represented as Equations (14) and (15).

$$\psi \leq 3.0 \times G/\lambda + 43.92, \text{ wherein } 0.0100\lambda \leq G \leq 0.0695\lambda \quad (14)$$

$$\psi \geq -48.0 \times G/\lambda + 44.35, \text{ wherein } 0.0100\lambda \leq G \leq 0.0695\lambda \quad (15)$$

Figure 39A:
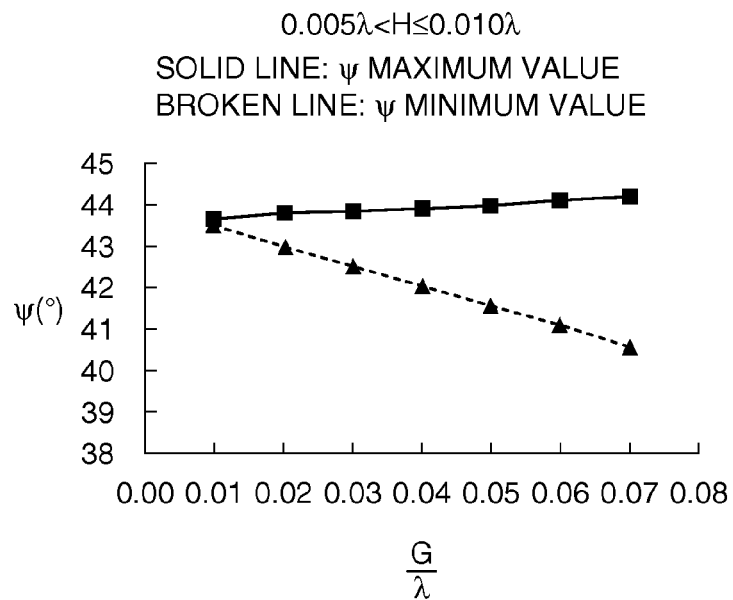
FIGS. 39A and 39B are graphs showing the ranges of ψ satisfying the condition of $|\beta|\leq 0.01$ (ppm/° C.$^2$) in a case where the film thickness of the electrode is in the range of $0.005\lambda<H\leq 0.010\lambda$.

FIG. 39A is a graph illustrating the range of ψ satisfying the condition of |β|≤0.01 in a case where the film thickness H of the electrode is set as 0.005λ<H≤0.010λ. Here, a range interposed between a line joining plots representing maximum values of ψ and a broken line joining plots representing minimum values of ψ is the range that satisfies the above-described condition.

Figure 39B:
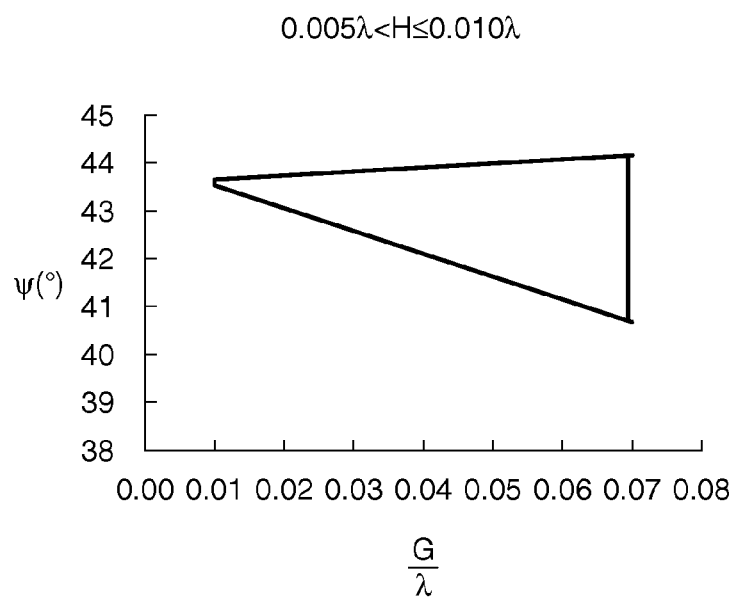

When the range of a solid line and a broken line shown in FIG. 39A is approximated as a polygon for the depth G of the grooves set in the range of 0.01λ≤G≤0.0695λ, it can be represented as FIG. 39B, and accordingly, it can be stated that β satisfies the above-described condition in a range corresponding to the inner side of the polygon denoted by solid lines in FIG. 39B. When the range of the polygon represented in FIG. 39B is represented by approximate equations, it can be represented as Equations (16) and (17).

$$\psi \leq 8.0 \times G/\lambda + 43.60, \text{ wherein } 0.0100\lambda \leq G \leq 0.0695\lambda \quad (16)$$

$$\psi \geq -48.0 \times G/\lambda + 44.00, \text{ wherein } 0.0100\lambda \leq G \leq 0.0695\lambda \quad (17)$$

Figure 40A:
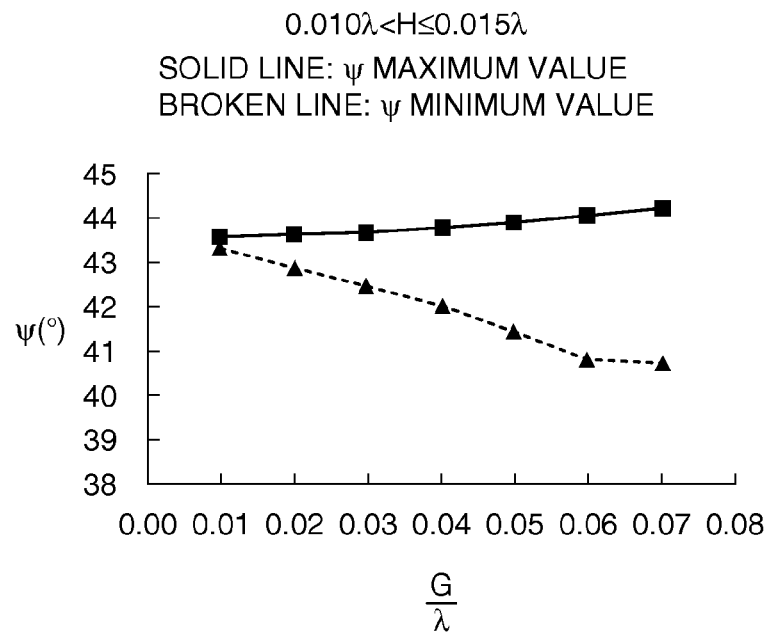
FIGS. 40A and 40B are graphs showing the ranges of ψ satisfying the condition of $|\beta|\leq 0.01$ (ppm/° C.$^2$) in a case where the film thickness of the electrode is in the range of $0.010\lambda<H\leq 0.015\lambda$.

FIG. 40A is a graph illustrating the range of ψ satisfying the condition of |β|≤0.01 in a case where the film thickness H of the electrode is set as 0.010λ<H≤0.015λ. Here, a range interposed between a line joining plots representing maximum values of ψ and a broken line joining plots representing minimum values of ψ is the range that satisfies the above-described condition.

Figure 40B:
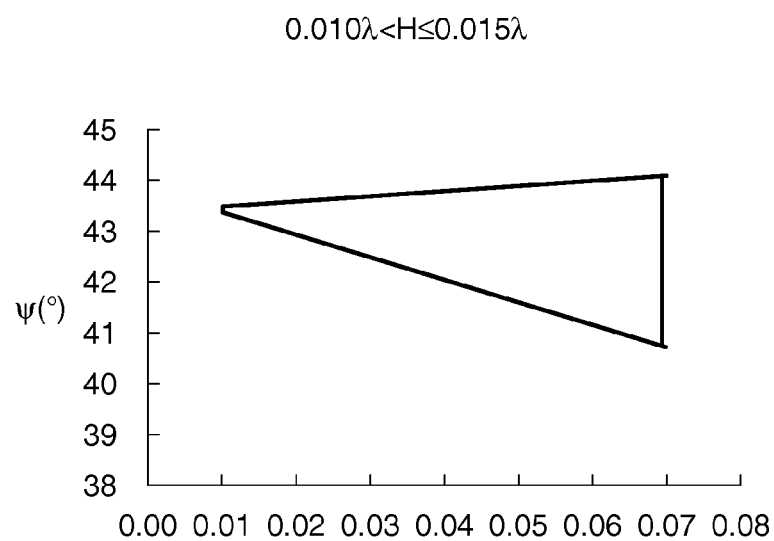

When the range of a solid line and a broken line shown in FIG. 40A is approximated as a polygon for the depth G of the grooves set in the range of 0.01λ≤G≤0.0695λ, it can be represented as FIG. 40B, and accordingly, it can be stated that β satisfies the above-described condition in a range corresponding to the inner side of the polygon denoted by solid lines in FIG. 40B. When the range of the polygon represented in FIG. 40B is represented by approximate equations, it can be represented as Equations (18) and (19).

$$\psi \leq 10.0 \times G/\lambda + 43.40, \text{ wherein } 0.0100\lambda \leq G \leq 0.0695\lambda \quad (18)$$

$$\psi \geq -44.0 \times G/\lambda + 43.80, \text{ wherein } 0.0100\lambda \leq G \leq 0.0695\lambda \quad (19)$$

Figure 41A:
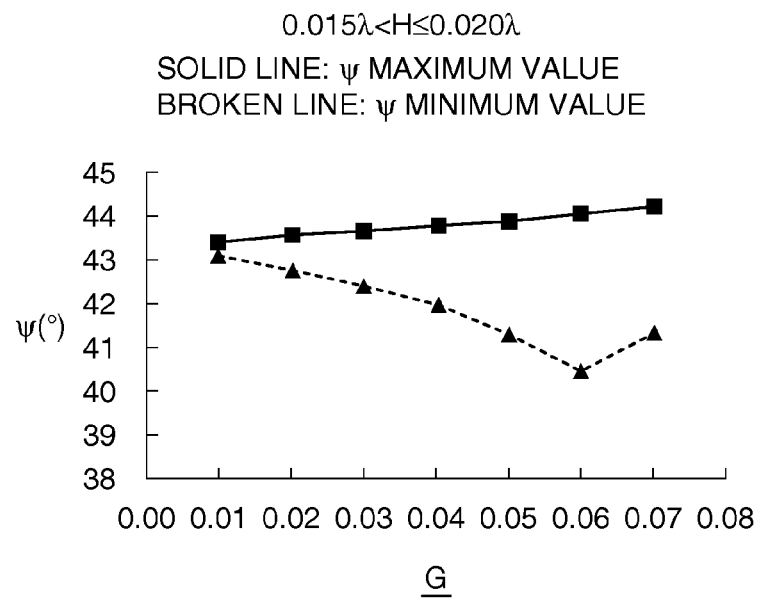
FIGS. 41A and 41B are graphs showing the ranges of ψ satisfying the condition of $|\beta|\leq 0.01$ (ppm/° C.$^2$) in a case where the film thickness of the electrode is in the range of $0.015\lambda<H\leq 0.020\lambda$.

FIG. 41A is a graph illustrating the range of ψ satisfying the condition of |β|0.01 in a case where the film thickness H of the electrode is set as 0.015λ<H≤0.020λ. Here, a range interposed between a line joining plots representing maximum values of ψ and a broken line joining plots representing minimum values of ψ is the range that satisfies the above-described condition.

Figure 41B:
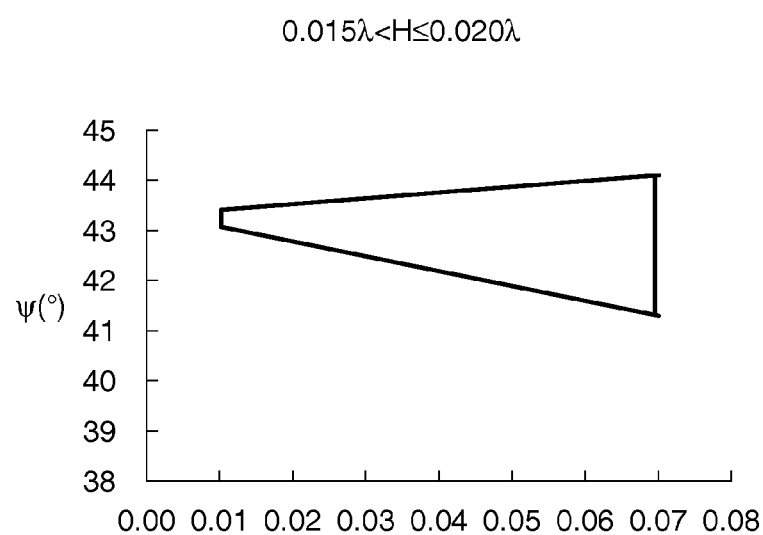

When the range of a solid line and a broken line shown in FIG. 41A is approximated as a polygon for the depth G of the grooves set in the range of 0.01λ≤G≤0.0695λ, it can be represented as FIG. 41B, and accordingly, it can be stated that β satisfies the above-described condition in a range corresponding to the inner side of the polygon denoted by solid lines in FIG. 41B. When the range of the polygon represented in FIG. 41B is represented by approximate equations, it can be represented as Equations (20) and (21).

$$\psi \leq 12.0 \times G/\lambda + 43.31, \text{ wherein } 0.0100\lambda \leq G \leq 0.0695\lambda \quad (20)$$

$$\psi \geq -30.0 \times G/\lambda + 44.40, \text{ wherein } 0.0100\lambda \leq G \leq 0.0695\lambda \quad (21)$$

Figure 42A:
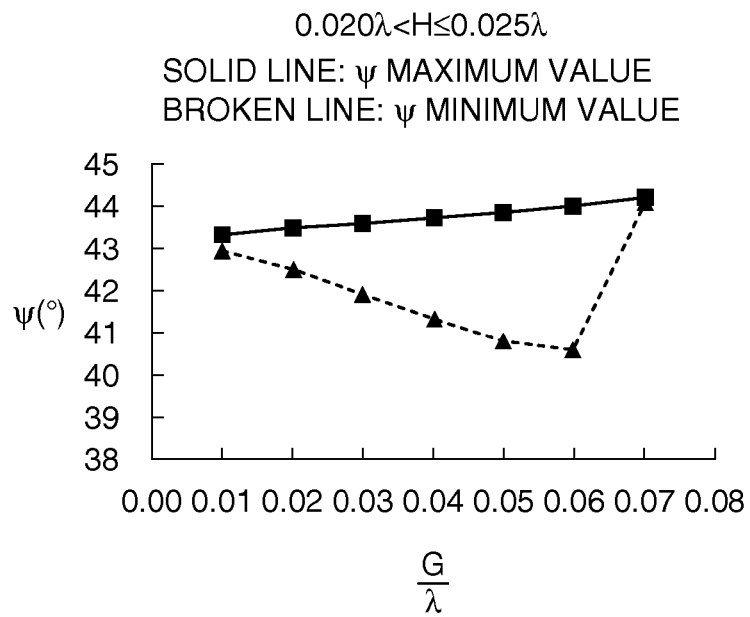
FIGS. 42A and 42B are graphs showing the ranges of ψ satisfying the condition of $|\beta|\leq 0.01$ (ppm/° C.$^2$) in a case where the film thickness of the electrode is in the range of $0.020\lambda<H\leq 0.025\lambda$.
Figure 42B:
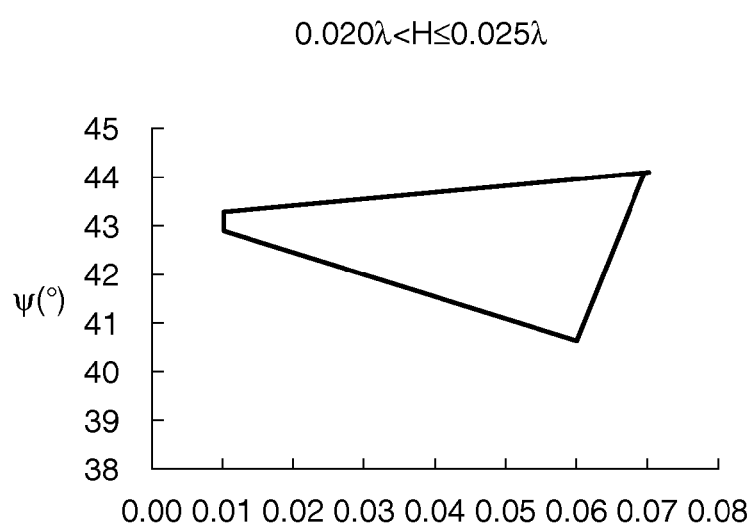

FIGS. 42A and 42B are graphs illustrating the ranges of ψ satisfying the condition of |β|0.01 in a case where the film thickness H of the electrode is set as 0.020λ<H≤0.025λ. Here, a range interposed between a line joining plots representing maximum values of ψ and a broken line joining plots representing minimum values of ψ is the range that satisfies the above-described condition.

When the range of a solid line and broken lines shown in FIG. 42A is approximated as a polygon for the depth G of the grooves set in the range of 0.01λ≤G≤0.0695λ, it can be represented as FIG. 42B, and accordingly, it can be stated that β satisfies the above-described condition in a range corresponding to the inner side of the polygon denoted by solid lines in FIG. 42B. When the range of the polygon represented in FIG. 42B is represented by approximate equations, it can be represented as Equations (22) to (24).

$$\psi \leq 14.0 \times G/\lambda + 43.16, \text{ wherein } 0.0100\lambda \leq G \leq 0.0695\lambda \quad (22)$$

$$\psi \geq -45.0 \times G/\lambda + 43.35, \text{ wherein } 0.0100\lambda \leq G \leq 0.0600\lambda \quad (23)$$

$$\psi \geq 367.368 \times G/\lambda + 18.608, \text{ wherein } 0.0600\lambda \leq G \leq 0.0695\lambda \quad (24)$$

Figure 43A:
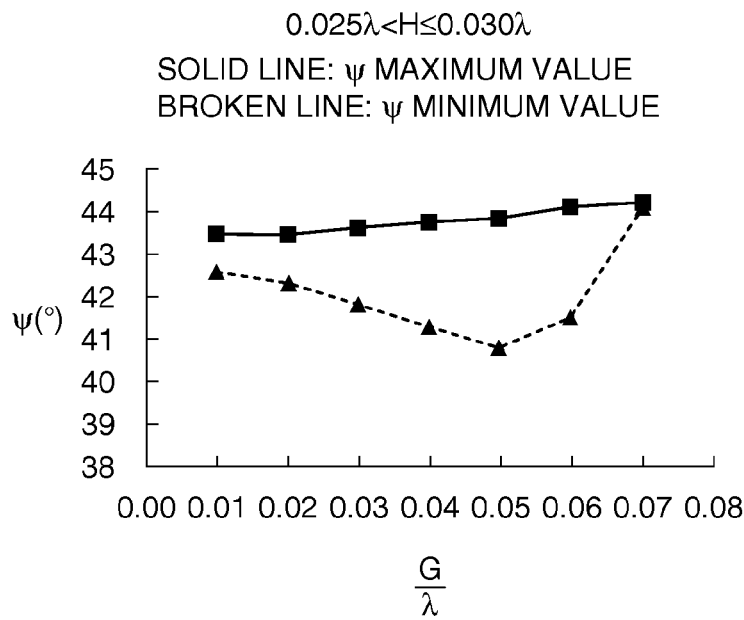
FIGS. 43A and 43B are graphs showing the ranges of ψ satisfying the condition of |β|≤0.01 (ppm/° C.$^2$) in a case where the film thickness of the electrode is in the range of 0.025x<H≤0.030λ.

FIG. 43A is a graph illustrating the range of ψ satisfying the condition of |β|0.01 in a case where the film thickness H of the electrode is set as 0.025λ<H≤0.030λ. Here, a range interposed between a line joining plots representing maximum values of ψ and a broken line joining plots representing minimum values of ψ is the range that satisfies the above-described condition.

Figure 43B:
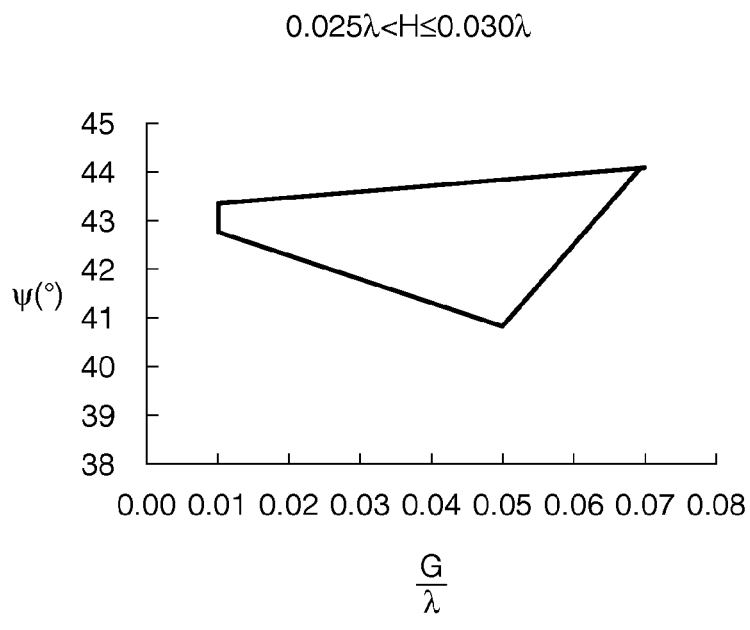

When the range of a solid line and a broken line shown in FIG. 43A is approximated as a polygon for the depth G of the grooves set in the range of 0.01λ≤G≤0.0695λ, it can be represented as FIG. 43B, and accordingly, it can be stated that β satisfies the above-described condition in a range corresponding to the inner side of the polygon denoted by solid lines in FIG. 43B. When the range of the polygon represented in FIG. 43B is represented by approximate equations, it can be represented as Equations (25) to (27).

$$\psi \leq 12.0 \times G/\lambda + 43.25, \text{ wherein } 0.0100\lambda \leq G \leq 0.0695\lambda \quad (25)$$

$$\psi \geq -50.0 \times G/\lambda + 43.32, \text{ wherein } 0.0100\lambda \leq G \leq 0.0500\lambda \quad (26)$$

$$\psi \geq 167.692 \times G/\lambda + 32.435, \text{ wherein } 0.0500\lambda \leq G \leq 0.0695\lambda \quad (27)$$

Figure 44A:
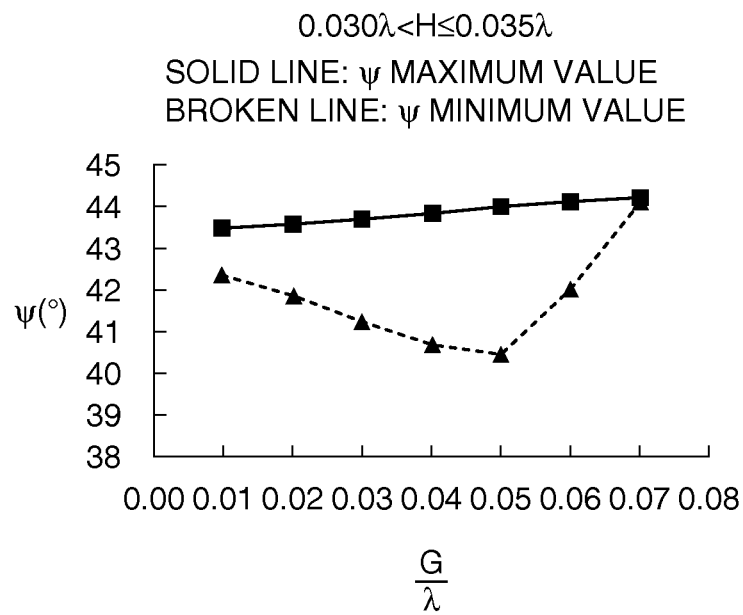
FIGS. 44A and 44B are graphs showing the ranges of ψ satisfying the condition of |β|≤0.01 (ppm/° C.$^2$) in a case where the film thickness of the electrode is in the range of 0.030λ<H≤0.035λ.

FIG. 44A is a graph illustrating the range of ψ satisfying the condition of |β|0.01 in a case where the film thickness H of the electrode is set as 0.030λ<H≤0.035λ. Here, a range interposed between a line joining plots representing maximum values of ψ and broken lines joining plots representing minimum values of ψ is the range that satisfies the above-described condition.

Figure 44B:
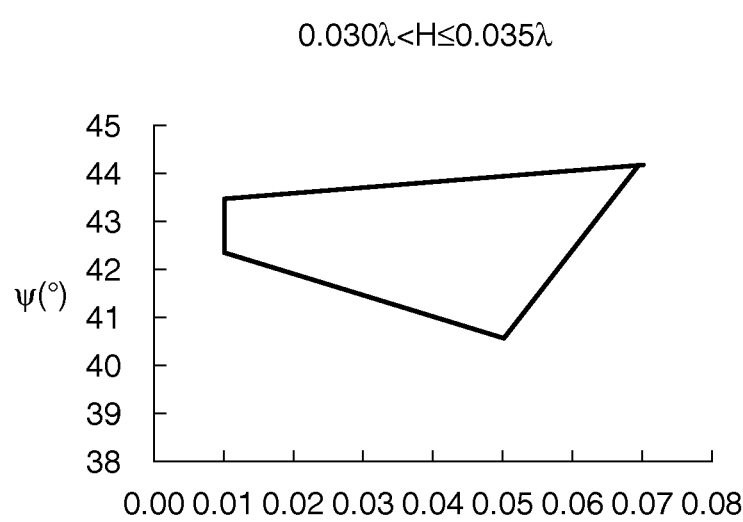

When the range of a solid line and broken lines shown in FIG. 44A is approximated as a polygon for the depth G of the grooves set in the range of 0.01λ≤G≤0.0695λ, it can be represented as FIG. 44B, and accordingly, it can be stated that β satisfies the above-described condition in a range corresponding to the inner side of the polygon denoted by solid lines in FIG. 44B. When the range of the polygon represented in FIG. 44B is represented by approximate equations, it can be represented as Equations (28) to (30).

$$\psi \leq 12.0 \times G/\lambda + 43.35, \text{ wherein } 0.0100\lambda \leq G \leq 0.0695\lambda \quad (28)$$

$$\psi \geq -45.0 \times G/\lambda + 42.80, \text{ wherein } 0.0100\lambda \leq G \leq 0.0500\lambda \quad (29)$$

$$\psi \geq 186.667 \times G/\lambda + 31.217, \text{ wherein } 0.0500\lambda \leq G \leq 0.0695\lambda \quad (30)$$

Figure 45:
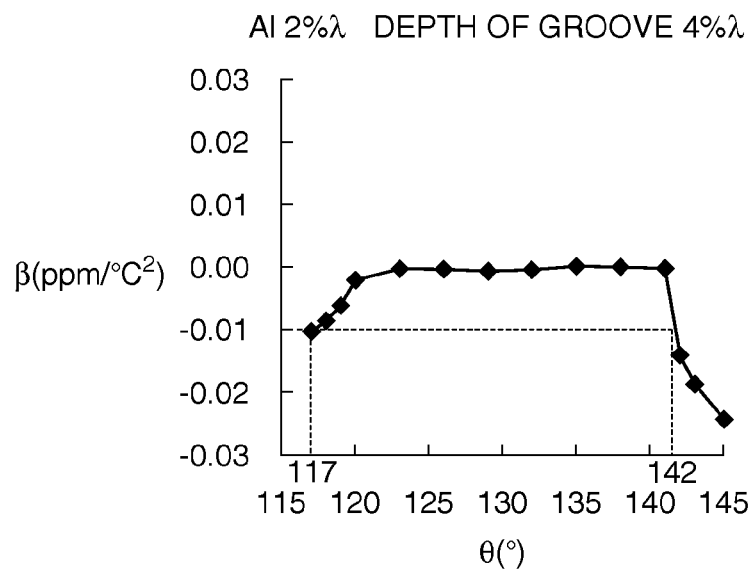
FIG. 45 is a graph showing the relationship between an Euler angle θ and the second-order temperature coefficient in a case where the film thickness of the electrode is 0.02λ and the depth of the inter-electrode finger groove is 0.04λ.

Next, FIG. 45 shows a change in the second-order temperature coefficient β when swing is made by the angle of θ, that is, the relationship between θ and the second-order temperature coefficient β. Here, a SAW device used for the simulation was a quartz crystal substrate in which the cut angle and the propagation direction of the SAW were represented as Euler angles (0, θ, ψ), the depth G of the grooves was 0.04λ, and the film thickness H of the electrode was 0.02λ. In addition, a value at which the absolute value of the second-order temperature coefficient β was minimum within the above-described angle range was selected as ψ based on the set angle of θ. Furthermore, η was set to 0.6383 based on Equation (8) described above.

Under such conditions, from FIG. 45 that represents the relationship between θ and the second-order temperature coefficient β, it can be read that the absolute value of the second-order temperature coefficient β is in the range of 0.01 (ppm/° C.²) in a case where θ is within the range equal to or higher than 117° and equal to or lower than 142°. Accordingly, it can be stated that by following to set θ in the range of 117°≤θ≤142° for the above-described set values, a SAW resonator 10 having good frequency-temperature characteristics can be configured.

Tables 17 to 19 are shown as simulation data for proving the relationship between θ and the second-order temperature coefficient β.

TABLE 17

| H/λ % | G/λ % | θ ° | β ppm/° C.² |
|---|---|---|---|
| 0.01 | 4.00 | 117 | −0.009 |
| 0.01 | 4.00 | 142 | 0.005 |
| 3.50 | 4.00 | 117 | −0.009 |
| 3.50 | 4.00 | 142 | −0.008 |

Table 17 is a table representing the relationship between θ and the second-order temperature coefficient β in a case where the film thickness H of the electrode is changed and represents the values of the second-order temperature coefficient β at threshold values (117° and 142°) of θ in a case where the film thickness H of the electrode is set to 0.01% λ and a case where the film thickness H of the electrode is set to 3.50% λ. In addition, the depth G of the grooves in this simulation is 4% λ. From Table 17, it can be read that, even in a case where the film thickness H of the electrode is changed (0≈0.01% λ or 3.5% λ that is defined as a threshold value of the film thickness of the electrode) in the range of 117°≤θ≤142°, |β|≤0.01 is satisfied regardless of the thickness.

TABLE 18

| H/λ % | G/λ % | θ ° | β ppm/° C.² |
|---|---|---|---|
| 2.00 | 1.00 | 117 | −0.009 |
| 2.00 | 1.00 | 142 | −0.008 |
| 2.00 | 6.95 | 117 | −0.009 |
| 2.00 | 6.95 | 142 | −0.009 |

Table 18 is a table representing the relationship between θ and the second-order temperature coefficient β in a case where the depth G of the grooves is changed and represents the values of the second-order temperature coefficient β at threshold values (117° and 142°) of θ in a case where the depth G of the grooves is set to 1.00% λ and 6.95% λ. In addition, the film thickness H of the electrode in this simulation is 2.00% λ. From Table 18, it can be read that, even in a case where the depth G of the grooves is changed (1.00% λ or 6.95% λ that is defined as a threshold value of the depth G of the grooves) in the range of 117°≤θ≤142°, |β|≤0.01 is satisfied regardless of the depth.

TABLE 19

| H/λ % | G/λ % | η | θ ° | β ppm/° C.² |
|---|---|---|---|---|
| 2.00 | 4.00 | 0.62 | 117 | −0.010 |
| 2.00 | 4.00 | 0.62 | 142 | −0.003 |
| 2.00 | 4.00 | 0.76 | 117 | −0.009 |
| 2.00 | 4.00 | 0.76 | 142 | −0.009 |

Table 19 is a table representing the relationship between θ and the second-order temperature coefficient β in a case where the line occupancy ratio η is changed and represents the values of the second-order temperature coefficient β at threshold values (117° and 142°) of θ in a case where the line occupancy ratio η is set to 0.62 and 0.76. In addition, the film thickness H of the electrode in this simulation is 2.00% λ, and the depth G of the grooves is 4.00% λ. From Table 19, it can be read that, even in a case where the line occupancy ratio η is changed (η=0.62 and 0.76 are a minimum value and a maximum value of η in a case where the depth of the grooves is set to 4% λ in FIG. 31A representing the relationship between the line occupancy ratio η (η1) and the depth G of the grooves in the range of 0.020λ to 0.025λ of the film thickness H of the electrode) in the range of 117°≤θ≤142°, |β|≤0.01 is satisfied regardless of the value.

Figure 46:
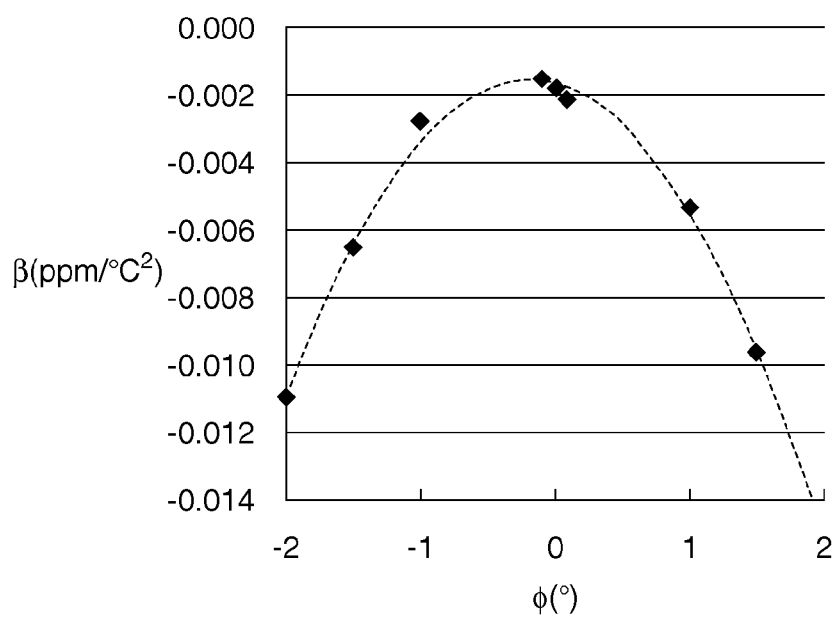
FIG. 46 is a graph showing the relationship between a Euler angle φ and the second-order temperature coefficient.

FIG. 46 is a graph that represents the relationship between the angle of φ and the second-order temperature coefficient β in a case where a quartz crystal substrate 30 represented by Euler angles (φ, 123°, 43.77°) is used, the depth G of the grooves is set to 0.04λ, the film thickness H of the electrode is set to 0.02λ, and the line occupancy ratio η is set to 0.65.

From FIG. 46, although the second-order temperature coefficient β is less than −0.01 in a case where φ is −2° or +2°, it can be read that the absolute value of the second-order temperature coefficient β is reliably within the range of 0.01 in a case where φ is in the range of −1.5° to +1.5°. Accordingly, by following to set φ in the range of −1.5°≤φ≤+1.5° for the above-described set values or by more preferably setting φ in the range of −1°≤φ≤+1°, a SAW resonator 10 having good frequency-temperature characteristics can be configured.

Figure 47:
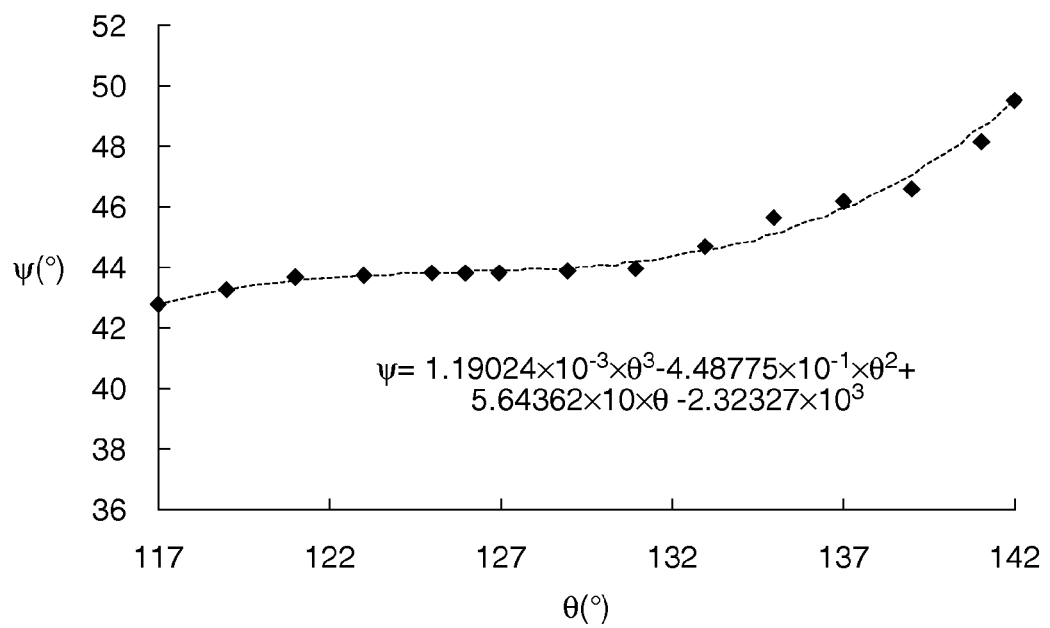
FIG. 47 is a graph showing the relationship between the Euler angle θ and the Euler angle ψ at which the frequency-temperature characteristics are good.

In the description presented above, the optimal ranges of φ, θ, and ψ are derived in relation with the depth G of the grooves under a fixed condition. In contrast to this, FIG. 47 shows a desirable relationship between θ and ψ at which the amount of change is minimum in the frequency for the range of −40° C. to +85° C., and approximate equations thereof are acquired. As shown in FIG. 47, the angle of ψ changes in accordance with the increase in the angle of θ so as to rise for drawing a third-order curve. In addition, in the example shown in FIG. 47, ψ in a case where θ=117° is 42.79°, and ψ in a case where θ=142° is 49.57°. In a case where such plots are represented as an approximate curve, a curve denoted by a broken line in FIG. 47 is formed, and Equation (31) can be represented as an approximate equation.

$$\psi = 1.19024 \times 10^{-3} \times \theta^3 - 4.48775 \times 10^{-1} \times \theta^2 + 5.64362 \times 10^1 \times \theta - 2.32327 \times 10^3 \pm 1.0 \quad (31)$$

Accordingly, ψ can be determined by determining θ, and the range of ψ in a case where the range of θ is 117°≤θ≤142° can be set as 42.79°≤ψ≤49.57°. In addition, the depth G of the grooves and the film thickness H of the electrode in this simulation are G=0.04λ and H=0.02λ.

For the same reasons as described above, by configuring a SAW resonator 10 based on various set conditions of this embodiment, a SAW resonator 10 that can realize good frequency-temperature characteristics satisfying a target value can be achieved.

Figure 54:
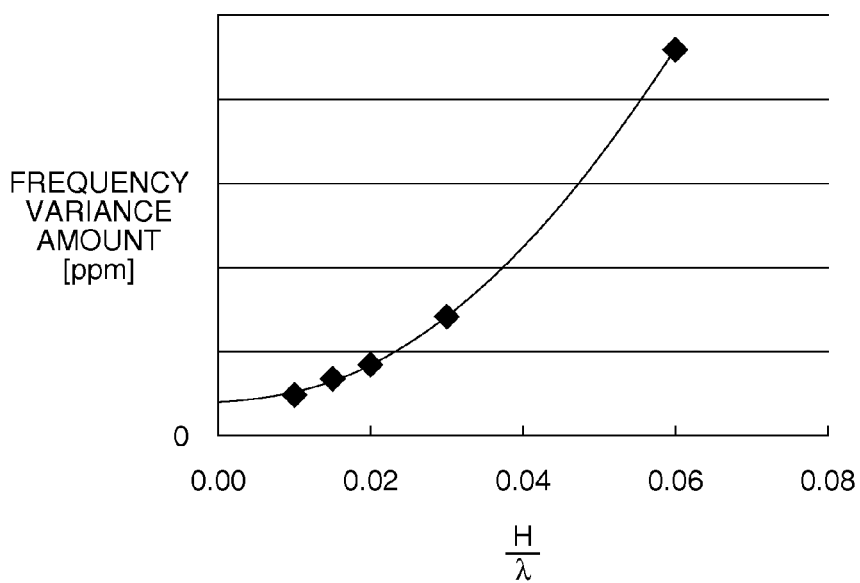
FIG. 54 is a graph showing the relationship between the film thickness of the electrode and the frequency variance in a heat-cycle test.

In addition, according to the SAW resonator 10 of this embodiment, as represented in Equation (7) and FIGS. 15A to 26F, the film thickness H of the electrode film is set in the range of 0<H≤0.035λ, and the frequency-temperature characteristics are improved thereon. Differently from a general technology of improving the frequency-temperature characteristics by forming the film thickness H to be extremely thick, improvement of the frequency-temperature characteristics is realized while the environment-resistant characteristics being maintained. FIG. 54 represents the relationship between the film thickness of the electrode (the film thickness of the Al electrode) and the variation in the frequency in a heat-cycle test. The result of the heat-cycle test shown in FIG. 54 is acquired after repeating one cycle eight times in which the SAW resonator is exposed for 30 minutes under the ambience of −55° C., then the ambient temperature is raised up to +125° C., and the SAW resonator is exposed for 30 minutes. From FIG. 54, the film thickness H of the electrode is 0.06λ, and, in the range of the film thickness H of the electrode of the SAW resonator 10 according to this embodiment, it can be read that the frequency variation (F variation) is equal to or less than ⅓ of a case where grooves between the electrode fingers are not arranged. Here, in any plot shown in FIG. 54, H+G=0.06λ.

In addition, a high-temperature test was performed in which the SAW resonator manufactured under the same conditions as those represented in FIG. 54 was left for 1000 hours at the ambience of 125° C., and it was checked that the amount of variation of the SAW resonator according to this embodiment (four conditions of H=0.03λ and G=0.03λ, H=0.02λ and G=0.04λ, H=0.015λ and G=0.045λ, and H=0.01λ and G=0.05×) in the frequency before and after the test was equal to or less than ⅓ of that of a general SAW resonator (H=0.06λ and G=0).

Figure 48:
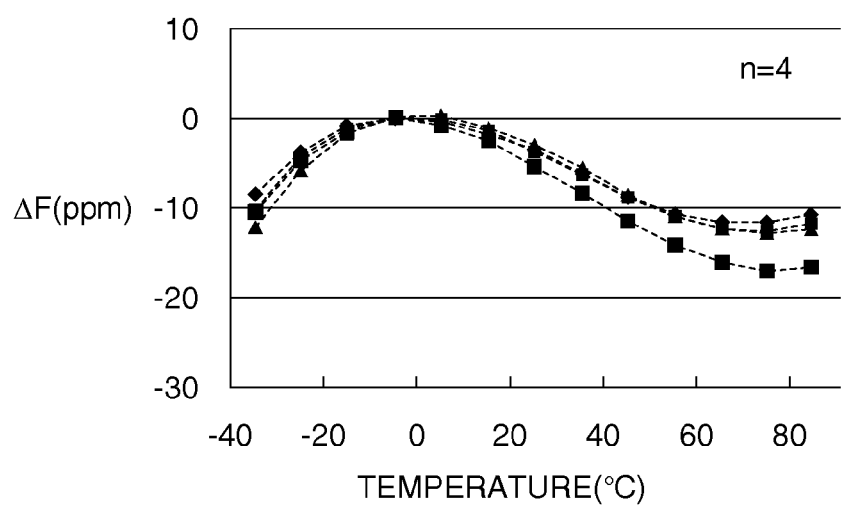
FIG. 48 is a diagram showing an example of the frequency-temperature characteristic data for four test pieces under the condition at which the frequency-temperature characteristics are the best.

Under the above-described conditions, a SAW resonator 10 manufactured under the conditions in which H+G=0.067λ (the aluminum film thickness is 2000 Å, the depth of the groove is 4700 Å), the line occupancy ratio of the IDT ηi=0.6, the line occupancy ratio of the reflector ηr=0.8, Euler angles are (0°, 123°, 43.5°), the number of IDTs is 120, the intersection width is 40λ (λ=10 µm), the number of the reflectors (near one side) is 72 (36), and there is no inclination angle of the electrode fingers (the direction of arrangement of the electrode fingers and the direction of the phase velocity of the SAW coincide with each other) has the frequency-temperature characteristics as shown in FIG. 48.

FIG. 48 is acquired by plotting the frequency-temperature characteristics in a case where the number of test pieces n=4. From FIG. 48, it can be read that the amount ΔF of variation in the frequency in the operating temperature range of the test pieces is suppressed to be equal to or less than about 20 ppm.

Figures 49, 50:
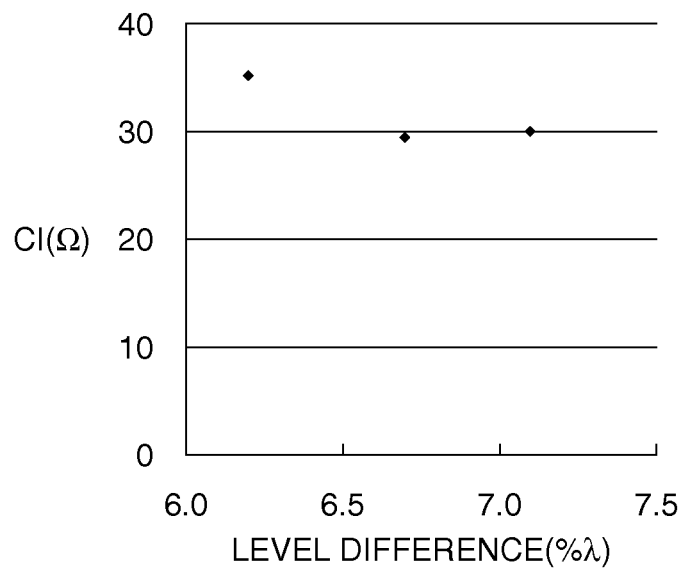
FIG. 49 is a graph showing the relationship between a level difference, which is a sum of the depth of the inter-electrode finger groove and the film thickness of the electrode and a CI value.
FIG. 50 is a table showing an example of an equivalent circuit constant and static characteristics of a SAW resonator according to this embodiment.

In this embodiment, the influence of the depth G of the grooves, the film thickness H of the electrode, and the like on the frequency-temperature characteristics has been described. A depth (level difference) acquired by combining the depth G of the grooves and the film thickness H of the electrode has influences also on the static characteristics such as an equivalent circuit constant and a CI value and the Q value. For example, FIG. 49 is a graph showing the relationship between the level difference and the CI value in a case where the level difference is changed from 0.062λ to 0.071λ. From FIG. 49, it can be read that the CI value converges when the level difference is 0.067λ and is not improved (is not lowered) in a case where the level difference is increased therefrom.

The frequency, the equivalent circuit constant, and the static characteristics of the SAW resonator 10 that represents the frequency-temperature characteristics as shown in FIG. 48 are organized in FIG. 50. Here, F is a frequency, Q is a Q value, γ is a capacitance ratio, the CI is a CI (Crystal Impedance) value, and M is a performance index (Figure of Merit).

Figure 52:
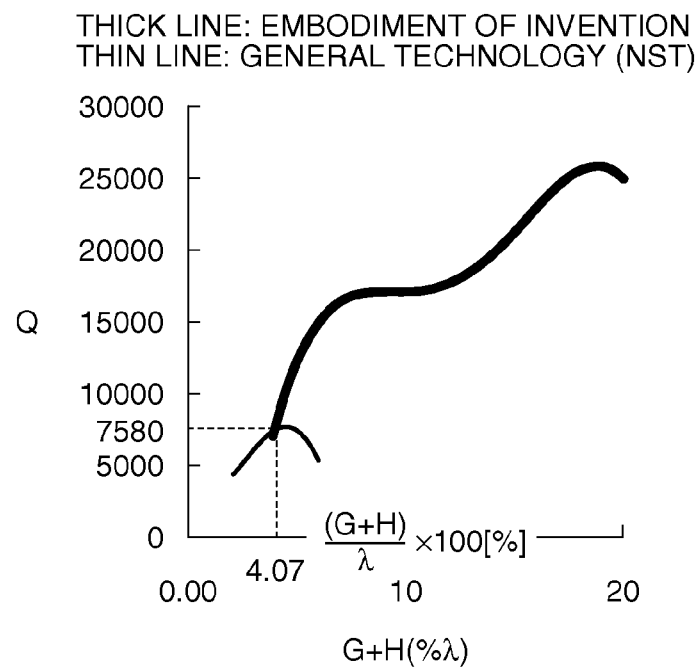
FIG. 52 is a graph for comparing the relationship between the level difference and the Q value of a general SAW resonator and the relationship between the level difference and the Q value of a SAW resonator according to this embodiment.

In addition, FIG. 52 shows a graph used for comparing the relationship between a level difference and a Q value in a general SAW resonator and the SAW resonator 10 according to this embodiment. In FIG. 52, a graph denoted by a thick line represents the characteristics of the SAW resonator 10 according to this embodiment, in which the grooves are arranged between electrode fingers, and the resonance of the stop band upper end mode is used. In addition, a graph denoted by a thin line represents the characteristics of a general SAW resonator, in which grooves are not arranged between the electrode fingers, and the resonance of the stop band upper end mode is used. As is apparent from FIG. 52, by arranging the grooves between the electrode fingers and using the resonance of the stop band upper end mode, in the range in which the level difference (G+H) is equal to or larger than 0.0407λ (4.07% λ), a Q value higher than that of a case where the resonance of the stop band lower end mode is used without arranging grooves between the electrode fingers can be acquired.

Basic data of the SAW resonator relating to the simulation is as below.

Basic Data of SAW Resonator 10 according to This Embodiment

H: 0.02λ
G: changing
IDT Line Occupancy ratio ηi: 0.6
Reflector Line Occupancy ratio ηr: 0.8
Euler Angles (0°, 123°, 43.5°)

Number: 120
Intersection Width: 40λ (λ=10 μm)
Number of Reflectors (near one side): 60
Inclination Angle of Electrode Fingers: None
Basic Data of General SAW Resonator
  H: changing
  G: zero
  IDT Line Occupancy ratio ηi: 0.4
  Reflector Line Occupancy ratio ηr: 0.3
  Euler Angles (0°, 123°, 43.5°)
  Number: 120
  Intersection Width: 40λ (λ=10 μm)
  Number of Reflectors (near one side): 60
  Inclination Angle of Electrode Fingers: None When FIGS. 50 and 52 are referred to so as to compare the characteristics of the SAW resonators, it can be understood how much the Q value of the SAW resonator 10 according to this embodiment becomes higher. It is thought that the increase in the Q value is based on the improvement of the effect of energy confinement, and the reason is as follows.

Figure 53:
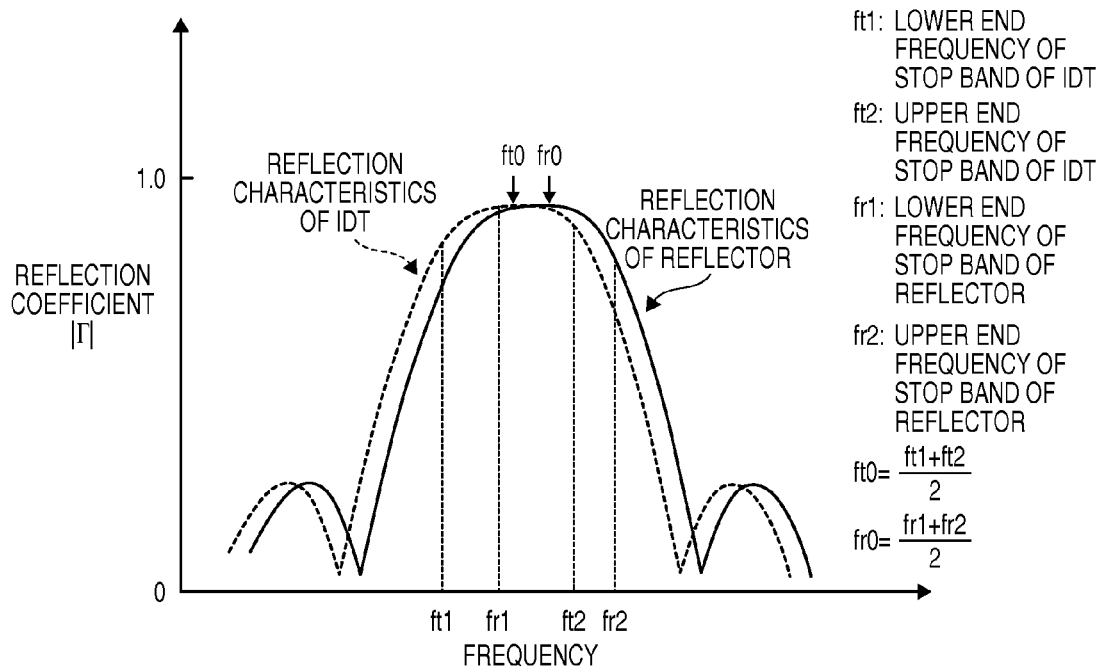
FIG. 53 is a diagram showing the SAW reflection characteristics of an IDT and a reflector.

In order to efficiently perform energy confinement of the surface acoustic wave excited by the stop band upper end mode, as shown in FIG. 53, the upper end frequency ft2 of the stop band of the IDT 12 is set between the lower end frequency fr1 of the stop band of the reflector 20 and the upper end frequency fr2 of the stop band of the reflector 20. In other words, it may be set so as to satisfy the following relationship.

$$fr1 < ft2 < fr2 \qquad (32)$$

Accordingly, the reflection coefficient Γ of the reflector 20 increases for the upper end frequency ft2 of the stop band of the IDT 12, and the SAW of the stop band upper end mode that is excited from the IDT 12 is reflected from the reflector 20 to the IDT 12 side with a high reflection coefficient. Then, the confinement of the energy of the SAW of the stop band upper end mode becomes stronger, and a resonator having low loss can be realized.

In contrast to this, in a case where the relationship among the upper end frequency ft2 of the stop band of the IDT 12 and the lower end frequency fr1 of the stop band of the reflector 20, and the upper end frequency fr2 of the stop band of the reflector 20 is set as "ft2<fr1" or "fr2<ft2", the reflection coefficient Γ of the reflector 20 for the upper end frequency ft2 of the stop band of the IDT 12 decreases, and it is difficult to realize a state of strong energy confinement.

Here, in order to realize the state represented in Equation (32), the stop band of the reflector 20 needs to be shifted to the higher frequency zone side than the stop band of the IDT 12. In particular, it can be implemented by setting the period of the arrangement of the conductive strips 22 of the reflector 20 to be shorter than that of the electrode fingers 18 of the IDT 12.

In addition, the implementation of a high Q value can be achieved by setting the depth of the groove between the conductive strips 22 of the reflector 20 to be larger than that of the grooves between the electrode fingers of the IDT 12 or setting the film thickness of the conductive strip 22 of the reflector 20 to be larger than that of the electrode fingers 18 of the IDT 12.

Figure 59:
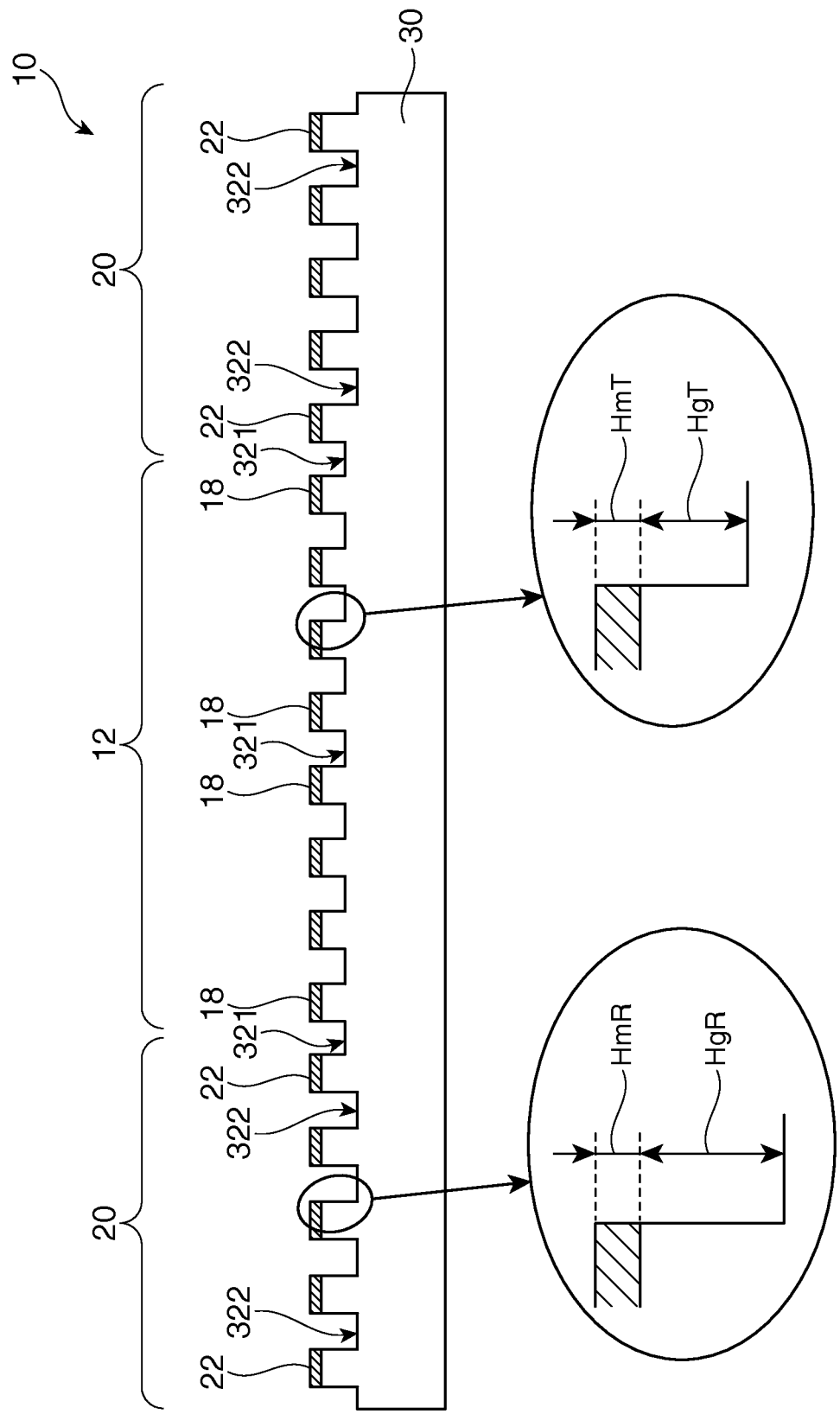
FIG. 59 is a diagram showing another configuration example of a SAW device according to an embodiment and is a diagram showing a partially enlarged cross-section.
Figure 60:
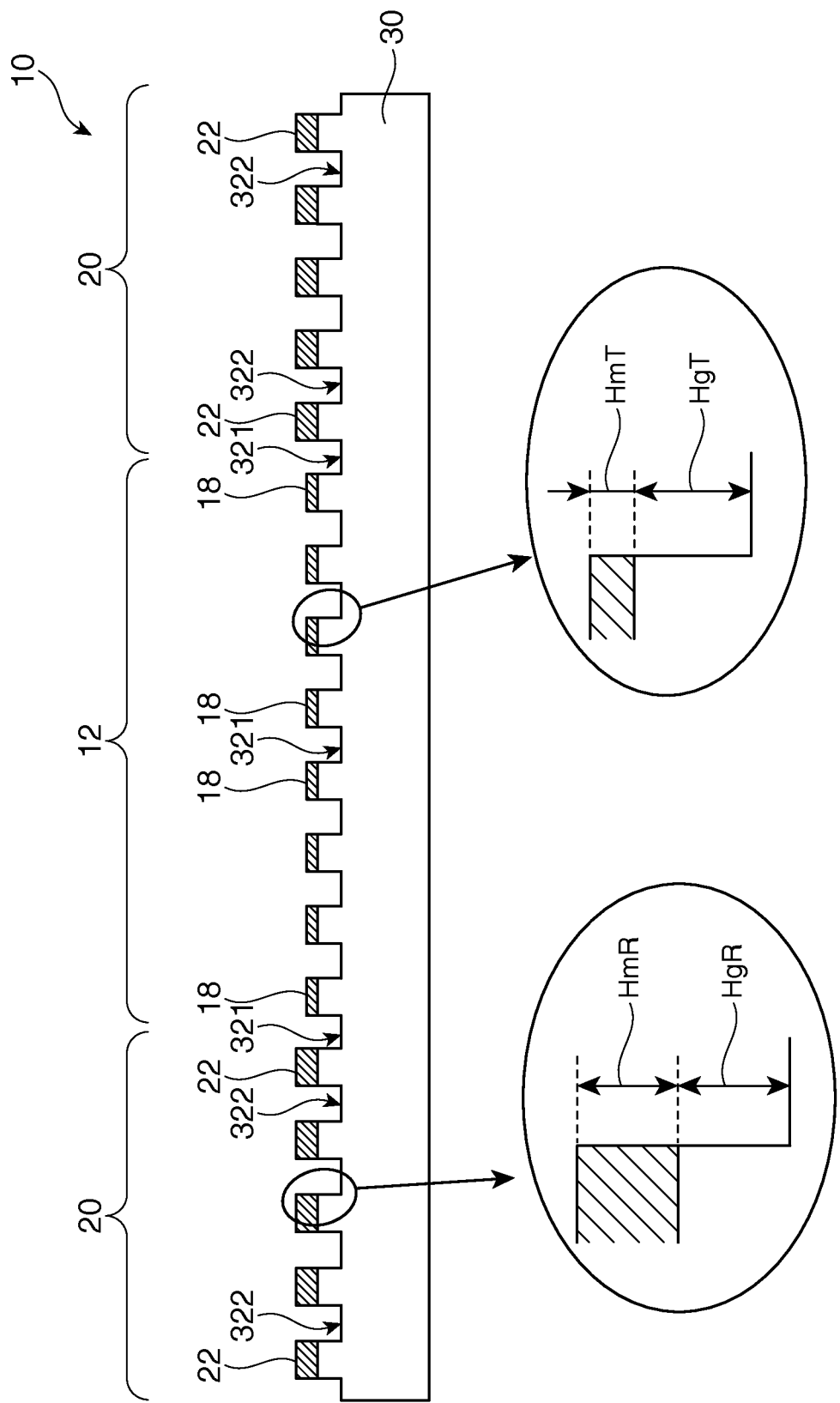
FIG. 60 is a diagram showing further another configuration example of a SAW device according to an embodiment and is a diagram showing a partially enlarged cross-section.

FIGS. 59 and 60 are diagrams showing other configuration examples of a SAW device according to an embodiment of the invention and are diagrams representing partially enlarged cross-sections.

In the SAW resonator 10 shown in FIG. 59, the film thickness of the conductive strip 22 of the reflector 20 and the film thickness of the electrode finger 18 of the IDT 12 are approximately the same. On the other hand, the depth of the groove 322 arranged between the conductive strips 22 of the reflector 20 is larger than the depth of the groove 321 arranged between the electrode fingers 18 of the IDT 12. Accordingly, the reflection characteristics of the reflector 20 are improved, and the electromechanical coupling coefficient of the IDT 12 is improved. As a result, the improvement of the Q value of the SAW resonator 10 and the reduction of the CI value can be achieved together with a high degree.

Here, the film thickness of the conductive strip 22 of the reflector 20 is denoted by $H_{mR}$, the depth of the groove 322 arranged between the conductive strips 22 is denoted by $H_{gR}$, the film thickness of the electrode finger 18 of the IDT 12 is denoted by $H_{mT}$, and the depth of the groove 321 arranged between the electrode fingers 18 is denoted by $H_{gT}$. In addition, since the film thickness of the electrode finger 18, in consideration of the function thereof, can be regarded as a length (distance) from the bottom of the adjacent groove 321 to the surface of the electrode finger 18, a value that is acquired by dividing a sum of the film thickness $H_{mT}$ of the electrode finger 18 and the depth $H_{gT}$ of the groove 321 by the wavelength λ of the surface acoustic wave is defined as an "effective film thickness $H_T/\lambda$" of the electrode finger 18. Similarly, since the film thickness of the conductive strip 22, in consideration of the function thereof, can be regarded as a length (distance) from the bottom of the adjacent groove 322 to the surface of the conductive strip 22, a value that is acquired by dividing a sum of the film thickness $H_{mR}$ of the conductive strip 22 and the depth $H_{gR}$ of the groove 322 by the wavelength λ of the surface acoustic wave is defined as an "effective film thickness $H_R/\lambda$" of the conductive strip 22.

At this time, the SAW resonator 10 shown in FIG. 59 is configured so as to satisfy the relationship of Equation (33).

$$H_T/\lambda < H_R/\lambda \qquad (33)$$

As the SAW resonator 10 satisfies the above-described relationship, the effective film thickness $H_R$ of the conductive strip 22 increases, and the reflection characteristics of the reflector 20 is improved. Accordingly, the energy confinement effect of the SAW of the stop band upper end mode becomes more remarkable, whereby the Q value is further improved. In addition, since the effective film thickness $H_T$ of the electrode finger 18 of the IDT 12 relatively decreases, the electromechanical coupling coefficient of the IDT 12 can be increased, whereby the CI value can be further decreased.

Furthermore, in the SAW resonator 10 shown in FIG. 59, as described above, the film thickness $H_{mR}$ of the conductive strip 22 of the reflector 20 and the film thickness $H_{mT}$ of the electrode finger 18 of the IDT 12 are approximately the same ($H_{mT}/\lambda = H_{mR}/\lambda$). Accordingly, in order to satisfy Equation (33) described above, the relationship represented in Equation (34) needs to be formed between the depth $H_{gR}$ of the groove 322 arranged between the conductive strips 22 and the depth $H_{gT}$ of the groove 321 arranged between the electrode fingers 18.

$$H_{gT}/\lambda < H_{gR}/\lambda \qquad (34)$$

On the other hand, although the SAW resonator 10 shown in FIG. 60 also satisfies the relationship represented in Equation (33) described above, the configuration thereof is slightly different from that shown in FIG. 59.

In the SAW resonator 10 shown in FIG. 60, the depth $H_{gR}$ of the groove 322 arranged between the conductive strips 22 and the depth $H_{gT}$ of the groove 321 arranged between the electrode finger 18 is approximately the same ($H_{gT}/\lambda = H_{gR}/\lambda$). Accordingly, in order to satisfy Equation (33) described above, the relationship represented in Equation (35) needs to be formed between the film thickness $H_{mR}$ of the conductive strip 22 of the reflector 20 and the film thickness $H_{mT}$ of the electrode finger 18 of the IDT 12.

$$H_{mT}/\lambda < H_{mR}/\lambda \tag{35}$$

Also for the SAW resonator 10 shown in any of FIGS. 59 and 60, implementation of a high Q value and implementation of low CI value can be achieved together.

In addition, in the case of the SAW resonator 10 shown in FIG. 59, since the film thicknesses of the conductive strip 22 and the electrode finger 18 are the same, the manufacturing can be easily performed by forming a conductive film having a single film thickness when the conductive strip 22 and the electrode finger 18 are formed.

On the other hand, in the case of the SAW resonator 10 shown in FIG. 60, since the depths of the groove 322 and the groove 321 are the same, the manufacturing can be easily performed by performing an etching process with one type of conditions, for example, when the grooves 322 and the grooves 321 are formed by using an etching method or the like. Here, the number of the conductive strips 22 of the reflector 20 is not particularly limited. For example, the number of the conductive strips 22 is preferably in the range of about 10 to 500 and is more preferably in the range of about 20 to 400.

In addition, it is preferable that the film thicknesses $H_{mR}$ of a plurality of the conductive strips 22 arranged in the reflector 20 are about equal. This similarly applies to the film thicknesses $H_{mT}$ of a plurality of the electrode fingers 18, the depths $H_{gR}$ of a plurality of the grooves 322, and the depths $H_{gT}$ of a plurality of the grooves 321. In order to satisfy Equation (33) described above, a SAW resonator 10 in which $H_{mT}/\lambda > H_{mR}/\lambda$, and the relationship of $H_{gT}/\lambda < H_{gR}/\lambda$ is strong enough to reverse the magnitude relationship of $H_{mT}/\lambda > H_{mR}/\lambda$ may be configured. Similarly, a SAW resonator 10 in which $H_{gT}/\lambda > H_{gR}/\lambda$, and the relationship of $H_{mT}/\lambda < H_{mR}/\lambda$ is strong enough to reverse the magnitude relationship of $H_{gT}/\lambda > H_{gR}/\lambda$ may be configured.

Figure 51:
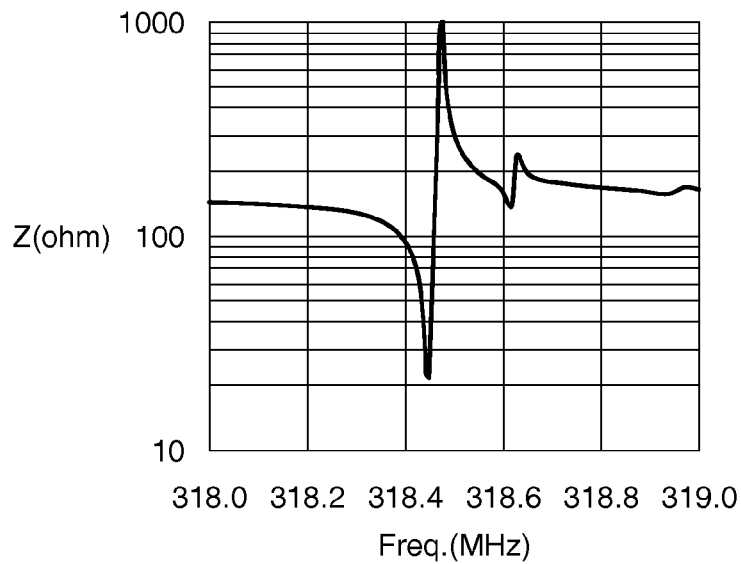
FIG. 51 is impedance curve data of a SAW resonator according to this embodiment.

Furthermore, according to the FIG. 50, it can be stated that high figure of merit M is acquired in addition to the implementation of a high Q value. FIG. 51 is a graph showing the relationship between the impedance Z of the SAW resonator, from which data shown in FIG. 50 is acquired, and the frequency. From FIG. 51, it can be read that there is no useless spurious near the resonant point.

In this embodiment, the IDT 12 configuring the SAW resonator 10 is illustrated such that all the electrode fingers thereof intersect in an alternating manner. However, the SAW resonator 10 according to an embodiment of the invention can have considerable advantages through the quartz crystal substrate only. Accordingly, even in a case where the electrode fingers 18 of the IDT 12 are thinned out, the same advantages can be acquired.

In addition, the groove 32 may be partially arranged between the electrode fingers 18 or between the conductive strips 22 of the reflector 20. Particularly, since the center portion of the IDT 12 in which the vibration displacement is high has dominant influence on the frequency-temperature characteristics, a structure may be employed in which the groove 32 is arranged only at the above-described center portion. Even by employing such a structure, a SAW resonator 10 having good frequency-temperature characteristics can be configured.

In the above-described embodiment, as the material of the electrode film, Al or an alloy using Al as its main constituent is described to be used. However, the electrode film may be configured by using another metal material, as long as the metal material for which the same advantages as those of the above-described embodiment are acquired.

In addition, although the above-described embodiment is a one-terminal pair SAW resonator in which only one IDT is arranged, an embodiment of the invention can be applied to a two-terminal pair SAW resonator in which a plurality of the IDTs is arranged and can be applied as well to a dual mode SAW filter of a vertically-coupled type or a side-coupled type or a multiple mode SAW filter.

Figure 61A:
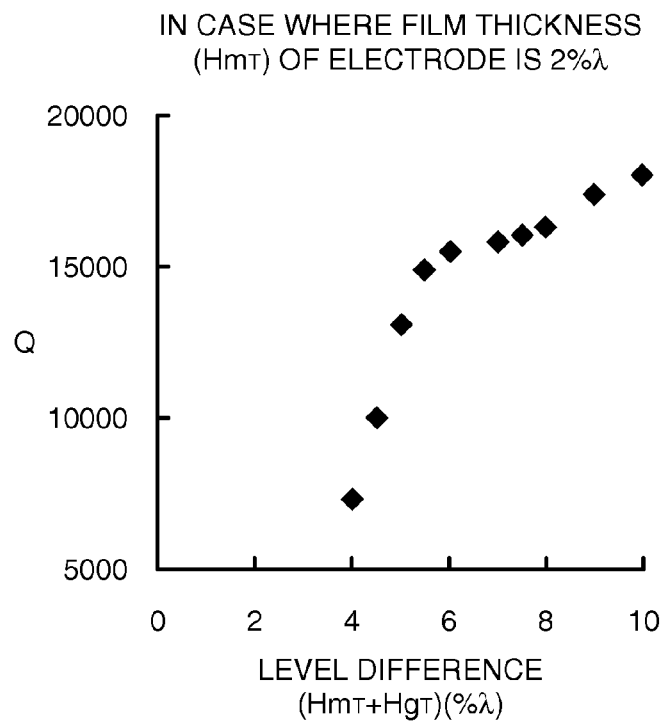
FIG. 61A represents the effective film thickness of an electrode finger of the IDT in the horizontal axis and the Q value in the vertical axis and is a graph representing the trend of change in the Q value when the effective film thickness is changed.
Figure 61B:
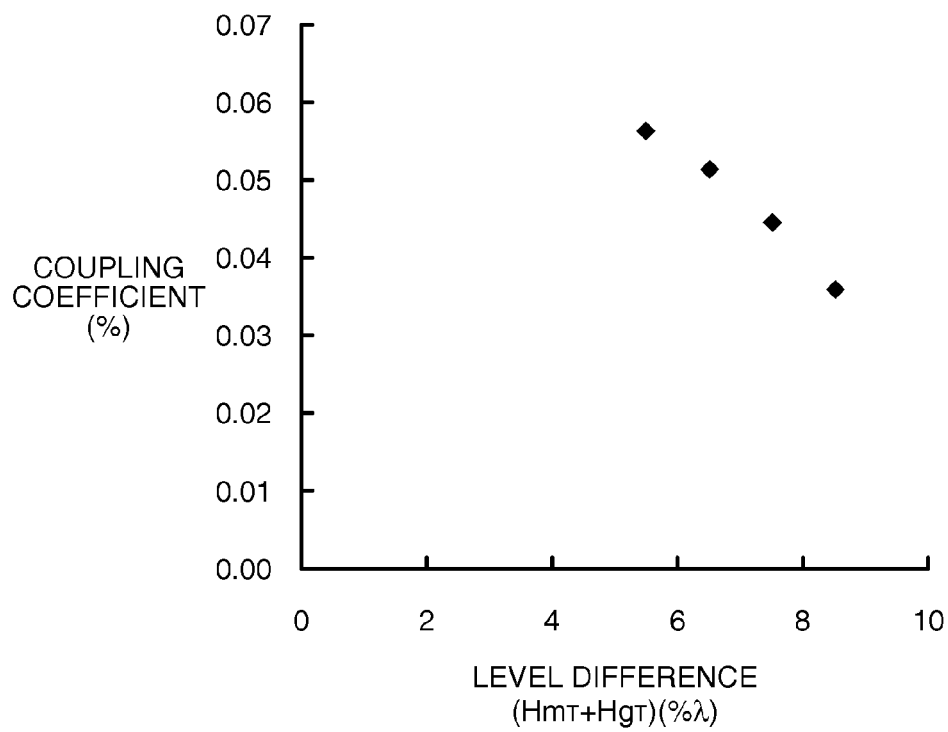
FIG. 61B represents the effective film thickness in the horizontal axis and the electromechanical coupling coefficient in the vertical axis and is a graph representing the trend of change in the electromechanical coupling coefficient when the effective film thickness is changed.

FIG. 61A represents the level difference ($H_{mT}+H_{gT}$) of the electrode finger 18 of the IDT 12 in the horizontal axis and the Q value in the vertical axis and is a graph representing the trend of change in the Q value when the effective film thickness $H_T$ is changed. FIG. 61B represents the level difference ($H_{mT}+H_{gT}$) in the horizontal axis and the electromechanical coupling coefficient in the vertical axis and is a graph representing the trend of change in the electromechanical coupling coefficient when the effective film thickness $H_T$ is changed.

As is apparent from FIGS. 61A and 61B, in the SAW resonator 10, although the Q value increases in accordance with the increase in the effective film thickness $H_T$, relatively the electromechanical coupling coefficient decreases, whereby the CI value increases.

Thus, by configuring the SAW resonator 10 so as to satisfy Equation (33) described above, the effective thin film $H_T$ is appropriately decreased, and the implementation of a high Q value and the implementation of a low CI value can be achieved together with a high degree.

In the example of FIGS. 61A and 61B, for example, when the effective film thickness $H_T$ of the electrode finger 18 is suppressed to be 5.5%, the Q value is high as about 15000, and the electromechanical coupling coefficient is increased by about 0.056%, and it can be read that the implementation of a high Q value and the implementation of a low CI value can be achieved together.

Second Embodiment

Next, a surface acoustic wave resonator according to a second embodiment of the invention will be described.

Figure 62:
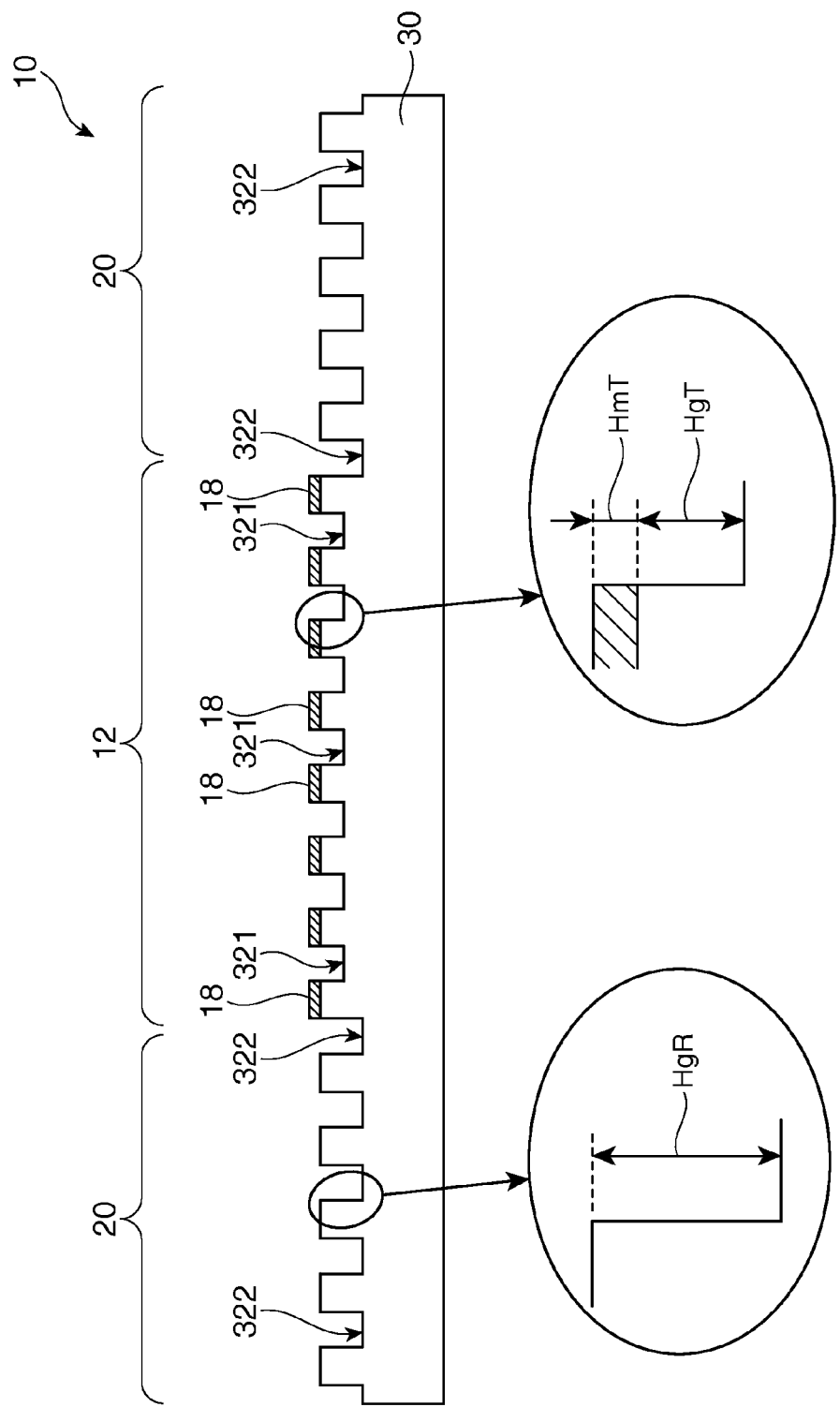
FIG. 62 is a diagram illustrating a SAW device according to a second embodiment and is a diagram showing a partially enlarged cross-section.

FIG. 62 is a diagram showing a SAW device according to the second embodiment of the invention and is a diagram representing a partially enlarged cross-section.

Hereinafter, the second embodiment will be described, and a difference between the first and second embodiments will be focused, and the description of similar configurations will be omitted.

The SAW resonator 10 shown in FIG. 62 is similar to the SAW resonator 10 shown in FIG. 59 except that the conductive strip of the reflector (reflection unit) 20 is omitted. In other words, the reflector 20 of the SAW resonator 10 shown in FIG. 62 is configured by a plurality of grooves 322 that are formed by depressing the surface of a quartz crystal substrate 30. According to this embodiment, since the formation of the conductive strip in the reflector 20 is omitted, the manufacturing of the reflector 20 can be easily performed. In addition, the characteristic variation of the reflector 20 that is accompanied with the formation of the conductive strip can be suppressed.

Here, the depth $H_{gR}$ of the groove 322, the film thickness $H_{mT}$ of the electrode finger 18 of the IDT 12, and the depth $H_{gT}$ of the groove 321 arranged between the electrode fingers 18 satisfy the following relationship.

When a value that is acquired by dividing a sum of the film thickness $H_{mT}$ of the electrode finger 18 and the depth $H_{gT}$ of the groove 321 by the wavelength λ of the surface acoustic wave is defined as an "effective film thickness $H_T/\lambda$" of the electrode finger 18, the SAW resonator 10 shown in FIG. 62 is configured so as to satisfy the relationship represented in Equation (36).

$$H_T/\lambda < H_{gR}/\lambda \tag{36}$$

As the SAW resonator 10 satisfies the above-described relationship, although the conductive strip is omitted, the reflection characteristics of the reflector 20 are improved, and the energy confinement effect of the SAW of the stop band upper end mode becomes more remarkable, whereby the Q value is further improved. In addition, since the effective film thickness $H_T$ of the electrode finger 18 of the IDT 12 relatively decreases, the electromechanical coupling coefficient of the IDT 12 can be increased, whereby the CI value can be further decreased.

According to the SAW resonator 10 of this embodiment, the same operations and advantages as those of the SAW resonator 10 of the first embodiment are acquired.

Figure 63:
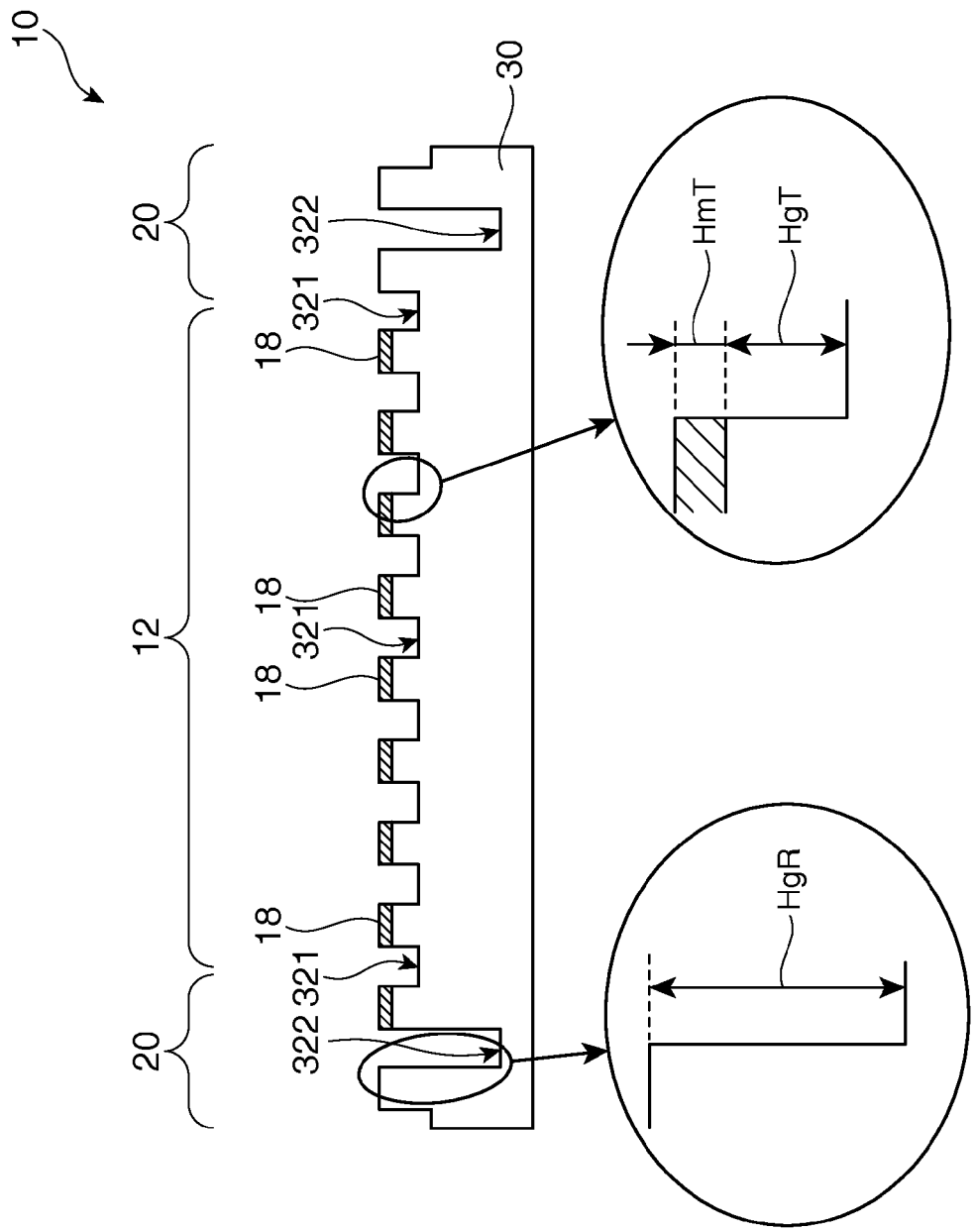
FIG. 63 is a diagram showing another configuration example of the SAW resonator shown in FIG. 62.

FIG. 63 is a diagram showing another configuration example of the SAW resonator 10 shown in FIG. 62.

The SAW resonator 10 shown in FIG. 63 has one groove 322, and the depth of the groove 322 is deeper than that shown in FIG. 62. Although there is only one groove 322 having such a sufficient depth, the same reflection characteristics as those of a plurality of the grooves 322 are acquired. Accordingly, it is only needed to manufacture the reflector 20 and form the groove 322 having a large depth, and therefore, the degree of easiness in manufacturing can be remarkably raised.

At this time, the depth $H_{gR}$ of the groove 322 is preferably equal to or larger than 3λ and is more preferably equal to or larger than 6λ. Accordingly, although there is only one groove 322, the reflection characteristics that are necessary and sufficient are acquired.

Third Embodiment

Next, a surface acoustic wave resonator according to a third embodiment of the invention will be described.

Figure 64:
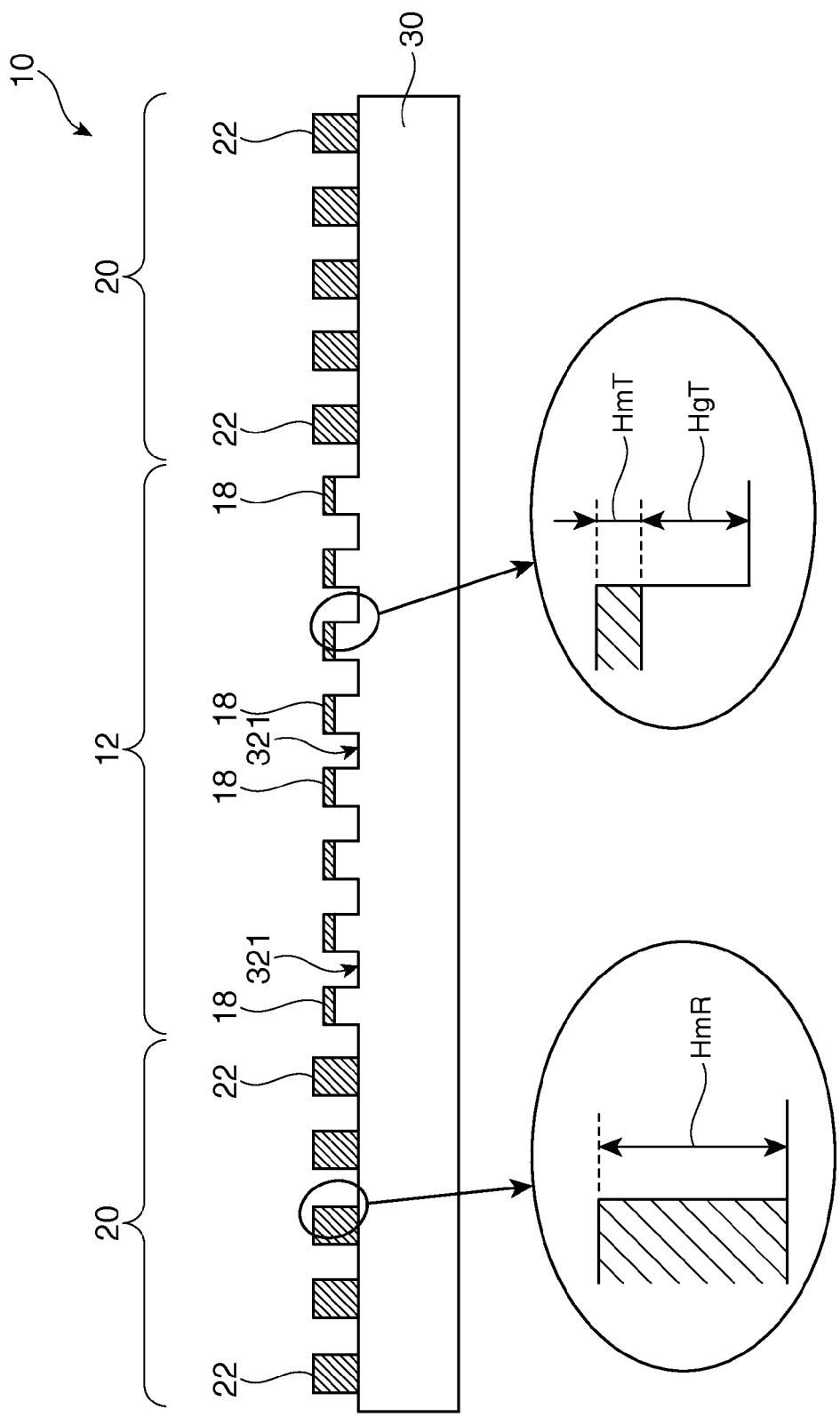
FIG. 64 is a diagram illustrating a SAW device according to a third embodiment and is a diagram showing a partially enlarged cross-section.

FIG. 64 is a diagram showing a SAW device according to the third embodiment of the invention and is a diagram representing a partially enlarged cross-section.

Hereinafter, the third embodiment will be described, and a difference between the first and third embodiments will be focused, and the description of similar configurations will be omitted.

The SAW resonator 10 shown in FIG. 64 is similar to the SAW resonator 10 shown in FIG. 59 except that the groove arranged between the conductive strips 22 of the reflector (reflection unit) 20 is omitted. In other words, the reflector 20 of the SAW resonator 10 shown in FIG. 64 is configured by a plurality of conductive strips 22 formed on the quartz crystal substrate 30. According to this embodiment, since the formation of the groove in the reflector 20 is omitted, the manufacturing of the reflector 20 can be easily performed. In addition, the characteristic variation of the reflector 20 that is accompanied with the formation of the groove can be suppressed.

Here, the film thickness $H_{mR}$ of the conductive strip 22, the film thickness $H_{mT}$ of the electrode finger 18 of the IDT 12, and the depth $H_{gT}$ of the groove 321 arranged between the electrode fingers 18 satisfy the following relationship.

When a value that is acquired by dividing a sum of the film thickness $H_{mT}$ of the electrode finger 18 and the depth $H_{gT}$ of the groove 321 by the wavelength λ of the surface acoustic wave is defined as an "effective film thickness $H_T/\lambda$" of the electrode finger 18, the SAW resonator 10 shown in FIG. 64 is configured so as to satisfy the relationship represented in Equation (37).

$$H_T/\lambda < H_{mR}/\lambda \tag{37}$$

As the SAW resonator 10 satisfies the above-described relationship, although the groove is omitted, the reflection characteristics of the reflector 20 are improved, and the energy confinement effect of the SAW of the stop band upper end mode becomes more remarkable, whereby the Q value is further improved. In addition, since the effective film thickness $H_T$ of the electrode finger 18 of the IDT 12 relatively decreases, the electromechanical coupling coefficient of the IDT 12 can be increased, whereby the CI value can be further decreased.

According to the SAW resonator 10 of this embodiment, the same operations and advantages as those of the SAW resonator 10 of the first embodiment are acquired.

Fourth Embodiment

Next, a surface acoustic wave resonator according to a fourth embodiment of the invention will be described.

Figure 65:
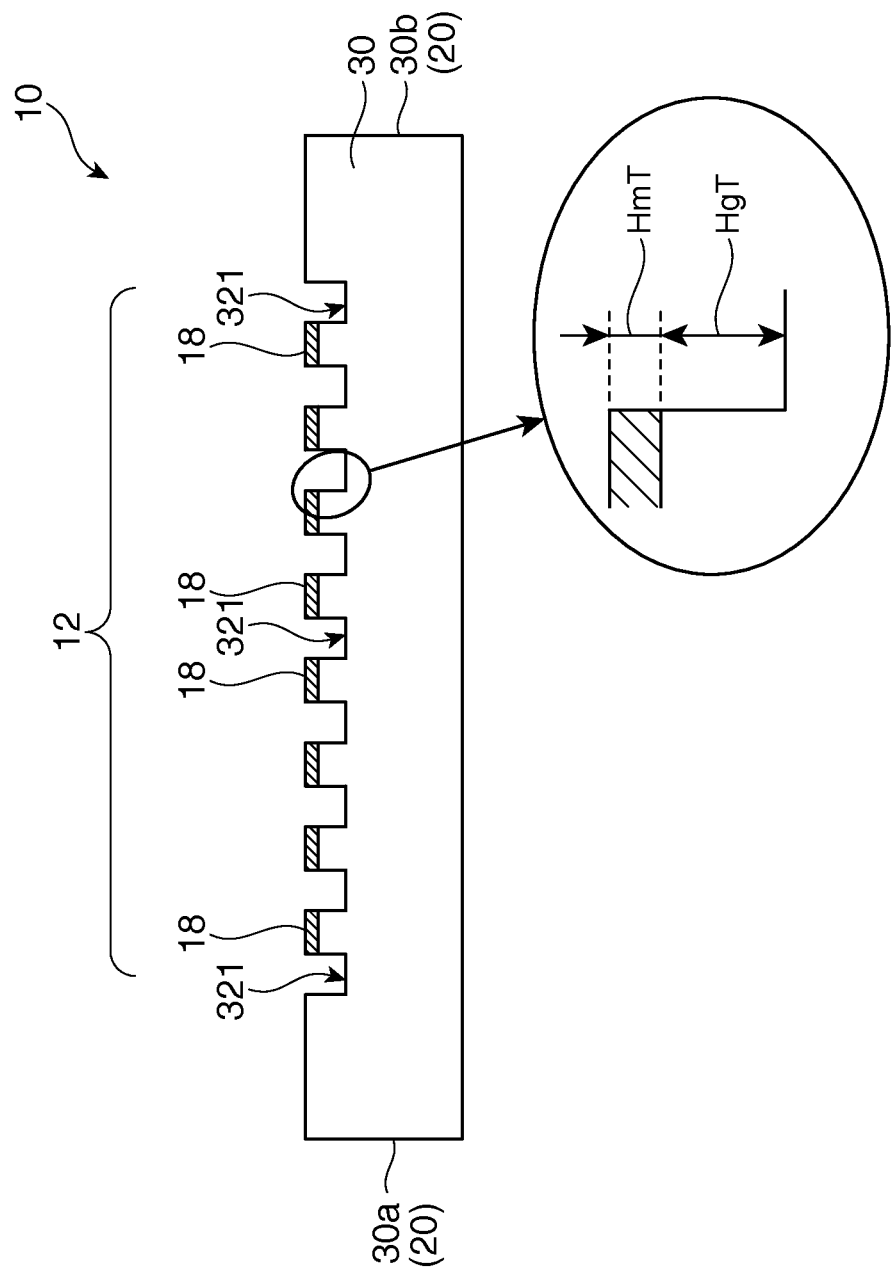
FIG. 65 is a diagram illustrating a SAW device according to a fourth embodiment and is a diagram showing a partially enlarged cross-section.

FIG. 65 is a diagram showing a SAW device according to the fourth embodiment of the invention and is a diagram representing a partially enlarged cross-section.

Hereinafter, the fourth embodiment will be described, and a difference between the first and fourth embodiments will be focused, and the description of similar configurations will be omitted.

The SAW resonator 10 shown in FIG. 65 is similar to the SAW resonator 10 shown in FIG. 59 except that the reflector (reflection unit) 20 is configured by an end surface of the quartz crystal substrate 30. According to this embodiment, since the reflector 20 can be formed by only forming an end surface having a high degree of smoothness in the quartz crystal substrate 30, the manufacturing of the reflector 20 can be more easily performed. In addition, the formation of the groove and the conductive strip is unnecessary, and accordingly, the characteristic variation of the reflector 20 that is accompanied with such formation can be suppressed, and the SAW resonator 10 can be miniaturized.

As shown in FIG. 65, end surfaces 30a and 30b of the quartz crystal substrate 30 are positioned so as to interpose the IDT 12 therebetween, and both end surfaces 30a and 30b are parallel to each other. In addition, both the end surfaces 30a and 30b are configured so as to be parallel to the electrode fingers 18 of the IDT 12.

From the viewpoint of the reflection characteristics, it is preferable that the smoothness of both the end surfaces 30a and 30b is high, and both the end surfaces 30a and 30b are perpendicular to the surface of the quartz crystal substrate 30.

In addition, the separation distance of each of the end surfaces 30a and 30b from the IDT 12 is set in accordance with the wavelength λ of the surface acoustic wave. For example, the separation distance is set so as to be multiples of λ/2 from the center of the electrode finger 18.

Surface Acoustic Oscillator

Figure 55A:
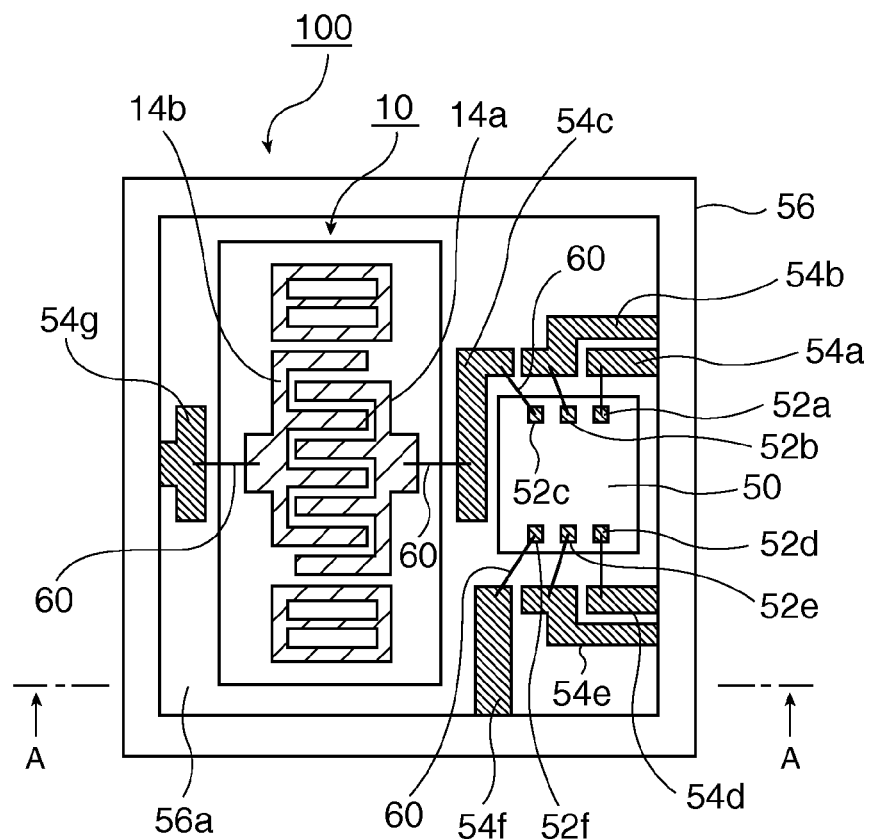
FIGS. 55A and 55B are diagrams showing the configurations of a SAW oscillator according to an embodiment of the invention.
Figure 55B:
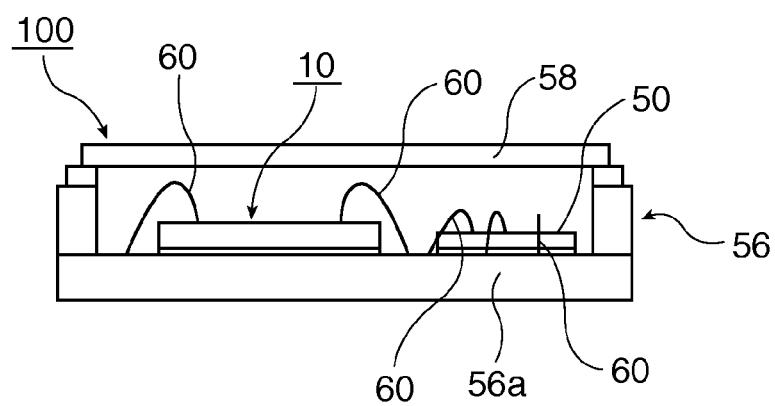

Next, a SAW oscillator according to an embodiment of the invention will be described with reference to FIGS. 55A and 55B. The SAW oscillator according to an embodiment of the invention, as shown in FIGS. 55A and 55B, is configured by the above-described SAW resonator 10, an IC (integrated circuit) 50 that controls the driving by applying a voltage to the IDT 12 of the SAW resonator 10, and a package that houses the above-described components. FIG. 55A is a plan view excluding a lid, and FIG. 55B is a cross-sectional view taken along line A-A shown in FIG. 55A.

In the SAW oscillator 100 according to this embodiment, the SAW resonator 10 and the IC 50 are housed in a same package 56, and electrode patterns 54a to 54g formed on a base plate 56a of the package 56, the inter digital transducers 14a and 14b of the SAW resonator 10, and pads 52a to 52f of the IC 50 are connected through metal wires 60. Then, the cavity of the package 56 in which the SAW resonator 10 and the IC 50 are housed is sealed by a lid 58 with airtightness. By configuring as described above, the IDT 12 (see FIG. 1A), the IC 50, and external mounting electrodes, which are not shown in the figure, formed on the bottom face of the package 56 can be electrically connected.

In addition to the high frequency of a reference clock due to recent high-speed information telecommunication, in accompaniment with the miniaturization of a casing that starts with a blade server, the influence of the internal heat generation increases, and an increase in the operating temperature range and high precision, which are required for an electronic device built inside, are demanded in the market, and furthermore, a stable operation for a long period under an environment from low temperature to high temperature is needed for a wireless base station that is installed outdoor and the like therein. Accordingly, since a SAW oscillator according to an embodiment of the invention has excellent frequency-temperature characteristics in which the amount of variation in the frequency is about 20 (ppm) or less in the operating temperature range (the temperature range for use: −40° C. to +85° C.), the SAW oscillator is preferred in such a market.

Electronic Apparatus

Since a SAW resonator according to an embodiment of the invention or a SAW oscillator including the SAW resonator greatly realizes the enhancement of the frequency-temperature characteristics, it can contribute to the implementation of various sensors (electronic apparatuses) having high reliability, for example, by being applied to a pressure sensor that is disclosed in JP-A-2007-333500, JP-A-2007-93213, and the like, an acceleration sensor that is disclosed in JP-A-2008-286520 and the like, a rotation speed sensor that is disclosed in JP-A-2008-286521 and the like, or the like.

In addition, since a SAW resonator according to an embodiment of the invention or a SAW oscillator including the SAW resonator greatly realizes the enhancement of the frequency-temperature characteristics, it can greatly contribute to the implementation of a product having excellent frequency-temperature characteristics and having superior jitter characteristics and phase-noise characteristics for electronic apparatuses such as a cellular phone, a hard disk, a personal computer, a tuner that receives BS and CS broadcasts, an apparatus that processes a high-frequency signal propagating through a coaxial cable or an optical signal propagating through an optical cable, a server/network device that needs a high-frequency high-precision clock (low jitter and low-phase nose) in a wide temperature range, and a radio communication device, thereby greatly contributing to the improvement of the reliability and the quality of a system.

As described above, since a SAW resonator according to an embodiment of the invention has an inflection point within the operating temperature range (temperature range for use: −40° C. to +85° C.) represented in FIG. 48, the frequency-temperature characteristics of about 20 ppm or less in which the amount of variation in the frequency is extremely small, which is a third-order curve or a curve close to a third-order curve, can be realized.

Figure 56A:
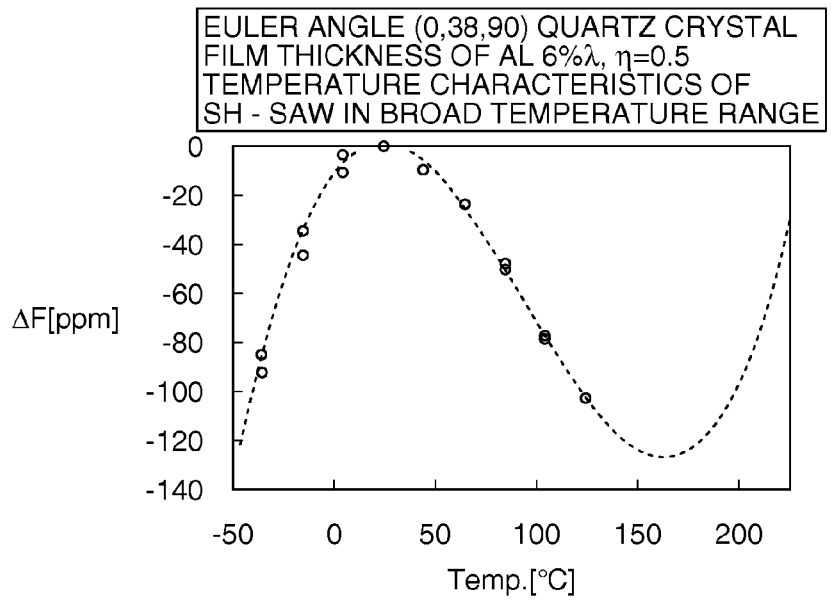
FIGS. 56A and 56B are graphs showing the frequency-temperature characteristics of a SAW resonator.
Figure 56B:
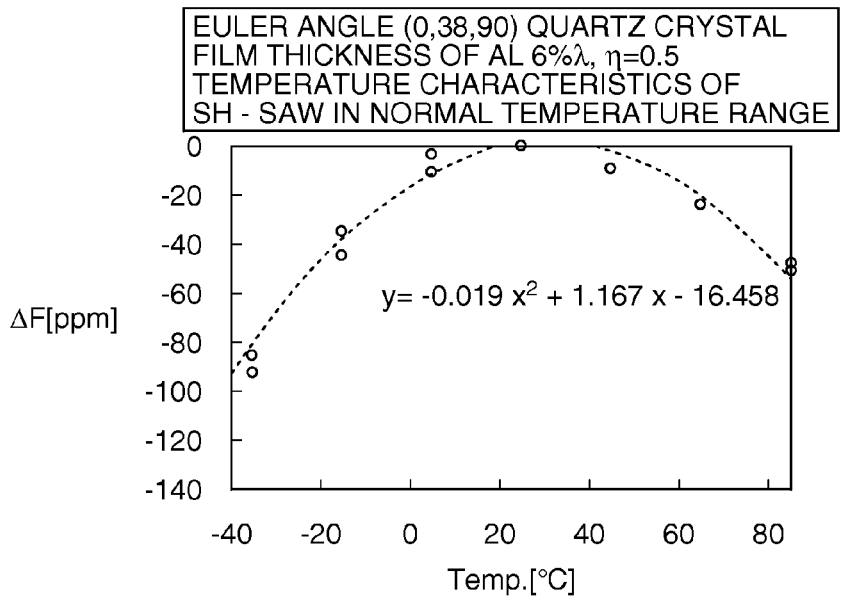

FIG. 56A is a graph showing the frequency-temperature characteristics of a SAW resonator that is disclosed in JP-A-2006-203408. Although the frequency-temperature characteristics represent a third-order curve, as is shown, the inflection point is present in an area exceeding the operating temperature range (temperature range for use: −40° C. to +85° C.). Accordingly, a second-order curve having an apex point of the upward convex as shown in FIG. 56B is substantially formed. Accordingly, the amount of variation in the frequency is 100 (ppm) that is extremely large.

In contrast to this, according to a SAW resonator of an embodiment of the invention, the amount of variation in the frequency corresponds to a third-order curve or a curve close to a third-order curve in the operating temperature range, and accordingly, the amount of variation in the frequency is dramatically decreased. The changes in the amount of variation in the frequency within the operating range in a SAW resonator in which the IDT and the reflector are coated with a coating film are shown in FIGS. 57 and 58.

Figure 57:
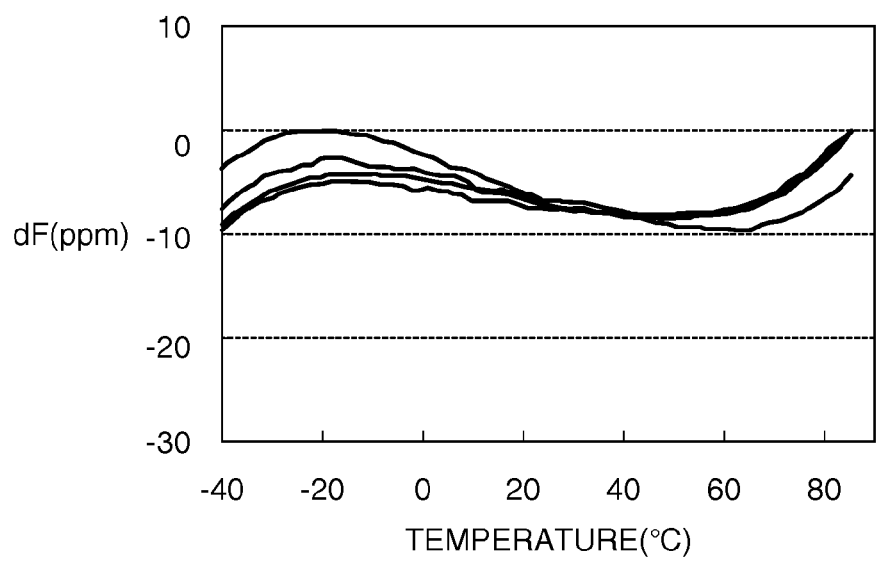
FIG. 57 is a graph showing the change in the amount of variation in the frequency within the operating range of a SAW resonator in which an IDT and a reflector are coated with alumina as a protection film.
Figure 58:
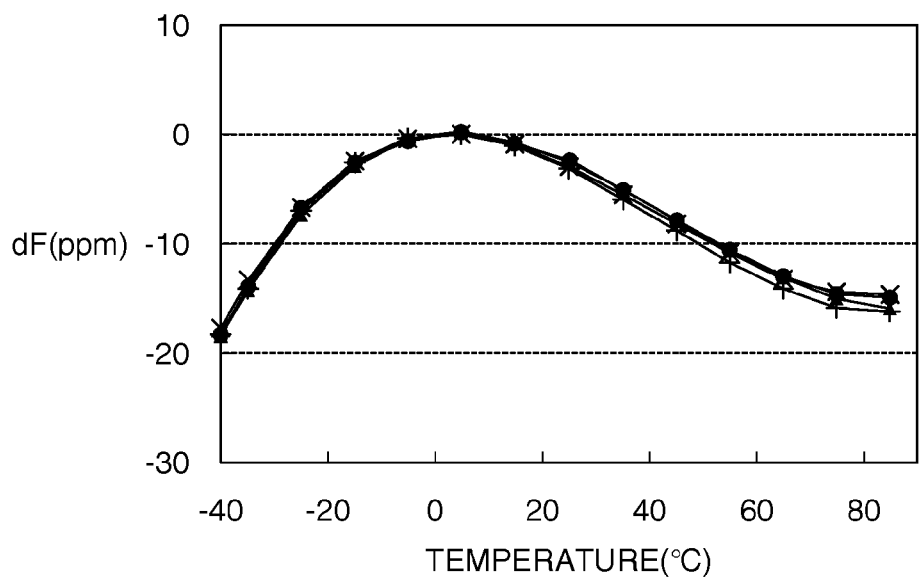
FIG. 58 is a graph showing the change in the amount of variation in the frequency within the operating range of a SAW resonator in which an IDT and a reflector are coated with SiO$_2$ as a protection film.

The example shown in FIG. 57 is a diagram showing the amount of variation in the frequency within the operating temperature range in a case where the electrode is coated with alumina as a protection film. From FIG. 57, it can be read that the amount of variation in the frequency within the operating temperature range can be controlled to be equal or less than 10 (ppm).

Basic Data of SAW Resonator according to Example Shown in FIG. 57

H (material: aluminum): 2000 (Å)
G: 4700 (Å) (H+G=0.067)
IDT Line Occupancy ratio ηi: 0.6
Reflector Line Occupancy ratio ηr: 0.8
Number of Rotated ST-Cut Substrates within Plane of Euler Angles (0°, 123°, 43.5°): 120
Intersection Width: 40λ (λ=10 μm)
Number of Reflectors (near one side): 36
Inclination Angle of Electrode Fingers: None
Film Thickness of Protection Film (Alumina): 400 (Å)
Second-Order Temperature Coefficient β=+0.0007 (ppm/°C.$^2$)

The example shown in FIG. 58 is a diagram showing the amount of variation in the frequency within the operating temperature range in a case where the electrode is coated with $SiO_2$ as a protection film. From FIG. 58, it can be read that the amount of variation in the frequency within the operating temperature range can be controlled to be equal or less than 20 (ppm).

Basic Data of SAW Resonator According to Example Shown in FIG. 58

H (material: aluminum): 2000 (Å)
G: 4700 (Å) (H+G=0.067)
IDT Line Occupancy ratio ηi: 0.6
Reflector Line Occupancy ratio ηr: 0.8
Number of Rotated ST-Cut Substrates within Plane of Euler Angles (0°, 123°, 43.5°): 120
Intersection Width: 40λ (λ=10 μm)
Number of Reflectors (near one side): 36
Inclination Angle of Electrode Fingers: None
Film Thickness of Protection Film ($SiO_2$): 400 (Å)
Second-Order Temperature Coefficient β=+0.0039 (ppm/°C.$^2$)

As above, although a surface acoustic wave resonator, a surface acoustic wave oscillator, and an electronic apparatus according to embodiments of the invention have been described, the invention is not limited thereto.

For example, a surface acoustic wave resonator according to an embodiment of the invention may be acquired by combining the above-described embodiments. For example, in the reflector (reflection unit), an area in which only a conductive strip is formed, an area in which only a groove is formed, an area in which a conductive strip and a groove are formed, and the like may be mixed. Furthermore, a sufficiently deep groove or a reflection end surface may be combined therewith.

The entire disclosure of Japanese Patent Application No. 2010-138495, filed Jun. 17, 2010 is expressly incorporated by reference herein.

What is claimed is:

1. A surface acoustic wave resonator comprising:
   an IDT that is disposed on a quartz crystal substrate of Euler angles (−1.5°≤φ≤1.5°, 117°≤θ≤142°, and 42.79°≤|ψ|≤49.57°) and excites a surface acoustic wave resonant in an upper part of a stop-band of the IDT;
   inter-electrode finger grooves that are acquired by depressing the substrate located between electrode fingers configuring the IDT; and
   one pair of reflection units that are arranged so as allow the IDT to be disposed therebetween in a propagation direction of the surface acoustic wave and reflect the surface acoustic wave,
   wherein, in a case where a wavelength of the surface acoustic wave is λ, and a depth of the inter-electrode finger grooves is G, 0.01λ≤G is satisfied,
   wherein, in a case where a line occupancy ratio of the IDT is η, the depth G of the inter-electrode finger grooves and the line occupancy ratio η satisfy one of the following relationships:

$$-2.0000 \times G/\lambda + 0.7200 \leq \eta \leq -2.5000 \times G/\lambda + 0.7775,$$
   wherein $0.0100\lambda \leq G \leq 0.0500\lambda$, and $$-3.5898 \times G/\lambda + 0.7995 \leq \eta \leq -2.5000 \times G/\lambda + 0.7775,$$
   wherein $0.0500\lambda \lambda < G \leq 0.0695\lambda$.

2. The surface acoustic wave resonator according to claim 1,
   wherein the depth G of the inter-electrode finger grooves satisfies a relationship of 0.01λ≤G≤0.0695λ.

3. The surface acoustic wave resonator according to claim 1,
   wherein, when a film thickness of electrode fingers of the IDT is H, a relationship of 0<H≤0.035λ is satisfied.

4. The surface acoustic wave resonator according to claim 3,
   wherein the line occupancy ratio η satisfies a relationship of −1963.05×(G/λ)³+196.28×(G/λ)²−6.53×(G/λ)−135.99×(H/λ)²+5.817×(H/λ)+0.732−99.99×(G/λ)×(H/λ)−0.04≤η≤−1963.05×(G/λ)³+196.28×(G/λ)²−6.53×(G/λ)−135.99×(H/λ)²+5.817×(H/λ)+7.732−99.00×(G/λ)×(H/λ)+0.04.

5. The surface acoustic wave resonator according to claim 3,
   wherein a sum of the depth G of the inter-electrode finger grooves and the film thickness H of the electrode fingers satisfies a relationship of 0.0407λ≤G+H.

6. The surface acoustic wave resonator according to claim 1,
   wherein the Euler angles ψ and θ satisfy a relationship of:
   1.191×10⁻³×θ³−4.490×10⁻¹×θ²+5.646×10¹×θ−2.324×10³−1.0.≤Ψ≤1.191×10⁻³×θ³−4.490×10⁻¹×θ²+5.646×10¹×θ−2.324×10³+1.0.

7. The surface acoustic wave resonator according to claim 1,
   wherein, when a frequency of the stop-band upper end mode in the IDT is ft2, a frequency of a stop-band lower end mode in the reflection units is fr1, and a frequency of the stop-band upper end mode of the reflector is fr2, a relationship of fr1<ft2<fr2 is satisfied.

8. The surface acoustic wave resonator according to claim 1, wherein the reflection units are arranged so as to be parallel to the electrode fingers configuring the IDT and are configured in grooves acquired by depressing the quartz crystal substrate.

9. The surface acoustic wave resonator according to claim 8, wherein the grooves included in the reflection units are grooves of a plurality of lines parallel to one another.

10. The surface acoustic wave resonator according to claim 8,
    wherein, when a film thickness of the electrode fingers configuring the IDT is $H_{mT}$, a depth of the inter-electrode finger grooves is $H_{gT}=G$, an effective film thickness of the electrode fingers is $H_T/\lambda$ where, $H_T=H_{mT}+H_{gT}$, and
    wherein, when the depth of the grooves included in the reflection units is $H_{gR}$, the IDT and the reflection units satisfy a relationship of $H_T/\lambda < H_{gR}/\lambda$.

11. The surface acoustic wave resonator according to claim 10, wherein the depth $H_{gR}$ of the grooves in the reflection units is equal to or more than 3λ.

12. The surface acoustic wave resonator according to claim 1, wherein at least one of the reflection units is configured by conductive strips of a plurality of lines that are disposed on the quartz crystal substrate and parallel to each other.

13. The surface acoustic wave resonator according to claim 12, wherein, when a film thickness of the electrode fingers configuring the IDT is $H_{mT}$, a depth of the inter-electrode finger grooves is $H_{gT}=G$, an effective film thickness of the electrode fingers is $H_T/\lambda$ where, $H_T=H_{mT}+H_{gT}$, and a film thickness of the conductive strips is $H_{mR}$, the IDT and the reflection units satisfy a relationship of $H_T/\lambda < H_{mR}/\lambda$.

14. The surface acoustic wave resonator according to claim 1, wherein at least one of the reflection units is configured by a plurality of lines of the grooves that are parallel to each other and a plurality of lines of conductive strips that are disposed on the quartz crystal substrate so as to be adjacent to the grooves and are parallel to each other.

15. The surface acoustic wave resonator according to claim 14, wherein, when a film thickness of the electrode fingers configuring the IDT is $H_{mT}$, a depth of the inter-electrode finger grooves is $H_{gT}=G$, an effective film thickness of the electrode fingers is $H_T/\lambda$, where, $H_T=H_{mT}+H_{gT}$, a film thickness of the conductive strips is $H_{mR}$, a depth of the grooves included in the reflection unit is $H_{gR}$, and an effective film thickness of the conductive strips is $H_R/\lambda$ (here, $H_R=H_{mR}+H_{gR}$), the IDT and the reflection units satisfy a relationship of $H_T/\lambda < H_R/\lambda$.

16. The surface acoustic wave resonator according to claim 15,
    wherein the film thickness $H_{mT}$ of the electrode fingers configuring the IDT and the film thickness $H_{mR}$ of the conductive strips satisfy a relationship of $H_{mT}/\lambda = H_{mR}/\lambda$, and
    wherein the depth $H_{gT}$ of the inter-electrode finger grooves and the depth $H_{gR}$ of the grooves included in the reflection unit satisfy a relationship of $H_{gT}/\lambda < H_{gR}/\lambda$.

17. The surface acoustic wave resonator according to claim 15,
    wherein the depth $H_{gT}$ of the inter-electrode finger grooves and the depth $H_{gR}$ of the grooves included in the reflection unit satisfy a relationship of $H_{gT}/\lambda = H_{gR}/\lambda$, and
    wherein the film thickness $H_{mT}$ of the electrode fingers configuring the IDT and the film thickness $H_{mR}$ of the conductive strips satisfy a relationship of $H_{mT}/\lambda < H_{mR}/\lambda$.

18. The surface acoustic wave resonator according to claim 1, wherein at least one of the reflection units is configured by an end face of the quartz crystal substrate.

19. A surface acoustic wave oscillator comprising:
    the surface acoustic wave resonator according to claim 1; and
    an IC that is used for driving the IDT.

20. An electronic apparatus comprising:
    the surface acoustic wave resonator according to claim 1.

* * * * *